United States Patent
Nagashima

(10) Patent No.: US 10,670,676 B2
(45) Date of Patent: Jun. 2, 2020

(54) IMAGE RECONSTRUCTING METHOD AND RECONSTRUCTING APPARATUS

(71) Applicant: CANON MEDICAL SYSTEMS CORPORATION, Otawara-shi (JP)

(72) Inventor: Masaaki Nagashima, Sakura (JP)

(73) Assignee: CANON MEDICAL SYSTEMS CORPORATION, Otawara-shi (JP)

( * ) Notice: Subject to any disclaimer, the term of this patent is extended or adjusted under 35 U.S.C. 154(b) by 0 days.

(21) Appl. No.: 16/263,358

(22) Filed: Jan. 31, 2019

(65) Prior Publication Data

US 2019/0235037 A1    Aug. 1, 2019

(30) Foreign Application Priority Data

Jan. 31, 2018   (JP) ................................. 2018-015824
Jan. 29, 2019   (JP) ................................. 2019-012868

(51) Int. Cl.

| | | |
|---|---|---|
| *G01V 3/00* | (2006.01) | |
| *G01R 33/48* | (2006.01) | |
| *G01R 33/385* | (2006.01) | |
| *G01R 33/567* | (2006.01) | |
| *G01R 33/54* | (2006.01) | |
| *G01R 33/56* | (2006.01) | |

(Continued)

(52) U.S. Cl.
CPC ....... *G01R 33/4818* (2013.01); *G01R 33/385* (2013.01); *G01R 33/543* (2013.01); *G01R 33/5608* (2013.01); *G01R 33/5611* (2013.01); *G01R 33/5673* (2013.01); *G01R 33/56325* (2013.01)

(58) Field of Classification Search
USPC ........................................................ 324/309
See application file for complete search history.

(56) References Cited

U.S. PATENT DOCUMENTS

2013/0285655 A1   10/2013   Miyazaki et al.
2013/0285662 A1   10/2013   Takeshima
(Continued)

FOREIGN PATENT DOCUMENTS

| JP | 2013-240571 | 12/2013 |
|---|---|---|
| JP | 2017-35296 | 2/2017 |
| JP | 6073627 | 2/2017 |

*Primary Examiner* — Rodney E Fuller
(74) *Attorney, Agent, or Firm* — Oblon, McClelland, Maier & Neustadt, L.L.P.

(57) ABSTRACT

An image reconstructing method includes: obtaining pieces of first k-space data acquired from a patient, first acquisition times corresponding to the pieces of first k-space data, and pieces of biological signal information of the patient in a time series, the pieces of first k-space data being sampled with time-varying undersampling pattern; generating pieces of second k-space data by inverse transforming an intermediate data which is generated by transforming the pieces of first k-space data, the pieces of second k-space data is a data that at least part of the undersampled point is filled; generating a pseudo second acquisition time of each of the pieces of second k-space data, based on the first acquisition times; performing a rearranging process on the pieces of second k-space data, based on the second acquisition times and the pieces of biological signal information; and generating images by performing a reconstructing process on the pieces of second k-space data resulting from the rearranging process.

17 Claims, 31 Drawing Sheets

(51) Int. Cl.
*G01R 33/561* (2006.01)
*G01R 33/563* (2006.01)

(56) References Cited

U.S. PATENT DOCUMENTS

2015/0028872 A1   1/2015   Takeshima
2017/0045598 A1   2/2017   Takeshima et al.
2019/0347834 A1*  11/2019  Nagashima ........ G01R 33/5673

* cited by examiner

FIG.6

| PE LINE NUMBER | TIME | RR INTERVAL | TRIGGER | CENTER OF PHASE | CARDIAC PHASE INFORMATION (%) |
|---|---|---|---|---|---|
| 2561 | 13446.5 | 988 | 12916 | 0 | 0 |
| 2562 | 13450.7 | 988 | 12916 | 0 | 0 |
| 2563 | 13454.9 | 988 | 12916 | 0 | 0 |
| 2564 | 13459.1 | 988 | 12916 | 1 | 54.97 |
| 2565 | 13463.3 | 988 | 12916 | 0 | 0 |
| 2566 | 13467.5 | 988 | 12916 | 0 | 0 |
| 2567 | 13471.7 | 988 | 12916 | 0 | 0 |
| 2568 | 13475.9 | 988 | 12916 | 0 | 0 |
| 2569 | 13480.1 | 988 | 12916 | 0 | 0 |
| 2570 | 13484.3 | 988 | 12916 | 0 | 0 |
| 2571 | 13488.5 | 988 | 12916 | 0 | 0 |
| 2572 | 13492.7 | 988 | 12916 | 1 | 58.37 |
| 2573 | 13496.9 | 988 | 12916 | 0 | 0 |
| 2574 | 13501.1 | 988 | 12916 | 0 | 0 |
| 2575 | 13505.3 | 988 | 12916 | 0 | 0 |
| 2576 | 13509.5 | 988 | 12916 | 0 | 0 |
| 2577 | 13513.7 | 988 | 12916 | 0 | 0 |
| 2578 | 13517.9 | 988 | 12916 | 0 | 0 |
| 2579 | 13522.1 | 988 | 12916 | 0 | 0 |
| 2580 | 13526.3 | 988 | 12916 | 1 | 61.77 |
| ⋮ | ⋮ | ⋮ | ⋮ | ⋮ | ⋮ |

FIG.13

| PHASE | TEMPORAL PHASE INFORMATION (%) |
|---|---|
| P1 | 4.1667 |
| P2 | 8.3333 |
| P3 | 12.5 |
| P4 | 16.667 |
| P5 | 20.833 |
| P6 | 25 |
| P7 | 29.1667 |
| P8 | 33.3333 |
| P9 | 37.5 |
| P10 | 41.6667 |
| P11 | 45.8333 |
| P12 | 50 |
| P13 | 54.1667 |
| P14 | 58.3333 |
| P15 | 62.5 |
| P16 | 66.6667 |
| P17 | 70.8333 |
| P18 | 75 |
| P19 | 79.1667 |
| P20 | 83.3333 |
| P21 | 87.5 |
| P22 | 91.6667 |
| P23 | 95.8333 |
| P24 | 100 |

IMAGE RECONSTRUCTING METHOD AND RECONSTRUCTING APPARATUS

CROSS-REFERENCE TO RELATED APPLICATIONS

This application is based upon and claims the benefit of priority from Japanese Patent Application No. 2018-015824, filed on Jan. 31, 2018; and Japanese Patent Application No. 2019-012868, filed on Jan. 29, 2019, the entire contents of all of which are incorporated herein by reference.

FIELD

Embodiments described herein relate generally to an image reconstructing method and a reconstructing apparatus.

BACKGROUND

For Magnetic Resonance Imaging (MRI), known examples of image taking methods used for taking images of a site having periodic motion include synchronization image taking processes performed in synchronization with a biological signal of an examined subject. A known example of the synchronization image taking processes is an electrocardiographic synchronization image taking process in which image taking processes are performed in synchronization with an electrocardiographic signal of the examined subject.

In this regard, methods used during electrocardiographic image taking processes include a prospective gating method and a retrospective gating method. The prospective gating method is a method by which pieces of data are acquired in a specific cardiac phase determined in advance. For example, according to the prospective gating method, timing of an R-wave is detected so as to repeatedly acquire pieces of data in various cardiac phases by using the R-wave as a trigger. In the prospective gating method, because there is a waiting time period prior to the occurrence of the trigger, it is necessary to perform repetitive image taking processes corresponding to two or more heartbeats, when taking images of the heart for a whole heartbeat. As a result, even when a four-fold speed-multiplying ratio is set by using a parallel imaging scheme together, for example, the substantial speed-multiplying ratio is only two-fold or less, because it is necessary to perform the repetitive image taking processes corresponding to two or more heartbeats.

The retrospective gating method is a method by which images are reconstructed by extracting pieces of data in mutually the same cardiac phase from among a series of data acquired in a sequential manner. For example, according to the retrospective gating method, the pieces of data are sequentially acquired without the synchronization with an electrocardiographic signal, and also an electrocardiographic signal during the data acquisition is obtained. Further, a reconstructing process is performed after rearranging the pieces of data in a retroactive manner so as to align the cardiac phases of the acquired series of data, by using the obtained electrocardiographic signal. By using the retrospective gating method, it is possible to shorten the image taking time period compared to that of the prospective gating method, because there is no need to wait for the trigger.

BRIEF DESCRIPTION OF THE DRAWINGS

FIG. 6 is a table for explaining a process performed by a calculating function according to the first embodiment;

FIG. 13 is yet another drawing for explaining the processes performed by the reconstructing function and the selecting function according to the first embodiment;

DETAILED DESCRIPTION

It is an object of the present disclosure to provide an image reconstructing method and a reconstructing apparatus capable of properly perform image taking processes on an image taking target having motion.

An image reconstructing method according to an embodiment includes obtaining a plurality of pieces of first k-space data acquired from a patient, first acquisition times corresponding to the pieces of first k-space data, and pieces of biological signal information of the patient in a time series, the pieces of first k-space data being sampled with time-varying undersampling pattern. The image reconstructing method includes generating a plurality of pieces of second k-space data by inverse transforming an intermediate data which is generated by transforming the plurality of pieces of first k-space data, the pieces of second k-space data is a data that at least part of the undersampled point is filled. The image reconstructing method includes generating a pseudo second acquisition time of each of the plurality of pieces of second k-space data, on the basis of the first acquisition times. The image reconstructing method includes performing a rearranging process on the plurality of pieces of second k-space data, on the basis of the second acquisition times and the pieces of biological signal information. The image reconstructing method includes generating a plurality of reconstructed images by performing a reconstructing process on the plurality of pieces of second k-space data resulting from the rearranging process.

Exemplary embodiments of an image reconstructing method and a reconstructing apparatus will be explained below, with reference to the accompanying drawings. Possible embodiments are not limited to the embodiments described below. Further, the description of each of the embodiments is, in principle, similarly applicable to any other embodiment.

First Embodiment

Figure 1:
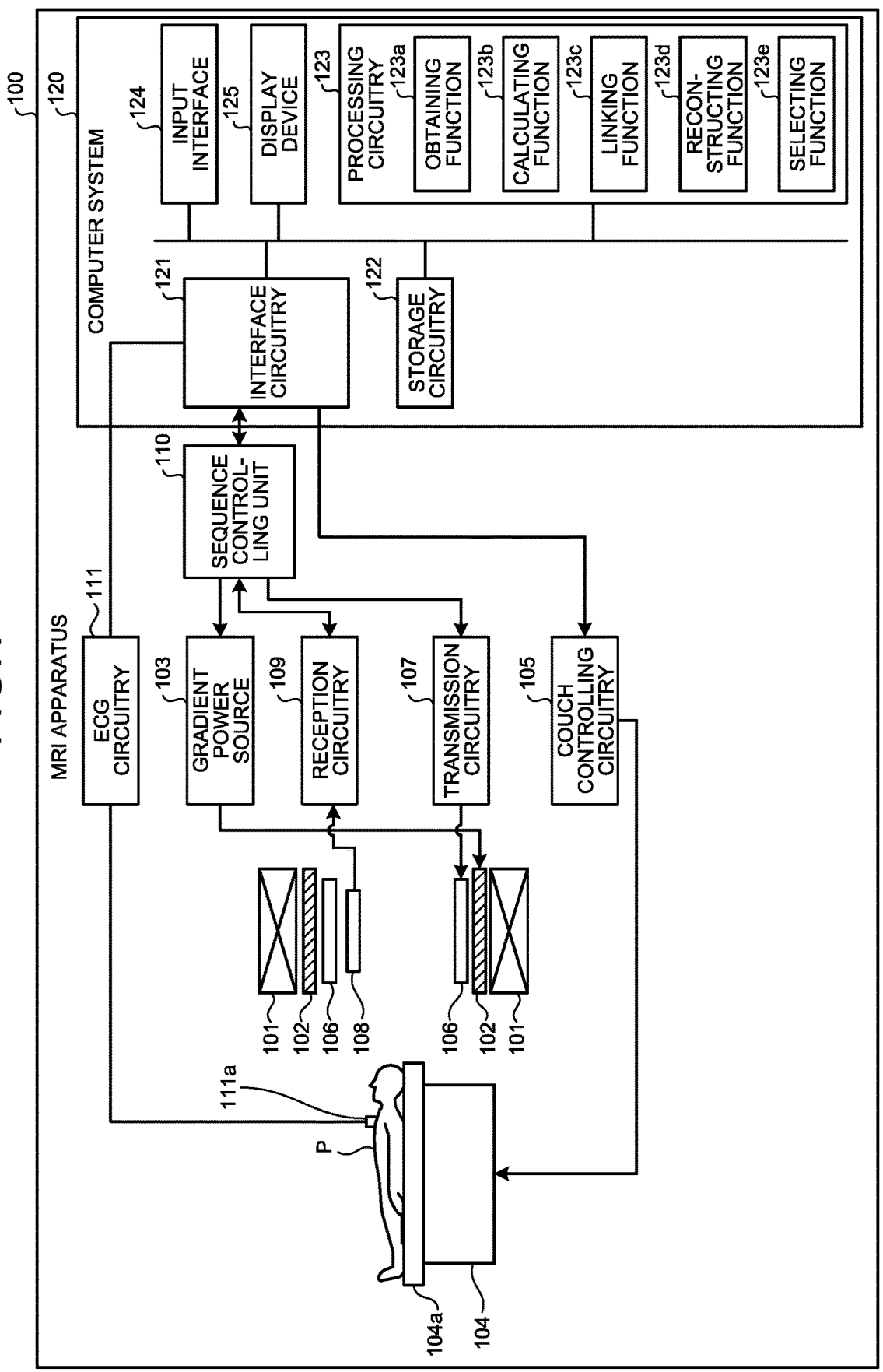
FIG. 1 is a block diagram illustrating an MRI apparatus according to a first embodiment.

FIG. 1 is a block diagram illustrating a Magnetic Resonance Imaging (MRI) apparatus 100 according to a first embodiment. As illustrated in FIG. 1, the MRI apparatus 100 includes a static magnetic field magnet 101, a gradient coil 102, a gradient power source 103, a couch 104, a couch controlling circuitry 105, a transmission coil 106, a transmission circuitry 107, a reception coil array 108, a reception circuitry 109, a sequence controlling circuit 110, an electrocardiogram (ECG) circuitry 111, and a computer system 120. The MRI apparatus 100 does not include an examined subject (hereinafter, "patient") P (e.g., a human body). Further, the MRI apparatus 100 is an example of a reconstructing apparatus.

The static magnetic field magnet 101 is a magnet formed to have a hollow and circular cylindrical shape (which may have an oval cross-section orthogonal to an axis thereof) and is configured to generate a uniform static magnetic field in the space on the inside thereof. For example, the static magnetic field magnet 101 may be a permanent magnet, a superconductive magnet, or the like.

The gradient coil 102 is a coil formed to have a hollow and circular cylindrical shape (which may have an oval cross-section orthogonal to an axis thereof) and is disposed on the inside of the static magnetic field magnet 101. The gradient coil 102 is structured by combining together three coils corresponding to X-, Y-, and Z-axes that are orthogonal to one another. By individually receiving a supply of an electric current from the gradient power source 103, these three coils are configured to generate gradient magnetic fields of which the magnetic field intensities change along the X-, Y-, and Z-axes respectively. In this situation, the gradient magnetic fields generated along the X-, Y-, and Z-axes by the gradient coil 102 correspond to, for example, a slice-selecting gradient magnetic field Gs, a phase-encoding gradient magnetic field Ge, and a read-out gradient magnetic field Gr. The slice-selecting gradient magnetic field Gs is used for arbitrarily determining an image taking cross-sectional plane. The phase-encoding gradient magnetic field Ge is used for varying the phase of a Magnetic Resonance (MR) signal in accordance with a spatial position. The read-out gradient magnetic field Gr is used for varying the frequency of an MR signal in accordance with a spatial position.

The gradient power source 103 is configured to supply the electric current to the gradient coil 102. For example, the gradient power source 103 is configured to individually supply the electric current to each of the three coils included in the gradient coil 102.

The couch 104 includes a couchtop 104a on which the patient P is placed. Under control of the couch controlling circuitry 105, the couchtop 104a is inserted into a hollow space (an image taking opening) of the gradient coil 102, while the patient P is placed thereon. Usually, the couch 104 is installed in such a manner that the longitudinal direction thereof extends parallel to the central axis of the static magnetic field magnet 101.

The couch controlling circuitry 105 is a processor configured to move the couchtop 104a in longitudinal directions and up-and-down directions by driving the couch 104 under control of the computer system 120.

The transmission coil 106 is disposed on the inside of the gradient coil 102 and is configured to generate a radio frequency magnetic field by receiving a supply of a Radio Frequency (RF) pulse from the transmission circuitry 107.

The transmission circuitry 107 is configured to supply the transmission coil 106 with the RF pulse corresponding to a Larmor frequency determined by the type of a targeted atom and intensities of magnetic fields.

The reception coil array 108 is disposed on the inside of the gradient coil 102 and is configured to receive magnetic resonance signals (hereinafter "MR signals") emitted from the patient P due to an influence of the radio frequency magnetic field. When having received the MR signals, the reception coil array 108 outputs the received MR signals to the reception circuitry 109. In the first embodiment, the reception coil array 108 is a coil array including one or more (typically, two or more) reception coils.

The reception circuitry 109 is configured to generate MR data on the basis of the MR signals output from the reception coil array 108. For example, the reception circuitry 109 generates the MR data, by digitally converting the MR signals output from the reception coil array 108. Further, the reception circuitry 109 is configured to transmit the generated MR data to the sequence controlling circuit 110.

Incidentally, the reception circuitry 109 may be provided on the side of a gantry device including the static magnetic field magnet 101, the gradient coil 102, and the like. In this situation, in the first embodiment, the MR signals output from coil elements (reception coils) included in the reception coil array 108 are output to the reception circuitry 109 in units called "channels" or the like, after having been distributed or combined as appropriate. For this reason, the MR data is handled for each of the channels in the processes performed in the reception circuitry 109 and the stages subsequent thereto. As for the relationship between the total number of coil elements and the total number of channels, these numbers may be equal to each other. Alternatively, the total number of channels may be smaller than the total number of coil elements. Conversely, the total number of channels may be larger than the total number of coil elements. In the following sections, when the expression "for each of the channels" is used, the process may be performed for each of the coil elements or may be performed for each of the channels obtained by distributing or combining the coil elements. The timing with which the coil elements are distributed or combined is not limited to the timing described above. It is sufficient as long as the MR signals or the MR data are distributed or combined in units of the channels prior to a reconstructing process (explained later).

The sequence controlling circuit 110 is configured to perform an image taking process on the patient P, by driving the gradient power source 103, the transmission circuitry 107, and the reception circuitry 109, on the basis of sequence information transmitted thereto from the computer system 120. For example, the sequence controlling circuit 110 is realized by using a processor. In this situation, the sequence information is information defining a procedure for performing the image taking process. The sequence information defines: the intensity of the electric power to be supplied from the gradient power source 103 to the gradient coil 102 and the timing with which the electric power is to be supplied; the intensity of the RF pulse to be transmitted by the transmission circuitry 107 to the transmission coil 106 and the timing with which the RF pulse is to be applied; the timing with which the MR signals are to be detected by the reception circuitry 109, and the like.

When having received the MR data from the reception circuitry 109 as a result of performing the image taking process on the patient P, by driving the gradient power source 103, the transmission circuitry 107, and the reception circuitry 109, the sequence controlling circuit 110 is configured to transfer the received MR data to the computer system 120.

The ECG circuitry 111 is configured to detect a predetermined electrocardiographic waveform on the basis of an electrocardiographic signal output from an ECG sensor 111a. The ECG sensor 111a is a sensor attached to the body surface of the patient P and configured to detect the electrocardiographic signal of the patient P. The ECG sensor 111a is configured to output the detected electrocardiographic signal to the ECG circuitry 111.

For example, the ECG circuitry 111 detects an R-wave as the predetermined electrocardiographic waveform. After that, the ECG circuitry 111 generates a trigger signal at the timing of the detection of the R-wave and further outputs the generated trigger signal to an interface circuitry 121. The trigger signal is stored into a storage circuitry 122 by the interface circuitry 121. In this situation, the trigger signal may be transmitted from the ECG circuitry 111 to the interface circuitry 121 by wireless communication. In the present embodiment, an example will be explained in which the electrocardiographic signal is detected by the ECG sensor 111a. However, possible embodiments are not limited to this example. For instance, the electrocardiographic signal may be detected by a plethysmograph. Further, although FIG. 1 illustrates an example in which the ECG sensor 111a and the ECG circuitry 111 form a part of the MRI apparatus 100, possible embodiments are not limited to this example. In other words, another arrangement is also acceptable in which the MRI apparatus 100 is configured to obtain the electrocardiographic signal via the ECG sensor 111a and the ECG circuitry 111 that are provided separately from the MRI apparatus 100.

The computer system 120 is configured to exercise overall control of the MRI apparatus 100, to acquire data, to reconstruct images, and the like. The computer system 120 includes the interface circuitry 121, the storage circuitry 122, a processing circuitry 123, an input interface 124, and a display device 125.

The interface circuitry 121 is configured to transmit the sequence information to the sequence controlling circuit 110 and to receive the MR data from the sequence controlling circuit 110. Further, when having received the MR data, the interface circuitry 121 is configured to store the received MR data into the storage circuitry 122. The MR data stored in the storage circuitry 122 is arranged into a k-space by the processing circuitry 123. As a result, the storage circuitry 122 stores therein k-space data corresponding to a plurality of channels. In this manner, k-space data is acquired. For example, the interface circuitry 121 is realized by using a network interface card.

The storage circuitry 122 is configured to store therein the MR data received by the interface circuitry 121, time series data (k-t space data) arranged into the k-space by an obtaining function 123a (explained later), image data generated by a reconstructing function 123d (explained later), and the like. Further, the storage circuitry 122 stores therein various types of computer programs (hereinafter "programs"). The storage circuitry 122 is realized by using, for example, a semiconductor memory element such as a Random Access Memory (RAM), a flash memory, or the like, or a hard disk, an optical disk, or the like.

The input interface 124 is configured to receive various types of instructions and inputs of information from an operator such as a medical doctor or a radiological technologist. For example, the input interface 124 is realized by using a trackball, a switch button, a mouse, a keyboard, and/or the like. The input interface 124 is connected to the processing circuitry 123 and is configured to convert an input operation received from the operator into an electrical signal and to output the electrical signal to the processing circuitry 123.

Under control of the processing circuitry 123, the display device 125 is configured to display various types of Graphical User Interfaces (GUIs), Magnetic Resonance (MR) images generated by the reconstructing function 123d, and the like.

The processing circuitry 123 is configured to exercise overall control of the MRI apparatus 100. More specifically, the processing circuitry 123 is configured to control the image taking process by generating the sequence information on the basis of an image taking condition input thereto from the operator via the input interface 124 and transmitting the generated sequence information to the sequence controlling circuit 110. Further, the processing circuitry 123 is also configured to control an image reconstructing process performed on the basis of the MR data sent from the sequence controlling circuit 110 as a result of the image taking process and to control displaying processes performed by the display device 125. The processing circuitry 123 is realized by using a processor. The processing circuitry 123 includes the obtaining function 123a, a calculating function 123b, a linking function 123c, the reconstructing function 123d, and a selecting function 123e. The obtaining function 123a is an example of an obtaining unit. The calculating function 123b is an example of a calculating unit. The linking function 123c is an example of a linking unit. The reconstructing function 123d is an example of a reconstructing unit. The selecting function 123e is an example of a selecting unit.

In this situation, for example, processing functions of constituent elements of the processing circuitry 123, namely, the obtaining function 123a, the calculating function 123b, the linking function 123c, the reconstructing function 123d, and the selecting function 123e are stored in the storage circuitry 122 in the form of computer-executable programs. The processing circuitry 123 is configured to realize the functions corresponding to the programs by reading the programs from the storage circuitry 122 and executing the read program. In other words, the processing circuitry 123 that has read the programs has the functions illustrated within the processing circuitry 123 in FIG. 1. FIG. 1 illustrates an example in which the single processing circuit (i.e., the processing circuitry 123) realizes the processing functions of the obtaining function 123a, the calculating function 123b, the linking function 123c, the reconstructing function 123d, and the selecting function 123e; however, another arrangement is also acceptable in which the processing circuitry 123 is structured by combining together a plurality of independent processors, so that the processing functions are realized as a result of the processors executing the programs.

The term "processor" used in the above explanation denotes, for example, a Central Preprocessing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). In this situation, instead of saving the programs in the storage circuitry 122, it is also acceptable to directly incorporate the programs in the circuits of the processors. In that situation, the processors realize the functions thereof by reading and executing the programs incorporated in the circuits thereof.

In this situation, the MRI apparatus is configured to measure an electromagnetic wave emitted from the patient by using the coils. A signal obtained by digitizing the measured electromagnetic wave will be referred to as k-space data.

The k-space data is two-dimensional or three-dimensional data obtained by repeatedly performing one-dimensional image taking processes, for example. Further, an atom distribution image of the inside of the patient is obtained by applying a Fourier transform (hereinafter, the term "Fourier transform" may also refer to an inverse Fourier transform) to the k-space data. The obtained atom distribution image will be referred to as an MR image. The process of calculating the MR image from the k-space data may be referred to as a reconstructing process, an image reconstructing process, or an image generating process. A central part of the k-space data corresponds to a low frequency component obtained at the time when the Fourier transform is applied to the MR image. A peripheral part of the k-space data corresponds to a high frequency component obtained at the time when the Fourier transform is applied to the MR image.

MRI apparatuses are configured to obtain k-space data necessary for a reconstructing process by repeatedly performing one-dimensional image taking processes. It is known in general that these image taking processes take time. Further, when the state of the patient changes in the course of time, it is also known that the image quality of the reconstructed MR image is degraded. Accordingly, when time-series data having a large amount of data is obtained while the state of the patient is changing, for example, when the image taking processes are performed on the heart, there is a high demand for shortening the time period required by the image taking processes. To meet this demand, for the purpose of performing the image taking processes at a high speed, Parallel Imaging (PI) schemes have been studied and developed by which, for example, pieces of k-space data are simultaneously taken in an undersampling manner by using a plurality of coils on the basis of the notion that levels of sensitivity vary depending on the positional arrangements of the coils and an MR image is reconstructed from the obtained plurality of pieces of k-space data, while inhibiting artifacts.

Generally speaking, in PI schemes, an endeavor to shorten the image taking period is made by acquiring pieces of k-space data in an undersampling manner in the phase-encoding direction. The pieces of k-space data acquired in the undersampling manner would yield an aliasing image. Thus, according to a PI scheme, an image free of aliasing is reconstructed from pieces of k-space data acquired in correspondence with a plurality of channels having mutually-different levels of sensitivity, by utilizing the fact that the channels have the mutually-different levels of sensitivity. In other words, according to the PI scheme, it is possible to perform the image taking processes at a higher speed in accordance with the undersampling ratio. The undersampling ratio may be referred to as a speed-multiplying ratio. For example, when the undersampling ratio is 4, it is possible to shorten the image taking period to approximately one-fourth.

When a PI scheme is used in combination with the retrospective gating method, it is expected to be possible to perform image taking processes at an even higher speed. In other words, an electrocardiographic signal is obtained while executing the acquisition of a group of k-space data undersampled in the phase-encoding direction over a plurality of temporal phases. After that, by using the obtained electrocardiographic signal, a rearranging process is performed in a retroactive manner so that the cardiac phases of a series of k-space data are aligned. For example, by using a sensitivity encoding (SENSE) scheme, which is one type of a PI scheme, a plurality of pieces of k-space data that are undersampled in the phase-encoding direction are acquired in a plurality of temporal phases and are rearranged in a retroactive manner so as to align the cardiac phases thereof. After that, a reconstructing process that utilizes the difference in the levels of sensitivity among the channels is performed on the group of k-space data resulting from the rearranging process.

Incidentally, to further shorten the image taking period, it is effective to obtain pieces of k-space data that are undersampled also in the temporal phase direction (the time direction) in addition to the phase-encoding direction. Examples of known techniques used for acquiring pieces of k-space data undersampled in the temporal phase direction include k-space time Broad-use Linear Acquisition Speed-up Technique (k-t BLAST) methods and k-t SENSE methods. However, there are situations where these techniques do not work well, even in combination with the retrospective gating method. The reason is that these methods are based on the assumption that the undersampling pattern of the k-space observed along the time series changes with regularity. In other words, the undersampling pattern of the k-space observed along the time series becomes irregular when the rearranging process is performed by using the cardiac phases, which is a necessary procedure for performing the reconstructing process while using the retrospective gating method. This irregularity makes it impossible to use the techniques based on the k-t BLAST methods and the k-t SENSE methods. When the number of coils is small relative to the percentage of undersampled samples, the methods are referred to as k-t BLAST methods. On the contrary, when the number of coils is relatively large, the methods are referred to as k-t SENSE methods. However, in the following sections, both types of methods including the k-t BLAST methods will be referred to as k-t SENSE methods, unless those two are explicitly distinguished from each other. In the following sections, examples in which two or more coils are used will primarily be explained. However, as a special example of the k-t BLAST methods, the number of coils may be one. Even when the number of coils is one, we will refer to the method as a k-t SENSE method.

According to a k-t SENSE method, a group of acquired pieces of k-space data is transformed into x-f space data structured with an image space and a time spectrum, by performing a Fourier transform. Further, x-f space data from which aliasing signals have been eliminated is generated, by using a sensitivity map of the x-f space on the x-f space data. Further, a plurality of MR images arranged in a time series are generated by transforming the generated x-f space data into x-t space data by performing an inverse Fourier transform.

Figure 2:
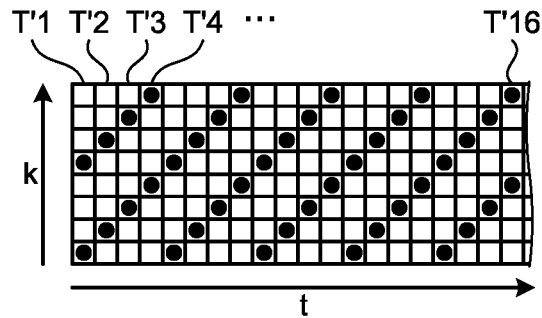
FIG. 2 is a drawing illustrating an example of sampling positions undersampled in a temporal phase direction within a k-t space.

An example of a sampling process performed by undersampling a k-t space in the temporal phase direction will be explained, with reference to FIG. 2. FIG. 2 is a drawing illustrating an example of sampling positions in the k-t space. In FIG. 2, "k" expressed on the vertical axis corresponds to the phase-encoding direction, whereas "t" expressed on the horizontal axis corresponds to the temporal phase direction. For the sake of convenience in the explanation, FIG. 2 illustrates k-t space data in which pieces of k-space data are arranged in 8 positions (frames) in the phase-encoding direction and in 16 positions in the temporal phase direction. Further, the black dots indicate the positions in which pieces of k-space data in each line are acquired. In other words, the frames without black dots are the positions in which no k-space data is acquired. The k-space data in each of the temporal phases corresponds to a two-dimensional k-space structured with a one-dimensional frequency-encoding direction and a one-dimensional phase-encoding direction. Each of the k-space data in this embodiment is assumed to be two-dimensional data, however, the k-space data may be arranged by three-dimensional data. Further, it is assumed that a time period corresponding to one or more heartbeats is included in the time period from the temporal phase T'1 to the temporal phase T'16. Incidentally, image taking processes using a k-t BLAST method or a k-t SENSE method include a calibration image taking process that is performed prior to or during a main image taking process for obtaining information related to the x-f space without undersampling the data in the temporal phase direction; and the main image taking process for sampling the k-t space by undersampling the data in the temporal phase direction. The example of the sampling positions in FIG. 2 is considered to be an example of sampling positions for the main image taking process. To simplify the explanation, FIG. 2 does not illustrate sampling positions for the main image taking process. Further, when a technique (e.g., Japanese Granted Patent No. 6,073,627) that does not necessarily require the calibration image taking process is being used, FIG. 2 is considered to be an example of sampling positions for the main image taking process.

In the example in FIG. 2, the sampling process is performed by shifting the sampling position in the phase-encoding direction by one sample, for each unit temporal phase. For example, a plurality of pieces of k-space data in the temporal phase T'2 are each sampled in a position that is shifted in the phase-encoding direction (the upward direction in the drawing) by one sample, compared to the plurality of pieces of k-space data in the temporal phase T'1. Further, a plurality of pieces of k-space data in the temporal phase T'3 are each sampled in a position that is shifted in the phase-encoding direction by one sample, compared to the plurality of pieces of k-space data in the temporal phase T'2. Similarly, a plurality of pieces of k-space data in the temporal phase T'4 are each sampled in a position that is shifted in the phase-encoding direction by one sample, compared to the plurality of pieces of k-space data in the temporal phase T'3. In other words, in the example in FIG. 2, the pieces of k-space data that are undersampled to one-fourth are periodically sampled once every four unit temporal phases.

In the situation where, as described above, the sampling patterns in the phase-encoding direction are changed along the temporal phase direction in the k-t space, such pieces of k-space data that have mutually the same phase-encoding amount are present with a ratio of only one in four temporal phases. For this reason, if the pieces of k-space data were rearranged with a focus being placed only on the cardiac phases, it might not be possible, in some situations, to acquire data in the phase-encoding amounts required by the reconstructing process. For example, if pieces of k-space data were arranged in an order such as the temporal phases T'1, T'16, T'3, and T'4, it would not be possible to perform the reconstructing process. The reason is that the sampling pattern for the k-space data required by a reconstructing process performed with the combination of the temporal phases T'1, T'3, and T'4 is the same as that of the temporal phase T'2, while the temporal phase T'2 and the temporal phase T'16 have mutually-different sampling patterns.

To cope with the situation above, with the processing functions described below, the MRI apparatus 100 according to the first embodiment is configured to make it possible to perform image taking processes having a high spatial resolution and a high temporal resolution on a site having periodic motion. In the following sections, an example will be explained in which the processing functions of the present embodiment are applied to a k-t SENSE method. However, possible embodiments are not limited to this example. Other application examples will be explained later. Further, in the following sections, an example will be explained in which the heart is used as a site having periodic motion; however, possible embodiments are not limited to this example. For instance, the present embodiment is also applicable to image taking processes performed on the chest that may be affected by the respiratory motion.

Figure 3:
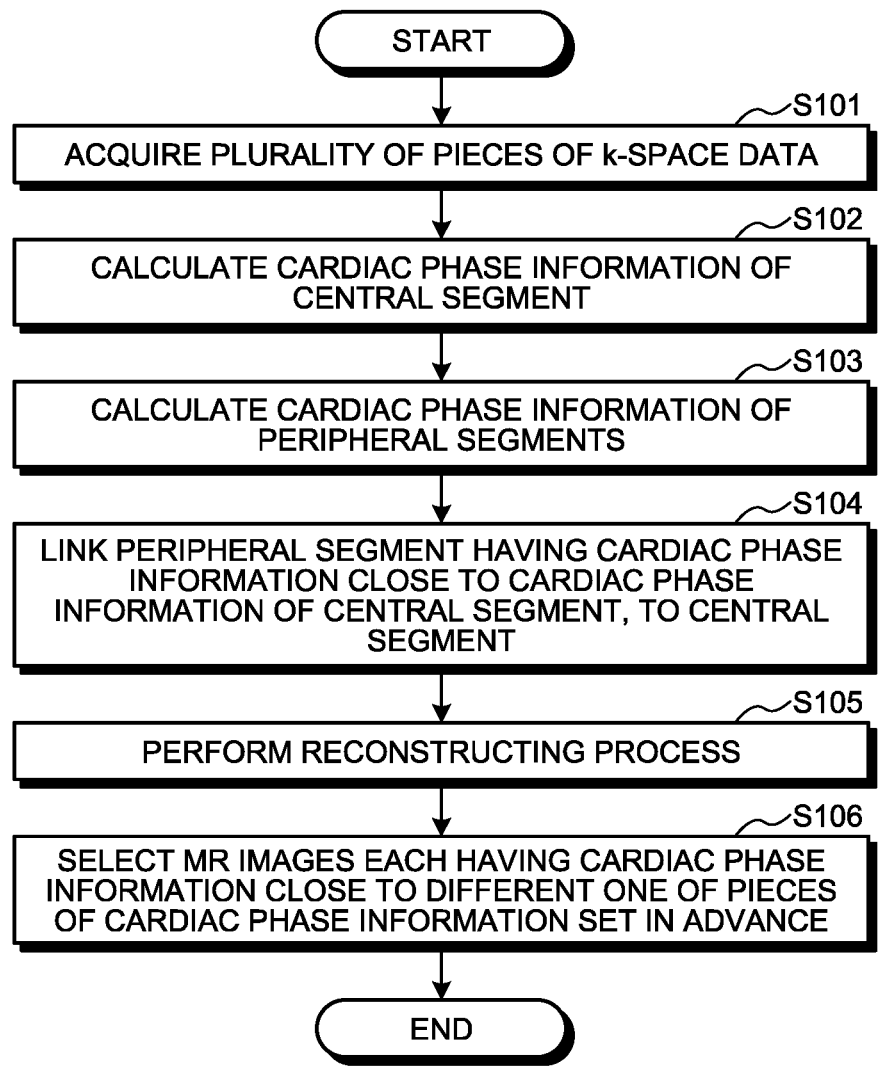
FIG. 3 is a flowchart illustrating a processing procedure performed by the MRI apparatus according to the first embodiment.

A processing procedure performed by the MRI apparatus 100 according to the first embodiment will be explained, with reference to FIG. 3. FIG. 3 is a flowchart illustrating the processing procedure performed by the MRI apparatus 100 according to the first embodiment. For example, the processing procedure illustrated in FIG. 3 is started when being triggered by an image taking process start request input by an operator.

At step S101, the obtaining function 123*a* acquires a plurality of pieces of k-space data. In other words, the obtaining function 123*a* obtains the plurality of pieces of k-space data acquired by using the predetermined sampling patterns, over a plurality of temporal phases.

For example, the obtaining function 123*a* generates sequence information on the basis of an image taking condition input by the operator via the input interface 124. For example, the obtaining function 123*a* generates the sequence information, on the basis of a time period corresponding to one cardiac cycle and the number of MR images to be obtained per cardiac cycle that are input by the operator.

For example, the operator defines the time period (an RR interval) corresponding to one cardiac cycle. For example, when heartbeats of the patient are approximately 1,000 msec, the operator defines one cardiac cycle as "1,000 msec". In this situation, the time period corresponding to one cardiac cycle is defined because heartbeats have fluctuations. For example, it is known that, even with healthy people, the RR intervals of heartbeats fluctuate in the range of approximately 900 msec to 1,100 msec. Accordingly, the MRI apparatus 100 is configured to take MR images in a time series having a desired cardiac cycle, by extending or shortening the RR intervals of the heartbeats to suit the time period defined by the operator. In the present example, one cardiac cycle is defined as "1,000 msec"; however, it is possible to set one cardiac cycle to any arbitrary period of time.

Further, the operator sets the number of MR images to be obtained per cardiac cycle. For example, the operator sets the number of images to be obtained as "24". Accordingly, the MRI apparatus 100 takes 24 MR images that are arranged at regular intervals in one cardiac cycle. In the present example, "24" MR images are obtained per cardiac cycle; however, it is possible to set the number of images to be obtained with an arbitrary value.

Figure 4:
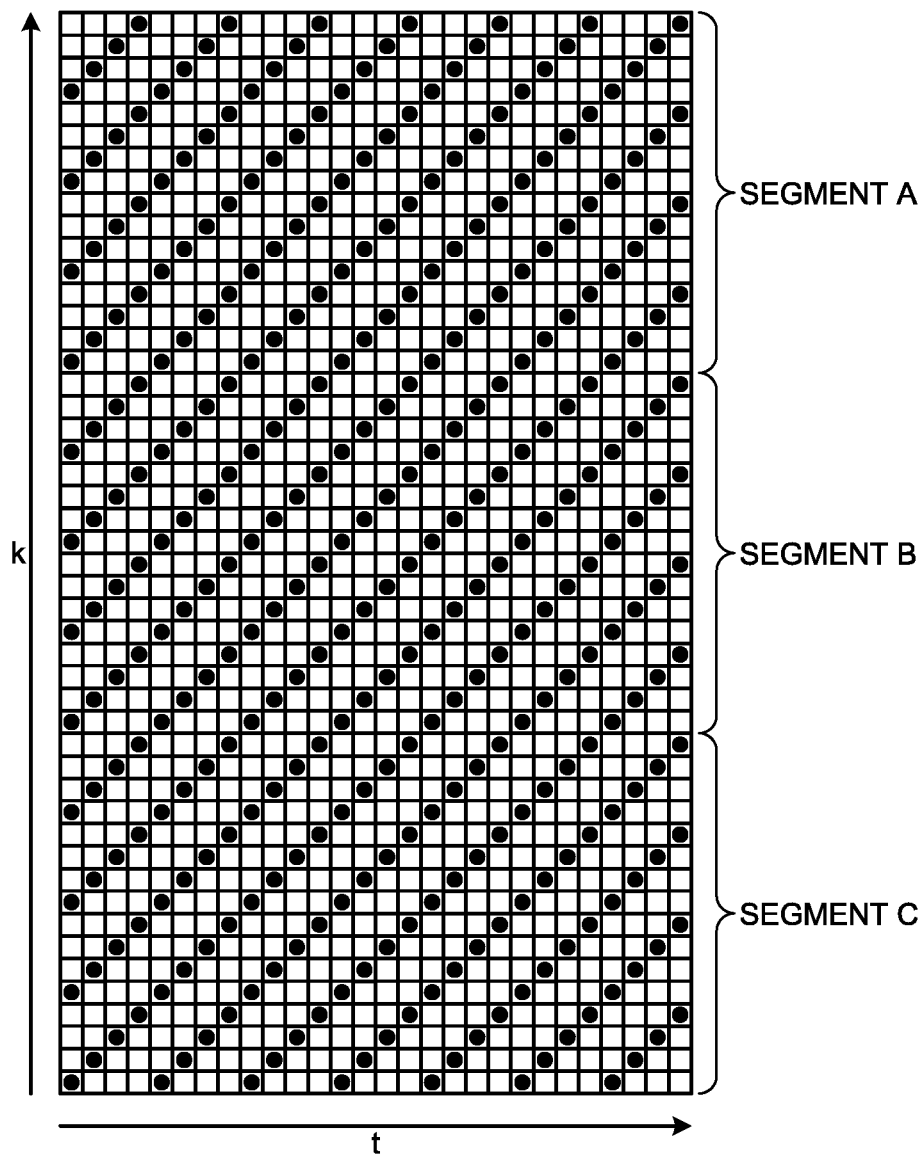
FIG. 4 is a drawing illustrating an example of k-t space data according to the first embodiment.

An example of the k-t space data according to the first embodiment will be explained, with reference to FIG. 4. FIG. 4 is a drawing illustrating an example of the k-t space data according to the first embodiment. In FIG. 4, "k" expressed on the vertical axis corresponds to the phase-encoding direction, whereas "t" expressed on the horizontal axis corresponds to the temporal phase direction. For the sake of convenience in the explanation, FIG. 4 illustrates the k-t space data in which pieces of k-space data are arranged in 48 positions (frames) in the phase-encoding direction and in 28 positions in the temporal phase direction. Further, the black dots indicate the positions in which pieces of k-space data in each line are acquired. In other words, the frames without black dots are the positions in which no k-space data is acquired. To simplify the explanation, FIG. 4 does not illustrate the frequency encoding direction. In FIG. 4, pieces of k-space data in the frequency encoding direction are used for filling in the direction perpendicular to the page of the drawing.

As illustrated in FIG. 4, for example, the obtaining function 123*a* sets the k-t space data so as to be sampled while the sampling positions are each shifted by one sample in the phase-encoding direction for each unit temporal phase. In other words, in the sampling patterns set in this manner, the data is undersampled with regularity in the phase-encoding direction of the k-space, while the phase-encoding lines (the positions) to be acquired are mutually different between the frames that are sequential in the temporal phase direction. In other words, the k-space data is sampled by using a sampling pattern in which data is undersampled with regularity in a phase-encoding direction of the k-space and in which phase-encoding lines to be sampled are mutually different between frames that are sequential in the temporal phase direction. FIG. 4 illustrates an example in which the pieces of k-space data undersampled to one-fourth are periodically sampled once every four unit temporal phases; however, possible undersampling ratios are not limited to the ratio used in this example. Further, the sampling patterns do not necessarily have to be configured to shift the sampling positions by one sample for each unit temporal phase. It is possible to use any pattern configured to periodically sample the data once every predetermined number of unit temporal phases. In other words, the sampling processes performed according to the k-t SENSE method serve as an example of the non-simple undersampling process.

As illustrated in FIG. 4, the k-t space data is acquired while being divided in three segments A, B, and C. In this situation, the segment B corresponds to a central segment, whereas the segments A and C correspond to peripheral segments that are each a segment other than the central segment. In other words, the segment B contains a plurality of pieces of k-space data corresponding to a central part in the phase-encoding direction. In contrast, the segments A and C each contain a plurality of pieces of k-space data corresponding to a peripheral part in the phase-encoding direction. In this situation, the segment B is an example of a first group of data, whereas the segments A and C are each an example of a second group of data.

In this situation, the k-t space data illustrated in FIG. 4 is set in such a manner that the time period corresponding to one cardiac cycle and the number of images to be obtained designated by the operator are satisfied by approximately 120%. For example, when the number of images to be obtained is set to "24", a value indicating the number of temporal phases corresponding to approximately 28 images is set. Accordingly, in the temporal phase direction of the k-t space data illustrated in FIG. 4, 28 sampling positions (28 temporal phases) are set. Further, when one cardiac cycle is defined as "1,000 msec", k-t space data corresponding to 1,200 msec is to be acquired.

In this manner, the obtaining function 123*a* generates the sequence information on the basis of the image taking condition input by the operator. For example, the obtaining function 123*a* generates the k-t space data that is sampled on the basis of the image taking condition. The explanation using FIG. 4 is merely an example, and possible embodiments are not limited to the example illustrated in the drawing. For instance, the number of segments being divided as well as the dividing width illustrated in FIG. 4 may arbitrarily be modified depending on the setting of the phase-encoding amount.

Further, the obtaining function 123a is configured to control the image taking processes by transmitting the generated sequence information to the sequence controlling circuit 110. For example, the sequence controlling circuit 110 is configured to perform a sampling process on the basis of the sequence information received from the obtaining function 123a.

Figure 5:
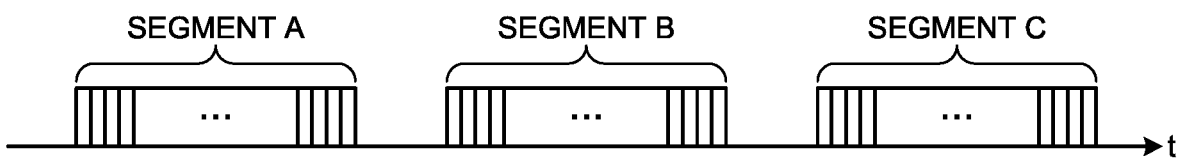
FIG. 5 is a drawing for explaining an example of a sequence according to the first embodiment.

An example of the order in which pieces of k-space data are acquired according to the first embodiment will be explained, with reference to FIG. 5. FIG. 5 is a drawing for explaining the example of the order in which pieces of k-space data are acquired according to the first embodiment.

As illustrated in FIG. 5, the sequence controlling circuit 110 acquires the k-t space data illustrated in FIG. 4 while being divided in the three segments, namely, the segments A, B, and C. For example, the sequence controlling circuit 110 acquires pieces of k-space data corresponding to 28 temporal phases in each segment in the order of the segment A, the segment B, and the segment C. Although not illustrated, the sequence controlling circuit 110 is capable of executing the sequence by inserting, as appropriate, one or more dummy shots and waiting time periods.

As explained above, the sequence controlling circuit 110 performs the sampling process on the basis of the sequence information received from the obtaining function 123a. The explanation using FIG. 5 is merely an example, and possible embodiments are not limited to the example illustrated in the drawing. For instance, although FIG. 5 illustrates the example in which the acquisitions are performed in the order of the segment A, the segment B, and the segment C, possible embodiments are not limited to this example. It is possible to perform the acquisitions in any arbitrary order.

As explained above, the sequence controlling circuit 110 is configured to acquire the plurality of pieces of k-space data divided in units of the segments and to send the acquired plurality of pieces of k-space data to the obtaining function 123a as a result of the image taking process. In this manner, the obtaining function 123a has obtained the plurality of pieces of k-space data that are acquired by using the predetermined sampling patterns over the plurality of temporal phases and are divided into the plurality of segments in the phase-encoding direction.

Further, the obtaining function 123a is configured to obtain the trigger signals at the time of the k-space data acquisitions from the storage circuitry 122. For example, the obtaining function 123a obtains detection times (timing) of the trigger signals. The intervals between sequential trigger signals correspond to the RR intervals. The detection times of the trigger signals serve as an example of the biological signal information.

In other words, the obtaining function 123a is configured to obtain the plurality of pieces of k-space data acquired from the patient, the acquisition times corresponding to the pieces of k-space data, and the pieces of biological signal information of the patient in a time series, the pieces of first k-space data being sampled with time-varying undersampling pattern.

At step S102, the calculating function 123b calculates pieces of cardiac phase information of the central segment. For example, with respect to the pieces of k-space data in the temporal phases contained in the segment B, the calculating function 123b calculates the cardiac phase information of a line positioned substantially at the center in the phase-encoding direction, as the cardiac phase information for each of the temporal phases in the segment B.

The process performed by the calculating function 123b according to the first embodiment will be explained, with reference to FIG. 6. FIG. 6 is a table for explaining the process performed by the calculating function 123b according to the first embodiment. In FIG. 6, listed under the heading "PE Line Number" are numbers each indicating the line of the acquired piece of k-space data. Listed under the heading "Time" are pieces of information each indicating an acquisition time of the acquired piece of k-space data. Listed under the heading "RR Interval" are pieces of information each indicating the RR interval of the heartbeat containing the acquired piece of k-space data. Listed under the heading "trigger" are pieces of information each indicating the time at which the trigger signal was detected with respect to the heartbeat containing the acquired piece of k-space data. Listed under the heading "Center of Phase" are pieces of information each indicating whether or not the data in the acquired line is positioned substantially at the center in the phase-encoding direction within the segment. It is possible to set the center of the phase at the stage when a sampling pattern, the number of segments being divided, and a dividing width have been determined. Listed under the heading "Cardiac Phase Information" are pieces of information each indicating the position in the temporal phase direction in one cardiac cycle. For example, each of the pieces of cardiac phase information indicates the percentage of the position in which the acquired piece of k-space data was acquired, while the start of the RR interval is expressed as 0%, and the whole length of the RR interval is expressed as 100%.

FIG. 6 illustrates an example in which 8 lines identified with PE Line numbers "2561" to "2568" are contained in one segment. In this situation, among the 8 lines, the data positioned substantially at the center in the phase-encoding direction within the segment is the line identified with PE line number "2564". Accordingly, the line identified with PE Line number "2564" is set as the center of the phase and is registered with "1". The lines that are not set as the center of the phase are registered with "0".

In this situation, the calculating function 123b calculates the cardiac phase information of the lines that are each set as the center of the phase. For example, the line identified with PE Line number "2564" is set as the center of the phase. Accordingly, the calculating function 123b calculates the cardiac phase information of the line identified with PE Line number "2564". More specifically, the calculating function 123b calculates the cardiac phase information "54.97" of the segment by dividing the difference between the "Time" and the "trigger" by the "RR interval" and expressing the result in a percentage.

Further, with respect to the calculating function 123b, another example will be explained in which the 8 lines identified with PE Line numbers "2569" to "2576" are contained in one segment. In this situation, among the 8 lines, the data positioned substantially at the center in the phase-encoding direction within the segment is the line identified with PE line number "2572". Accordingly, the line identified with PE Line number "2572" is set as the center of the phase and is registered with "1". The calculating function 123b therefore calculates the cardiac phase information of the line identified with PE line number "2572". More specifically, the calculating function 123b calculates the cardiac phase information "58.37" of the segment by dividing the difference between the "Time" and the "trigger" by the "RR interval" and expressing the result in a percentage.

As explained above, the calculating function 123b calculates the pieces of cardiac phase information of the central segment including the data of such lines among the plurality of lines that were acquired with the phase-encoding amount used as a reference. The configuration illustrated in FIG. 6 is merely an example, and possible embodiments are not limited to the example illustrated in the drawing. For instance, the calculating function 123b may calculate cardiac phase information of the line identified with PE Line number "2565" in place of the line identified with PE Line number "2564". In other words, "substantially at the center" means that the line does not necessarily have to be the line positioned closest to the center in the phase-encoding direction within the segment.

At step S103, the calculating function 123b calculates pieces of cardiac phase information of the peripheral segments. For example, with respect to the pieces of k-space data in the temporal phases contained in the segment A, the calculating function 123b calculates the cardiac phase information of a line positioned substantially at the center in the phase-encoding direction, as the cardiac phase information for each of the temporal phases in the segment A. Further, with respect to the pieces of k-space data in the temporal phases contained in the segment C, the calculating function 123b calculates the cardiac phase information of a line positioned substantially at the center in the phase-encoding direction, as the cardiac phase information for each of the temporal phases in the segment C.

In other words, the calculating function 123b is configured to calculate the cardiac phase information of each of the peripheral segments including the pieces of k-space data acquired with a phase-encoding amount different from that of the central segment. In this situation, because the process of calculating the pieces of cardiac phase information of the peripheral segments is the same as the process of calculating the pieces of cardiac phase information of the central segment, the explanation thereof will be omitted.

At step S104, the linking function 123c links a peripheral segment having cardiac phase information close to the cardiac phase information of the central segment, to the central segment. For example, the linking function 123c generates linked data corresponding to a plurality of temporal phases by bringing such a piece of cardiac phase information that is close among the pieces of cardiac phase information of the peripheral segments, into correspondence with each of the pieces of cardiac phase information of the central segment and further linking the central segment and the peripheral segment to each other on the basis of the pieces of cardiac phase information brought in correspondence with each other.

The process performed by the linking function 123c according to the first embodiment will be explained, with reference to FIGS. 7 to 11. FIGS. 7 to 11 are drawings for explaining the process performed by the linking function 123c according to the first embodiment. In each of FIGS. 7 to 11, the top section illustrates a sequence executed by the sequence controlling circuit 110. The bottom section illustrates a process in which the pieces of k-space data acquired by the sequence illustrated in the top section are arranged in the k-t space according to sampling patterns set in advance. In this situation, the sequence illustrated in the top section is the same as the sequence illustrated in FIG. 5. Further, in the k-t space illustrated in the bottom section, the pieces of k-space data are arranged by using the sampling patterns illustrated in FIG. 4.

In the present example, for the sake of convenience in the explanation, the 28 temporal phases contained in the segment A will be referred to as TA1, TA2, TA3, . . . , and TA28 in the order of the temporal phase. Further, the 28 temporal phases contained in the segment B will be referred to as TB1, TB2, TB3, . . . , and TB28 in the order of the temporal phase. Similarly, the 28 temporal phases contained in the segment C will be referred to as TC1, TC2, TC3, . . . , and TC28 in the order of the temporal phase.

Figure 7:
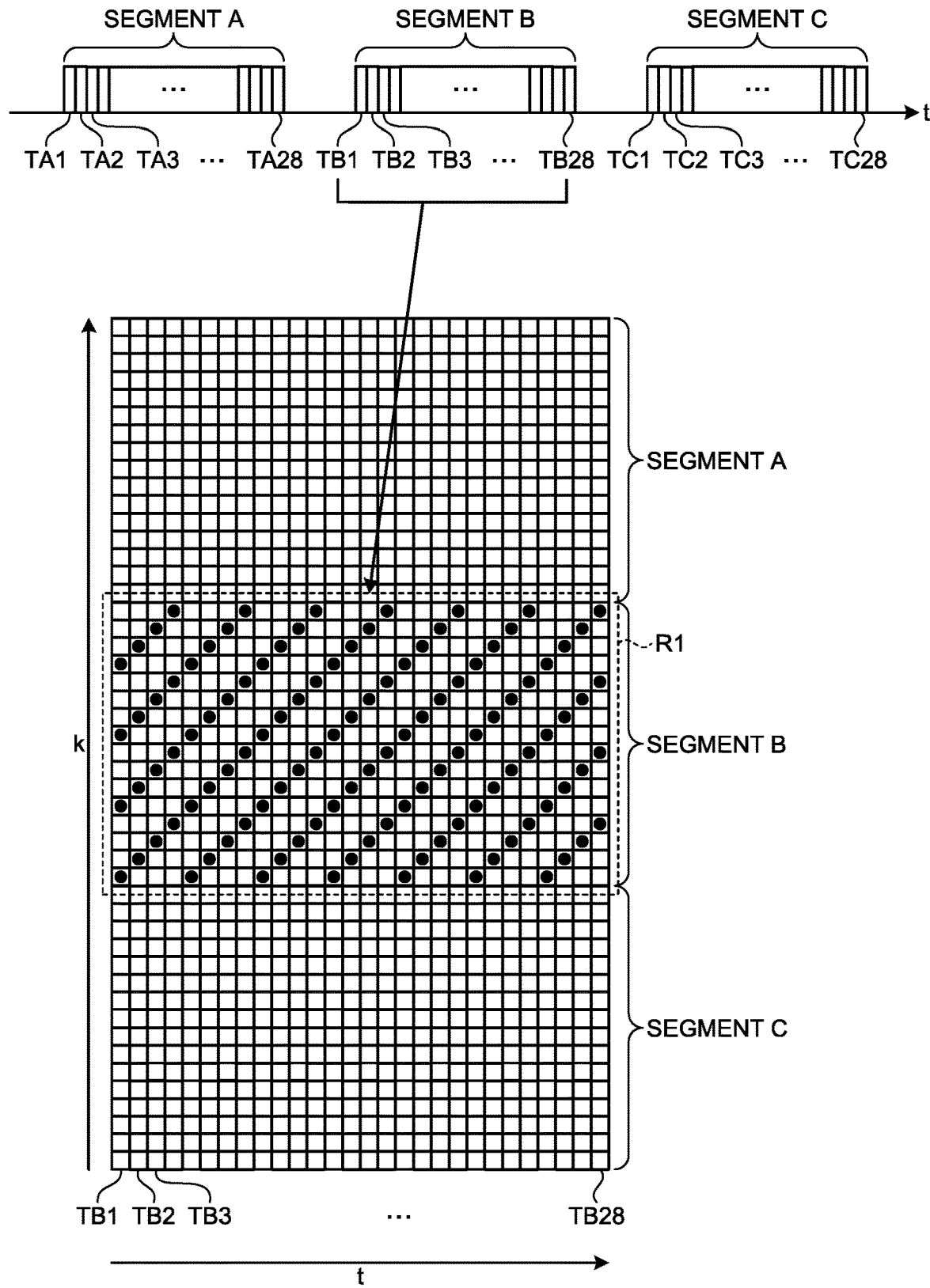
FIG. 7 is a drawing for explaining a process performed by a linking function according to the first embodiment.

As illustrated in FIG. 7, the linking function 123c arranges the pieces of k-space data corresponding to the 28 temporal phases contained in the segment B, which is the central segment, into the k-t space. In this situation, the linking function 123c arranges the pieces of k-space data corresponding to the 28 temporal phases and having been acquired by using predetermined sampling patterns, into a region R1 of the k-t space, without rearranging the pieces of k-space data kept in the acquisition order. In other words, the temporal phase direction in the k-t space corresponds to TB1, TB2, TB3, . . . , and TB28. As a result, arranged in a central part of the k-t space in terms of the phase-encoding direction are pieces of k-space data following the sampling patterns in which the sampling positions are shifted by one sample for each unit temporal phase, in the same manner as in FIG. 4.

Figure 8:
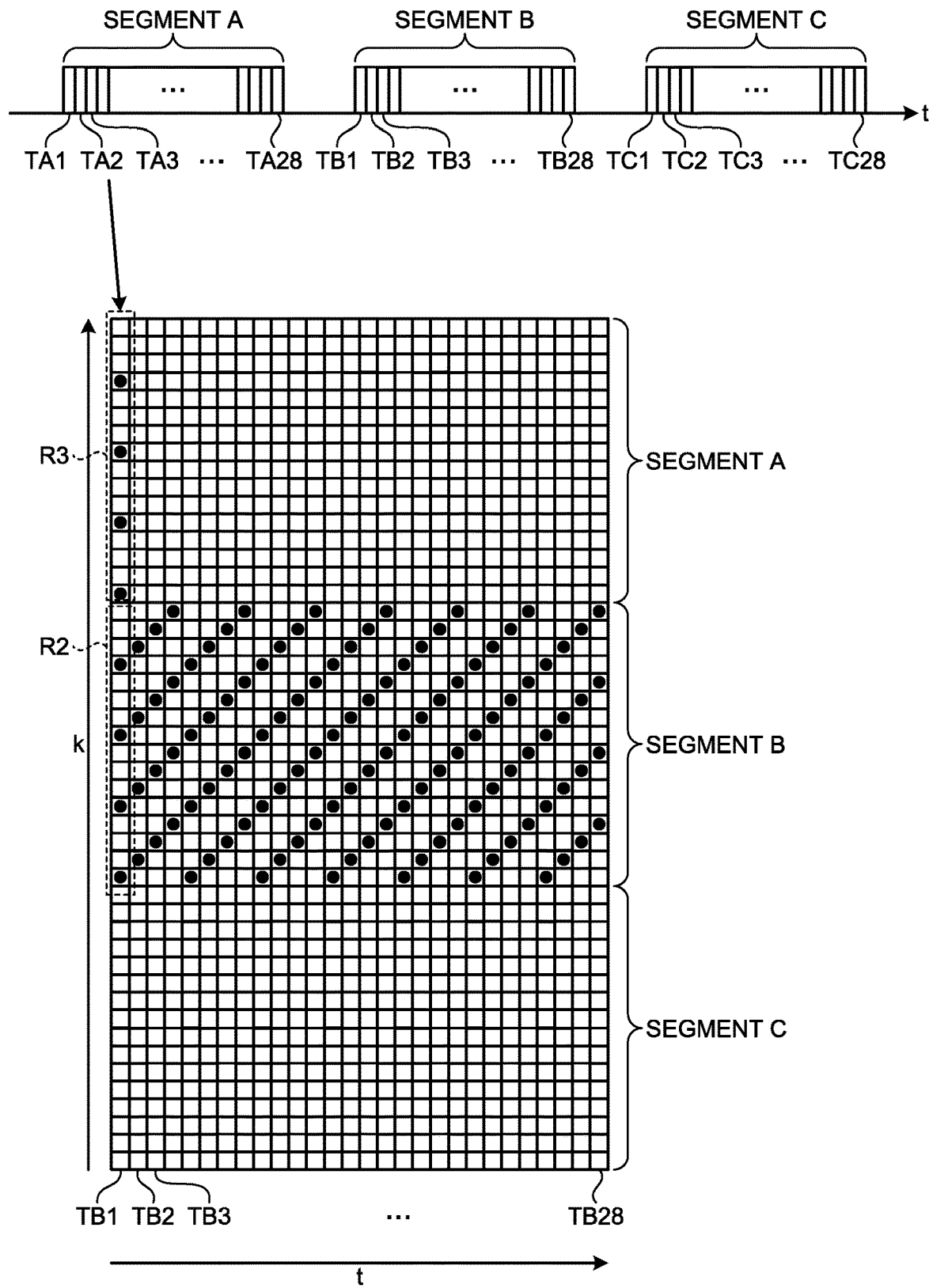
FIG. 8 is another drawing for explaining the process performed by the linking function according to the first embodiment.

Subsequently, the linking function 123c links the segment A having cardiac phase information close to the cardiac phase information of the segment B, to the segment B in the temporal phase TB1 arranged as a reference. For example, as illustrated in FIG. 8, the linking function 123c reads the cardiac phase information of the segment B in the temporal phase TB1 (in a region R2). Further, from within the segment A in the temporal phases TA1 to TA28, the linking function 123c selects a part of the segment A having the cardiac phase information closest to the cardiac phase information of the segment B in the temporal phase TB1.

In this situation, the linking function 123c selects the part of the segment A on the basis of the sampling patterns set in advance. For example, the linking function 123c identifies the sampling pattern arranged in a region R3, by referring to the sampling patterns (FIG. 4) set in advance. More specifically, the linking function 123c identifies that, in the sampling pattern, among the 16 frames in the region R3, pieces of k-space data are arranged in the 4th, the 8th, the 12th, and the 16th positions counted from the top. Subsequently, the linking function 123c selects the part of the segment A that has the identified sampling pattern and also has the cardiac phase information close to the cardiac phase information of the segment B in the temporal phase TB1. After that, the linking function 123c links the selected part of the segment A (e.g., the part of the segment in the temporal phase TA3) to the segment B in the temporal phase TB1.

Figure 9:
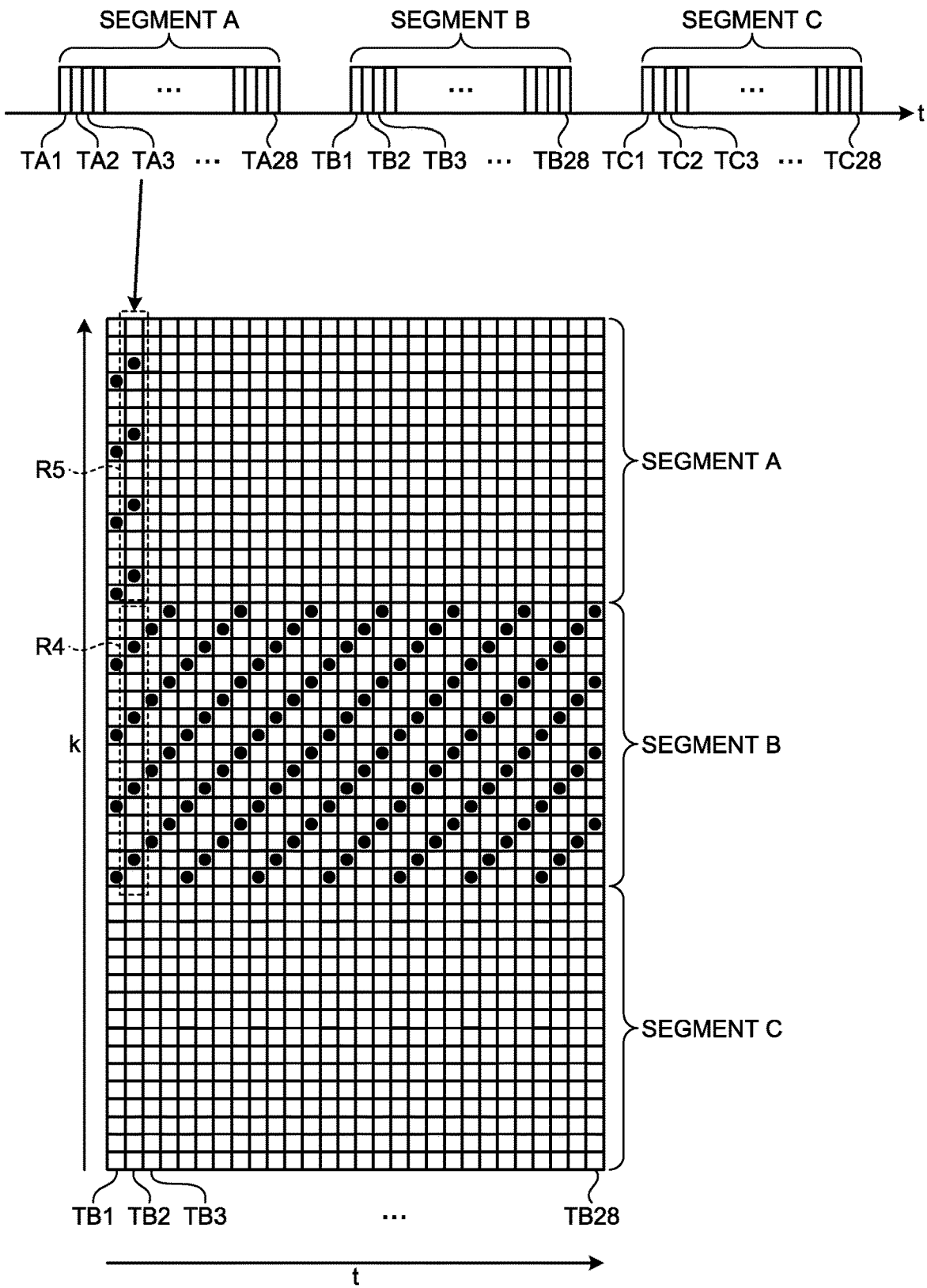
FIG. 9 is yet another drawing for explaining the process performed by the linking function according to the first embodiment.

Subsequently, as illustrated in FIG. 9, the linking function 123c reads the cardiac phase information of the segment B in the temporal phase TB2 (in a region R4). Further, from within the segment A in the temporal phases TA1 to TA28, the linking function 123c selects a part of the segment A having cardiac phase information close to the cardiac phase information of the segment B in the temporal phase TB2.

After that, the linking function 123c identifies the sampling pattern arranged in the region R5 by referring to the sampling patterns (FIG. 4) set in advance. More specifically, the linking function 123c identifies that, in the sampling pattern, among the 16 frames in the region R5, pieces of k-space data are arranged in the 3rd, the 7th, the 11th, and the 15th positions counted from the top. Subsequently, the linking function 123c selects a part of the segment A that has the identified sampling pattern and also has the cardiac phase information close to the cardiac phase information of the segment B in the temporal phase TB2. After that, the linking function 123c links the selected part of the segment A to the segment B in the temporal phase TB2.

Figure 10:
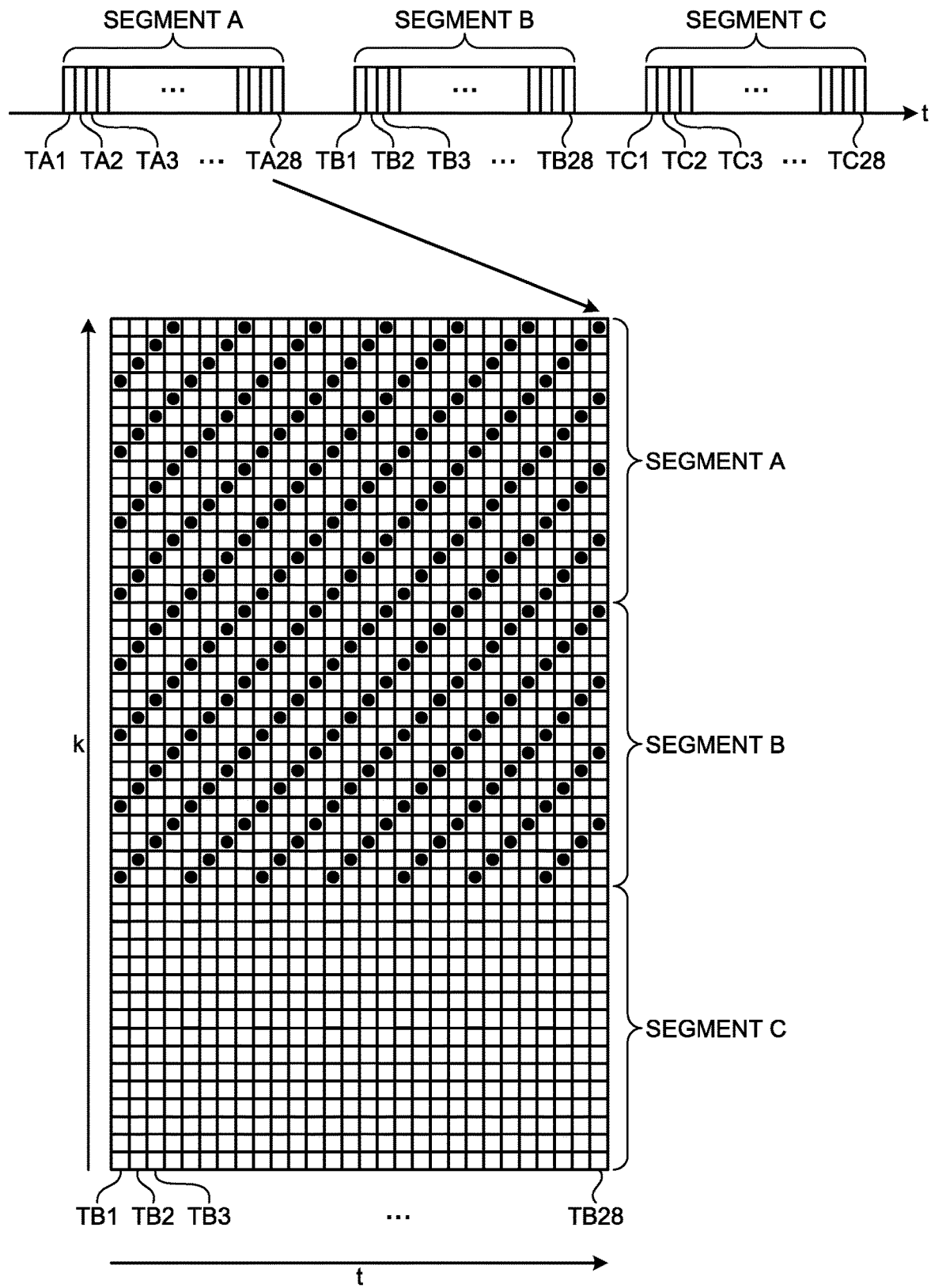
FIG. 10 is yet another drawing for explaining the process performed by the linking function according to the first embodiment.

In the manner described above, the linking function 123c selects the parts of the segment A that each have the sampling pattern set in advance and also has the cardiac phase information close to the cardiac phase information of the segment B. After that, the linking function 123c links the selected parts of the segment A to the segment B, in units of the segments. As a result, as illustrated in FIG. 10, to each of the parts of segment B in the temporal phases TB1 to TB28, it is possible to link a part of the segment A having the closest cardiac phase, without disturbing the sampling patterns set in advance. In other words, the linking function 123c is configured to generate the linked data in such a manner that the predetermined sampling patterns are arranged with regularity along the temporal phase direction.

Figure 11:
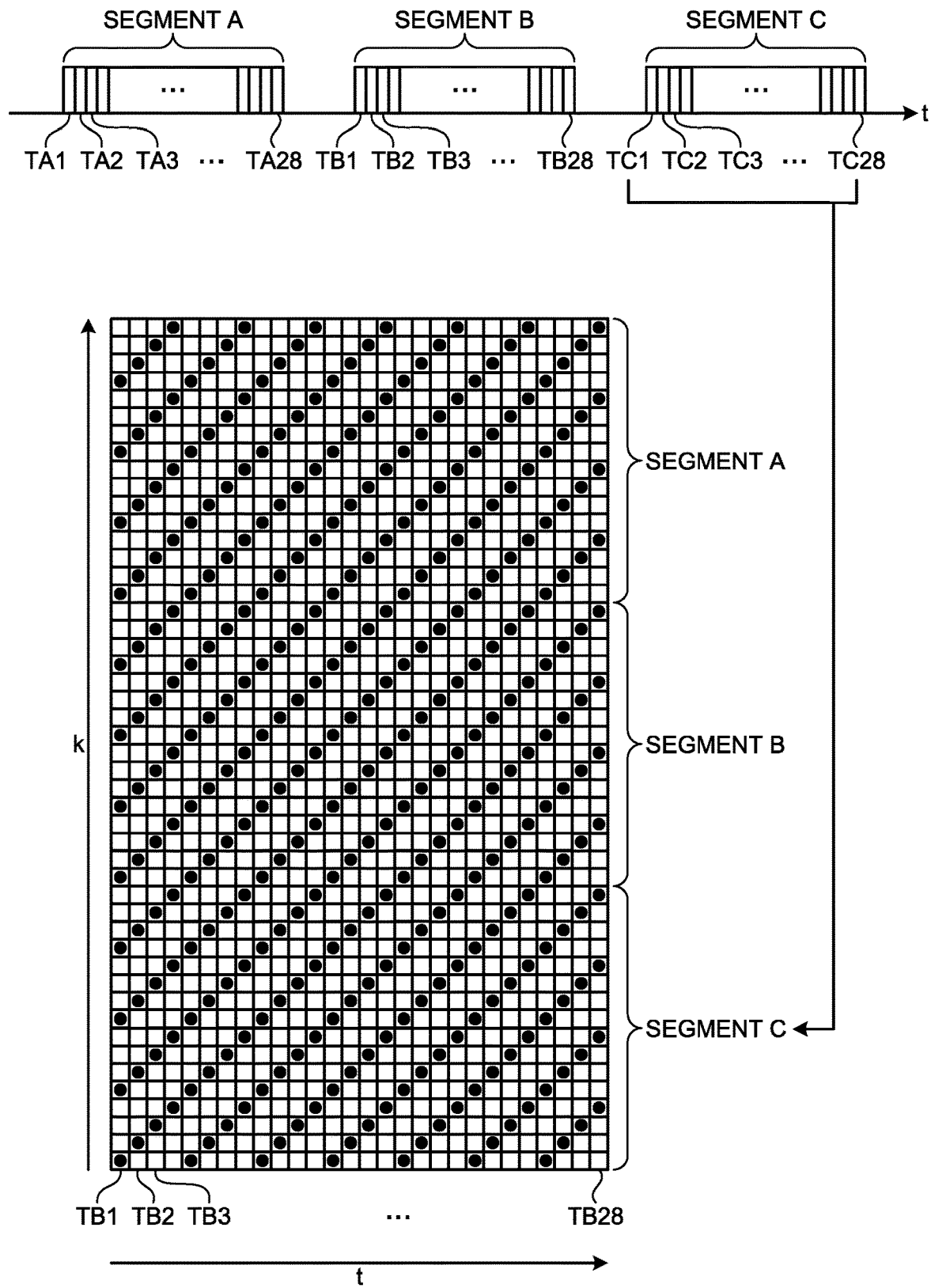
FIG. 11 is yet another drawing for explaining the process performed by the linking function according to the first embodiment.

Further, as illustrated in FIG. 11, the linking function 123c links the segment C to the segment B by performing the same process as the process performed for the segment A. As a result, the linking function 123c selects parts of the segment C that each have the sampling pattern set in advance and also have cardiac phase information close to the cardiac phase information of a different one of the parts of the segment B and further links the selected parts in units of the segments.

In the manner described above, the linking function 123c selects the parts of the peripheral segments that each have the sampling pattern set in advance and also have the cardiac phase information close to the cardiac phase information of the central segment. After that, the linking function 123c generates linked data by linking the central segment and the selected parts of the peripheral segments to each other in units of the segments. After that, with respect to each of the temporal phases included in the k-t space data, the linking function 123c generates the linked data corresponding to the temporal phase. In other words, from among the plurality of pieces of k-space data contained in the peripheral segments, the linking function 123c is configured to link the pieces of k-space data each having a cardiac phase close to the cardiac phase of the central segment, to the plurality of pieces of k-space data contained in the central segment.

At step S105, the reconstructing function 123d performs a reconstructing process. For example, the reconstructing function 123d generates MR images corresponding to a plurality of temporal phases by performing the reconstructing process including a Fourier transform (e.g., a discrete Fourier transform) on the linked data corresponding to the plurality of temporal phases that was generated by the linking function 123c. In this situation, the MR images serve as an example of the reconstructed images.

At step S106, the selecting function 123e selects MR images having pieces of cardiac phase information close to pieces of temporal phase information set in advance. For example, from among the MR images corresponding to the plurality of temporal phases that were generated by the reconstructing function 123d, the selecting function 123e selects reconstructed images each having a piece of cardiac phase information close to a different one of the plurality of pieces of temporal phase information set in advance.

Figure 12:
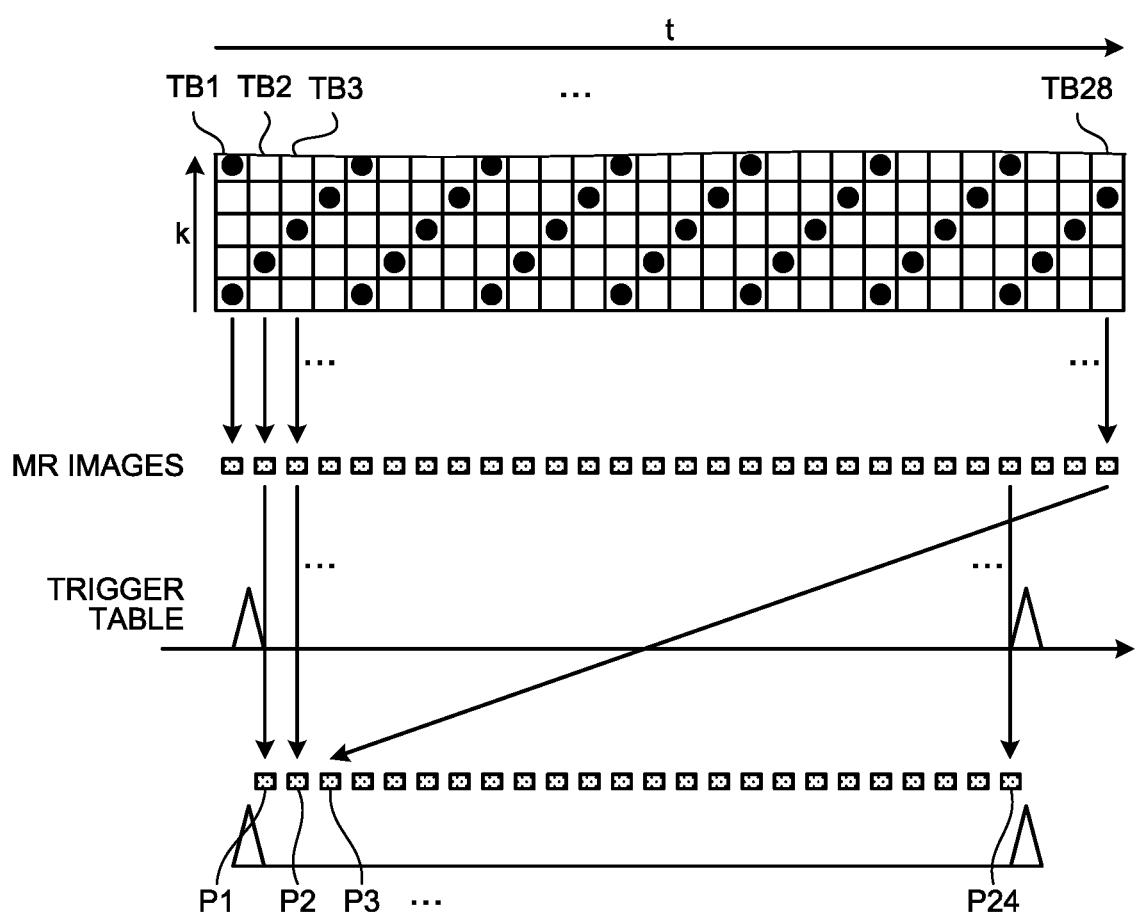
FIG. 12 is a drawing for explaining processes performed by a reconstructing function and a selecting function according to the first embodiment.

Processes performed by the reconstructing function 123d and the selecting function 123e according to the first embodiment will be explained, with reference to FIGS. 12 and 13. FIGS. 12 and 13 are drawings for explaining the processes performed by the reconstructing function 123d and the selecting function 123e according to the first embodiment. The top section of FIG. 12 illustrates the linked data corresponding to the plurality of temporal phases that was generated by the linking function 123c, i.e., the k-t space data illustrated in the bottom section of FIG. 11. In this situation, FIG. 12 illustrates a part of the k-t space data for the sake of convenience in the illustration. Further, FIG. 13 illustrates phases corresponding to the number of MR images to be obtained per cardiac cycle set in advance and pieces of temporal information indicating the positions of the MR images in the temporal phase direction.

For example, the reconstructing function 123d transforms the linked data corresponding to the plurality of temporal phases into x-f space data structured with an image space and a time spectrum, by performing a Fourier transform. Further, when the k-t SENSE method is being used, the reconstructing function 123d generates x-f space data from which aliasing signals in the x-f space data have been eliminated, by using a sensitivity map of the x-f space. Further, the reconstructing function 123d generates a plurality of MR images in a time series by transforming the generated x-f space data into x-t space data by performing an inverse Fourier transform.

In other words, as illustrated in FIG. 12, the reconstructing function 123d generates the MR images corresponding to the 28 temporal phases (the 28 MR images) from the k-t space data in the 28 temporal phases, by performing the reconstructing process in accordance with the sampling patterns set in advance. In this situation, the 28 MR images correspond to the 28 temporal phases of the segment B.

After that, from among the 28 MR images, the selecting function 123e selects MR images of which the quantity corresponds to the number of images to be obtained set in advance. As illustrated in FIG. 13, when the number of images to be obtained is set to "24", the phases of the MR images in one cardiac cycle correspond to the 24 phases of P1 to P24. In this situation, the pieces of temporal phase information of the MR images corresponding to the phases P1 to P24 indicate the percentage values of the positions to which the MR images in the phases P1 to P23 correspond, while the start of the one cardiac cycle is expressed as 0%, whereas the MR image in P24 (the 24th image) is expressed as 100%. More specifically, the piece of temporal phase information of the MR image in the phase P1 indicates 4.1667(%), whereas the piece of temporal phase information of the MR image in the phase P2 indicates 8.3333(%). In this manner, the pieces of temporal information of the MR images in the phases P1 to P24 are calculated.

After that, as illustrated in FIG. 12, from among the MR images in the 28 temporal phases, the selecting function 123e selects MR images each having the piece of cardiac phase information closest to a different one of the pieces of temporal phase information of the phases P1 to P24. In this situation, because the MR images in the 28 temporal phases correspond to the temporal phases TB1 to TB28 of the segment B, it is possible to use the pieces of cardiac phase information of the segment B corresponding to the temporal phases, as the pieces of cardiac phase information of the MR images. In the example illustrated in FIG. 12, the selecting function 123e selects the MR image in the temporal phase TB2 as the MR image in the phase P1. Further, the selecting function 123e selects the MR image in the temporal phase TB3 as the MR image in the phase P2. Further, the selecting function 123e selects the MR image in the temporal phase TB28 as the MR image in the phase P3.

In this manner, from among the MR images corresponding to the 28 temporal phases that were generated by the reconstructing function 123d, the selecting function 123e selects the MR images each having the piece of cardiac phase information close to a different one of the plurality pieces of temporal phase information set in advance.

As a result, the processing circuitry 123 generates the MR images corresponding to the plurality of temporal phases and satisfying the image taking condition set by the operator. In this situation, the generated MR images corresponding to the plurality of temporal phases may be displayed on the display device 125 or may be stored into the storage circuitry 122, in accordance with an instruction from the processing circuitry 123.

The processing procedure illustrated in FIG. 3 is merely an example, and possible embodiments are not limited to this example. For instance, the processes illustrated at steps S102 and S103 do not necessarily have to be executed in the order indicated in the drawing. For example, the processes at steps S102 and S103 may be performed at the same time as each other. Alternatively, the process at step S102 may be performed after the process at step S103 is performed.

As explained above, in the MRI apparatus 100 according to the first embodiment, the processing circuitry 123 is configured to acquire the pieces of k-space data over the plurality of temporal phases by using the predetermined sampling patterns, for each of the plurality of segments divided in the phase-encoding direction. The processing circuitry 123 is configured to calculate the pieces of cardiac phase information of the central segment that is used as a reference among the plurality of segments and the pieces of cardiac phase information of the peripheral segments different from the central segment. The processing circuitry 123 is configured to generate the linked data corresponding to the plurality of temporal phases, by linking the central segment to the peripheral segments having the cardiac phase information close to the cardiac phase information of the central segment. The processing circuitry 123 is configured to generate the reconstructed images corresponding to the plurality of temporal phases by reconstructing the linked data corresponding to the plurality of temporal phases, on the basis of the predetermined sampling patterns. From among the reconstructed images corresponding to the plurality of temporal phases, the processing circuitry 123 is configured to select the reconstructed images each having the piece of cardiac phase information close to a different one of the plurality of pieces of cardiac phase information set in advance. With these arrangements, the MRI apparatus 100 according to the first embodiment makes it possible to perform the image taking processes having a high spatial resolution and a high temporal resolution on a site having periodic motion.

For example, the MRI apparatus 100 according to the first embodiment performs the sampling process on the heart, which is a site having periodic motion by changing, with regularity, the undersampling pattern for the k-space observed along the time series. After that, the MRI apparatus 100 aligns the cardiac phases in units of the segments, not in units of the lines. With these arrangements, the MRI apparatus 100 is able to link the segments having the sampling patterns set in advance to each other. Accordingly, the MRI apparatus 100 is capable of rearranging the pieces of k-t space data in a retroactive manner so that the cardiac phases thereof are aligned with one another. Consequently, the operator is able to define an image taking condition for the high-speed image taking processes having a higher degree of freedom.

Further, a principal component of morphological information rendered in the MR images corresponds to the central part of the k-space. For this reason, the MRI apparatus 100 generates the k-t space data on which the reconstructing process is to be performed, by using the central segment corresponding to the central part as a reference. Consequently, the accuracy of the cardiac phases of the central segment is maintained.

As for a plurality of pieces of k-space data contained in a segment corresponding to a certain temporal phase, the acquisition times thereof are different from one another, in a strict sense, although the pieces of k-space data are sequentially acquired. Even between the segments to be linked to each other, there may be a difference in the acquisition times in some situations. However, the MRI apparatus 100 generates the k-t space data arranged by using the predetermined sampling patterns, while tolerating the difference in the acquisition times. Accordingly, the MRI apparatus 100 is configured to realize the high-speed image taking processes while tolerating misalignments of cardiac phases to a certain extent.

First Modification Example of First Embodiment

In the embodiment above, as an example, the situation in which the sampling process is performed by using the sampling patterns illustrated in FIG. 4 is explained; however, possible embodiments are not limited to this example.

Figure 14:
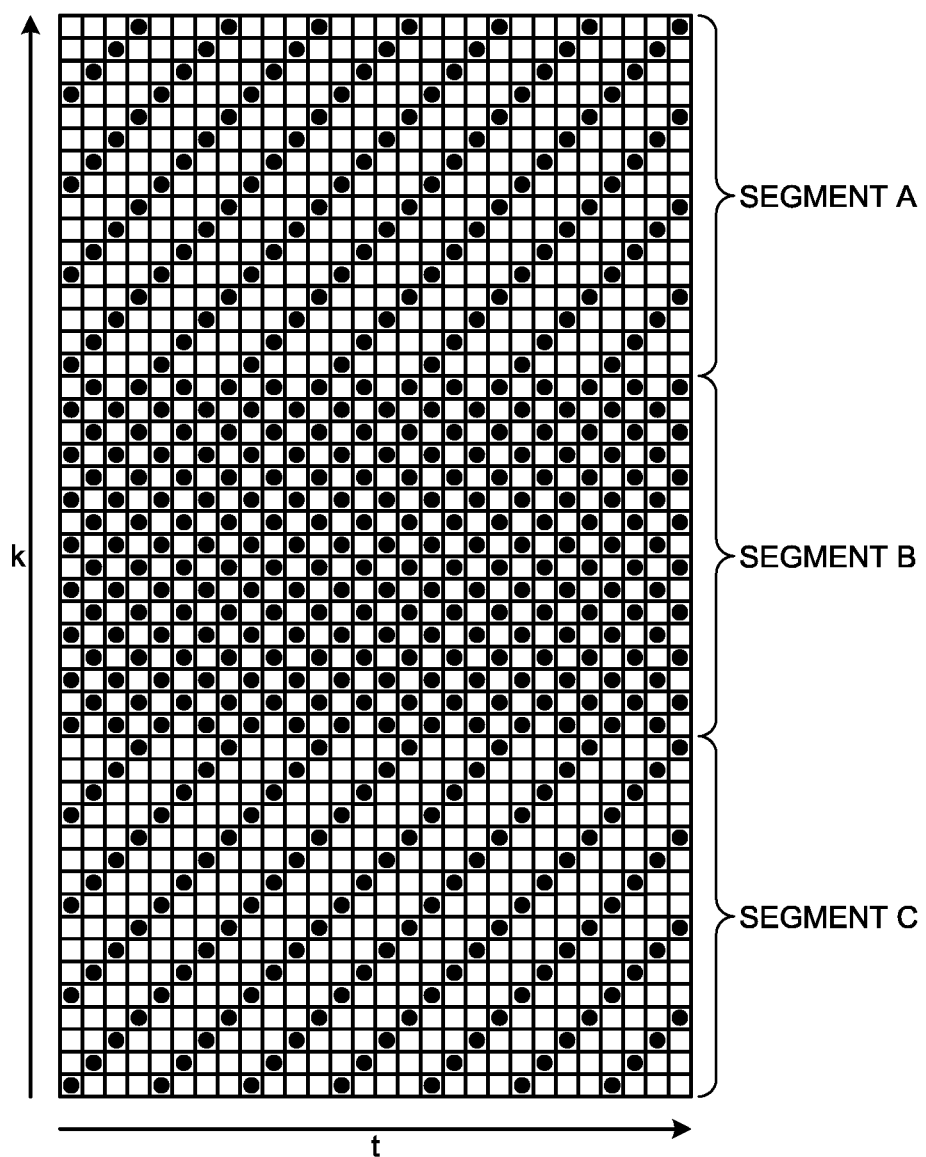
FIG. 14 is a drawing illustrating an example of k-t space data according to a first modification example of the first embodiment.

An example of k-t space data according to a first modification example of the first embodiment will be explained with reference to FIG. 14. FIG. 14 is a drawing illustrating the example of the k-t space data according to the first modification example of the first embodiment. In the example illustrated in FIG. 14, in the segment A and the segment C, the k-t space data is the same as the k-t space data illustrated in FIG. 4. In other words, in the segment A and the segment C, the pieces of k-space data that are undersampled to one-fourth in the phase-encoding direction are sampled while the sampling positions are each shifted by one sample in the phase-encoding direction for each unit temporal phase.

In contrast, in the segment B, the sampling process is performed with density that is twice as high as that of the k-t space data illustrated in FIG. 4. In other words, in the segment B, the pieces of k-space data that are undersampled to a half in the phase-encoding direction are sampled while the sampling positions are each shifted by one sample in the phase-encoding direction for each unit temporal phase.

In other words, it is sufficient when the sampling patterns set in advance are mutually different between the frames that are sequential in the temporal phase direction. When the k-t space data is set with such sampling patterns, the MRI apparatus 100 is able to perform a rearranging process in a retroactive manner so that the cardiac phases thereof are aligned with one another in units of the segments, by performing the process described above. In other words, the k-space data is sampled by sampling patterns that are different between frames sequential in a temporal phase direction.

Second Modification Example of First Embodiment

Further, in the embodiment above, the example is explained in which the undersampling pattern in the k-space along the time series changes with regularity; however, possible embodiments are not limited to this example. For instance, the processing functions according to the embodiment described above are also applicable to a Compressed Sensing (CS) scheme. Sampling processes using the compressed sensing scheme serve as an example of the non-simple undersampling process. As an acquisition method in the compressed sensing scheme, it is desirable to use a radial acquisition method or a Cartesian acquisition method.

The compressed sensing scheme provides an image taking method by which images are reconstructed from a small number of pieces of k-space data by making use of sparsity of signals. For example, while the compressed sensing scheme is implemented, when k-space data is used for filling into a k-space, pieces of k-space data are sampled while being undersampled with irregularity in the phase-encoding direction. As a result, by using the compressed sensing scheme, it is possible to shorten the data acquisition time period while introducing the sparsity.

Figure 15:
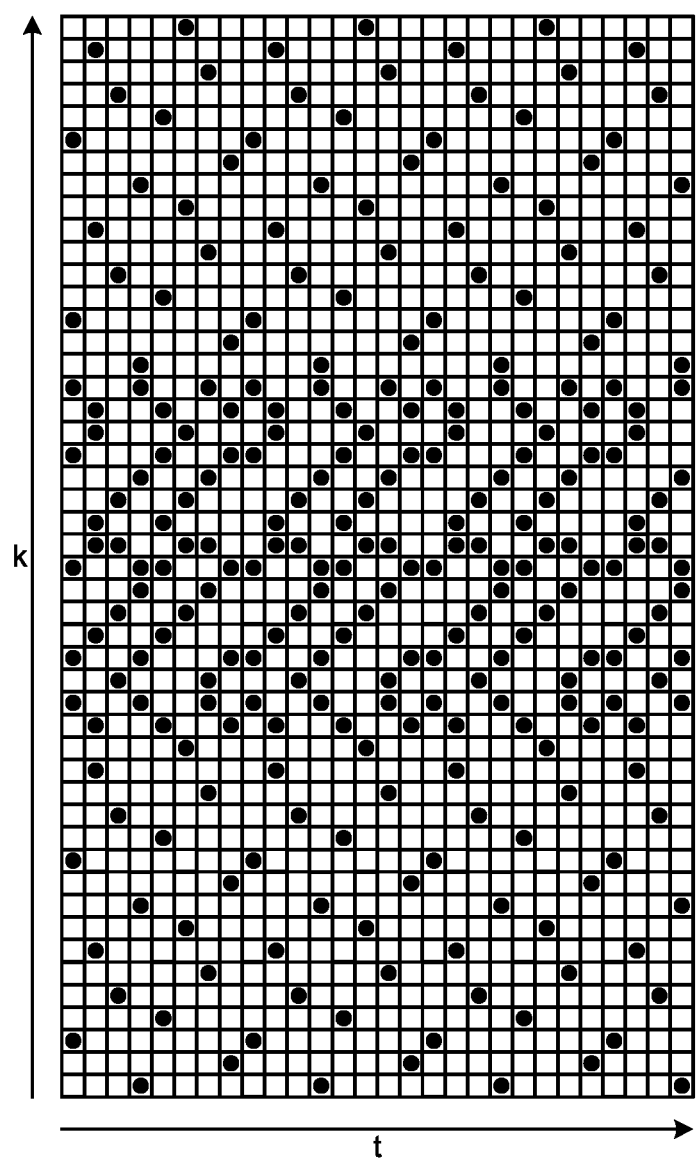
FIG. 15 is a drawing illustrating an example of k-t space data according to a second modification example of the first embodiment.

An example of k-t space data according to a second modification example of the first embodiment will be explained with reference to FIG. 15. FIG. 15 is a drawing illustrating the example of the k-t space data according to the second modification example of the first embodiment. The k-t space data illustrated in FIG. 15 is acquired while being divided into a plurality of segments in the phase-encoding direction.

In the example illustrated in FIG. 15, the sampling process is performed by undersampling the data with irregularity in the phase-encoding direction and also undersampling the data with irregularity in a cine-phase direction (the temporal phase direction). With this arrangement, it is possible to realize a shortened acquisition time period while using the compressed sensing scheme.

In other words, in the compressed sensing scheme, irregular undersampling patterns in the phase-encoding direction and the cine-phase direction are set in advance, as the predetermined sampling patterns. Accordingly, the MRI apparatus 100 is able to apply the retroactive rearranging process by which the cardiac phases of the pieces of k-t space data are aligned, also to the example using the compressed sensing scheme, in the same manner as in the situation where the undersampling patterns in the k-space along the time series is changed with regularity.

In other words, in the MRI apparatus 100, the obtaining function 123a is configured to acquire, over the plurality of temporal phases, the plurality of pieces of k-space data that are arranged by using the predetermined sampling patterns and are divided into the plurality of segments in the phase-encoding direction. The calculating function 123b is configured to calculate the pieces of cardiac phase information of the central segment that is used as a reference among the plurality of segments and the pieces of cardiac phase information of the peripheral segments different from the central segment. The linking function 123c is configured to generate the linked data corresponding to the plurality of temporal phases, by linking the central segment to the peripheral segments each having the pieces of cardiac phase information close to the pieces of cardiac phase information of the central segment. The reconstructing function 123d is configured to generate the reconstructed images corresponding to the plurality of temporal phases by reconstructing the linked data corresponding to the plurality of temporal phases on the basis of the predetermined sampling patterns. From among the reconstructed images corresponding to the plurality of temporal phases, the selecting function 123e is configured to select the reconstructed images each having the piece of cardiac phase information close to a different one of the plurality of pieces of cardiac phase information set in advance. With these arrangements, the MRI apparatus 100 makes it possible to perform the image taking processes at an even higher speed on a site having periodic motion, even when the compressed sensing scheme is applied.

The example illustrated in FIG. 15 is merely an example, and possible embodiments are not limited to the example illustrated in the drawing. For instance, it is sufficient when the sampling patterns used in the compressed sensing scheme are configured so that the phase-encoding lines to be acquired are irregular at least between the frames that are sequential in the temporal phase direction. Further, the linking function 123c is configured to generate linked data in such a manner that the predetermined sampling patterns are arranged with irregularity along the temporal phase direction. In other words, the k-space data is sampled by using a sampling pattern in which phase-encoding lines to be sampled are irregular between at least frames that are sequential in the temporal phase direction.

Further, for example, the abovementioned processes performed by the MRI apparatus 100 do not necessarily have to be based on the predetermined sampling patterns. Further, when the image quality of the reconstructed images is low, the MRI apparatus 100 is able to link, to the central segment, one or more parts of the peripheral segment each having a piece of cardiac phase information that is not the closest but is second closest to any of the pieces of cardiac phase information of the central segment.

Second Embodiment

In the first embodiment, the example is explained in which the plurality of MR images corresponding to one heartbeat are selected from among the MR images in the plurality of temporal phases corresponding to the time period of one or more heartbeats. However, when the plurality of MR images are played back, there may be a situation where the MR images may give an impression of being non-sequential when being switched from one image to another.

For example, in the process illustrated in FIG. 12, the MR image in the temporal phase TB3 is selected as the MR image in the phase P2, whereas the MR image in the temporal phase TB28 is selected as the MR image in the phase P3. In other words, the two MR images in the temporal phase TB3 and the temporal phase TB28 that were obtained during mutually-different heartbeats are played back as sequential frames. Because the two MR images in the temporal phase TB3 and the temporal phase TB28 are selected as MR images in the desired cardiac phase, these images are expected to be sufficient as images of the heart; however, for example, there may be a difference in the background images in some situations. In those situations, when the two MR images are played back, there is a possibility that viewers may feel strange at the time when one of the images is switched to the other.

To cope with those situations, by performing the processes described below, the MRI apparatus 100 according to a second embodiment is able to inhibit the strange feeling even when MR images obtained during mutually-different heartbeats are sequentially played back.

Figure 16:
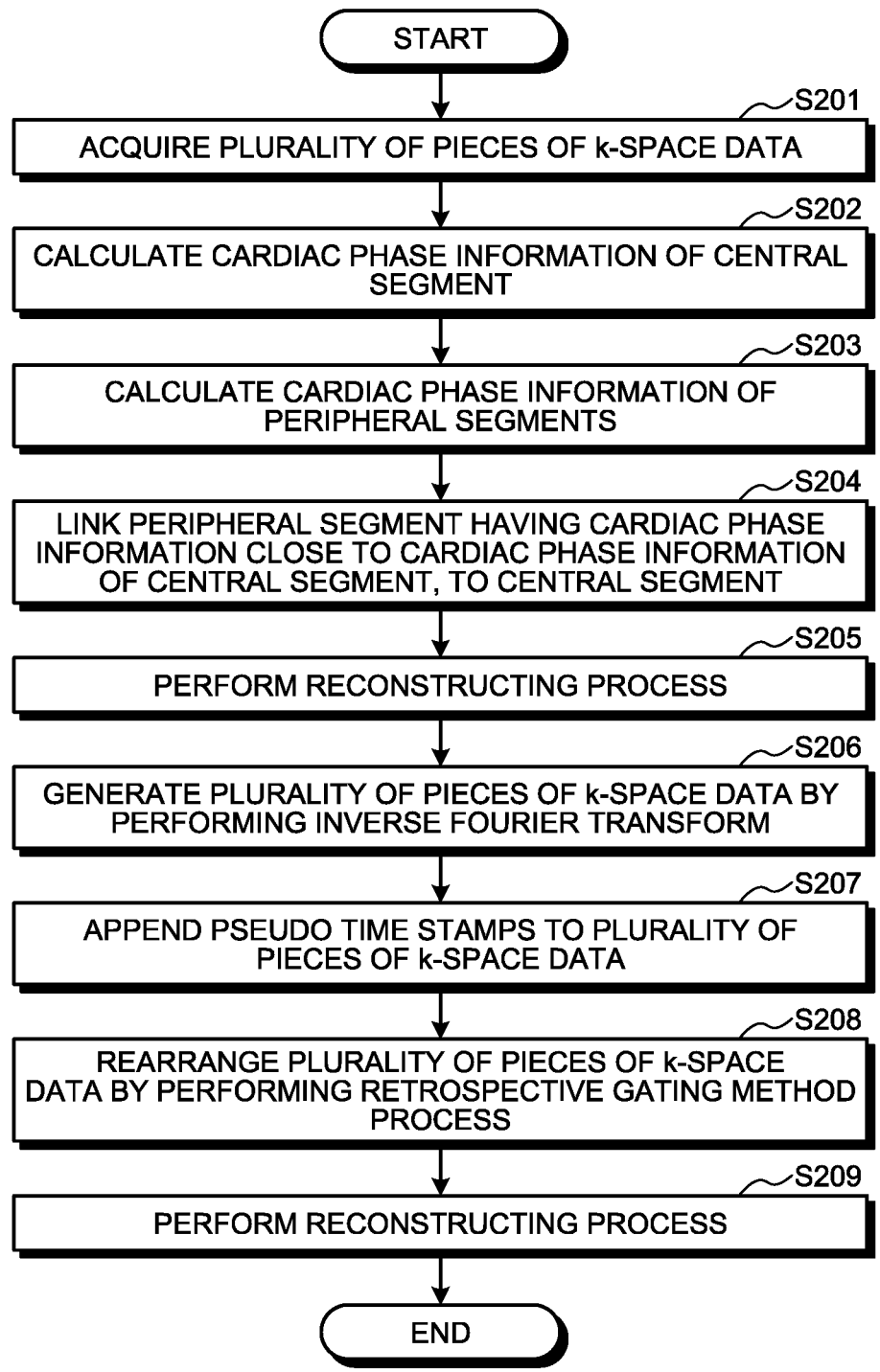
FIG. 16 is a flowchart illustrating a processing procedure performed by an MRI apparatus according to a second embodiment.

A processing procedure performed by the MRI apparatus 100 according to the second embodiment will be explained, with reference to FIG. 16. FIG. 16 is a flowchart illustrating the processing procedure performed by the MRI apparatus 100 according to the second embodiment. For example, the processing procedure illustrated in FIG. 16 is started when being triggered by an image taking process start request input by the operator. The processes at steps S201 through S205 in FIG. 16 are the same as the processes at steps S101 through S105 in FIG. 3, and the explanations thereof will therefore be omitted.

At step S206, the selecting function 123e generates a plurality of pieces of k-space data by performing an inverse Fourier transform. In other words, the selecting function 123e generates the plurality of pieces of k-space data corresponding to a full sampling process, by performing the inverse Fourier transform on reconstructed images corresponding to a plurality of temporal phases.

Figure 17:
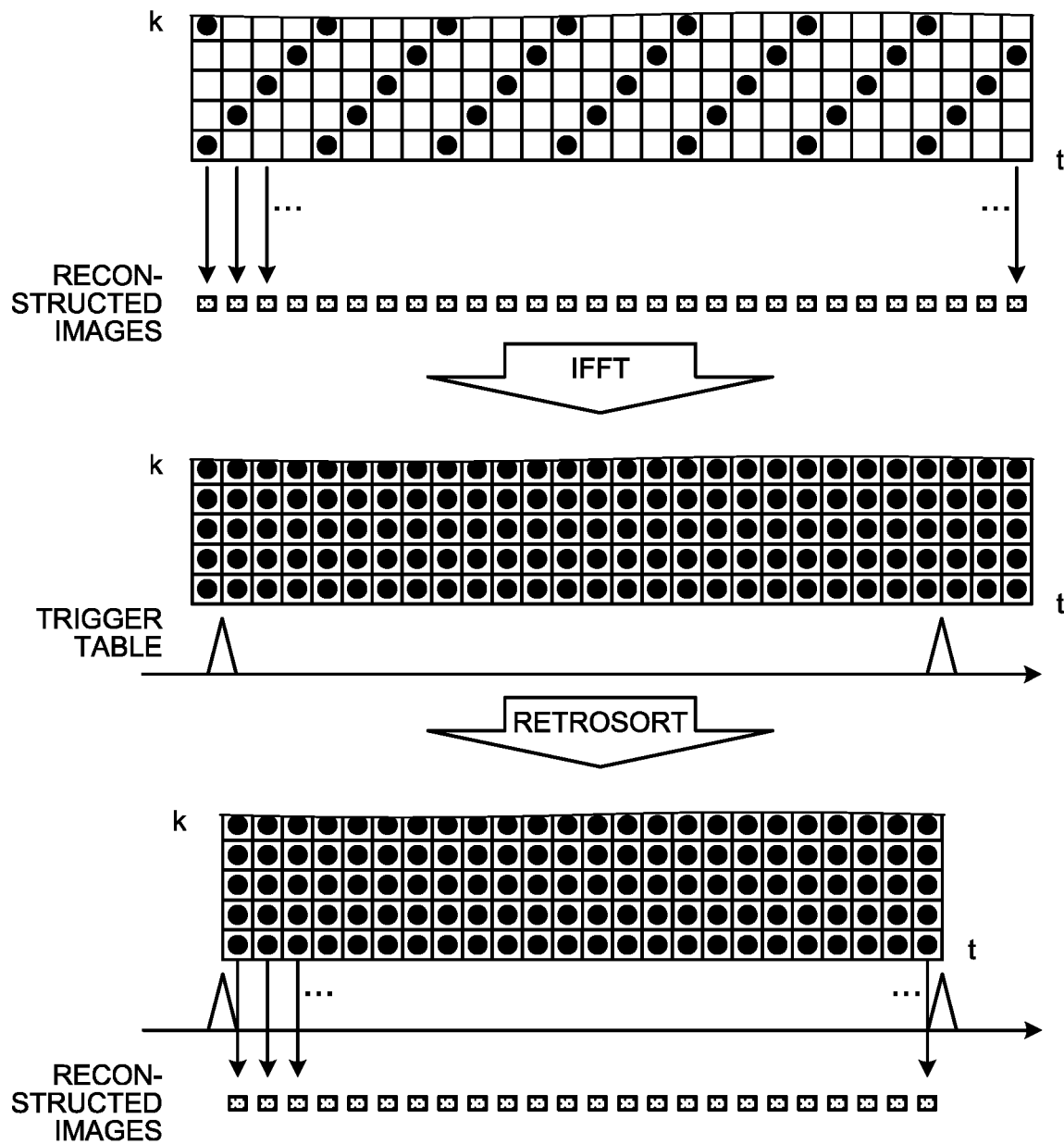
FIG. 17 is a drawing for explaining a process performed by a selecting function according to the second embodiment.

The process performed by the selecting function 123e according to the second embodiment will be explained, with reference to FIG. 17. FIG. 17 is a drawing for explaining the process performed by the selecting function 123e according to the second embodiment. The top section of FIG. 17 illustrates linked data (k-t space data) corresponding to 28 temporal phases that was generated by the linking function 123c. Further, in FIG. 17, 28 reconstructed images are generated as a result of a reconstructing process performed on the linked data corresponding to the 28 temporal phases. FIG. 17 illustrates a part of the k-t space data for the sake of convenience in the illustration.

As illustrated in FIG. 17, the selecting function 123e generates a plurality of pieces of k-space data corresponding to a full sampling process performed on the k-t space having the 28 temporal phases (the middle section of FIG. 17), by performing an inverse Fourier transform (an IFFT) on the 28 reconstructed images.

At step S207, the selecting function 123e appends pseudo time stamps to the plurality of pieces of k-space data. In other words, the selecting function 123e appends a pseudo k-space data acquisition time to each of the plurality of pieces of k-space data corresponding to the full sampling process.

For example, among the plurality of pieces of k-space data corresponding to the full sampling process illustrated in the middle section of FIG. 17, the selecting function 123e assigns, to each of the pieces of k-space data that have been acquired in the k-t space illustrated in the top section of FIG. 17, the acquisition time thereof. In the top section of FIG. 17, pieces of k-space data have already been acquired in the 1st and the 5th lines from the bottom in the temporal phase TB1. Accordingly, the selecting function 123e assigns the acquisition time of the pieces of k-space data in the 1st and the 5th lines to the pieces of k-space data in the corresponding sampling position in the middle section of FIG. 17. Further, with respect to the pieces of k-space data in the 2nd, the 3rd, and the 4th lines from the bottom, the selecting function 123e calculates the acquisition times thereof on the basis of the acquisition time of the pieces of k-space data in the 1st and the 5th lines. For example, the selecting function 123e calculates pseudo acquisition times (the time stamps) of the pieces of k-space data in the 2nd, the 3rd, and the 4th lines, so as to equally divide the time period between the 1st line and the 5th line. In this manner, the selecting function 123e calculates the pseudo acquisition times and appends the calculated pseudo acquisition times to the pieces of k-space data. In other words, the selecting function 123e generates the pseudo acquisition time of each of the plurality of pieces of k-space data corresponding to the full sampling process, on the basis of the acquisition times of the pieces of k-space data acquired by performing the non-simple undersampling process. In this situation, the plurality of pieces of k-space data corresponding to the full sampling process are the pieces of data supplemented with such pieces of k-space data that correspond to the certain pieces of k-space data undersampled by the non-simple undersampling process.

At step S208, the selecting function 123e rearranges the plurality of pieces of k-space data by implementing the retrospective gating method. In other words, the selecting function 123e selects pieces of k-space data corresponding to a plurality of cardiac phases set in advance, on the basis of the pseudo acquisition times of the pieces of k-space data. In other words, the selecting function 123e performs the rearranging process on the plurality of pieces of k-space data corresponding to the full sampling process, on the basis of the pseudo acquisition times and pieces of biological signal information.

For example, in the k-t space in the middle section of FIG. 17, pieces of k-space data in the 28 temporal phases are arranged. Accordingly, the selecting function 123e selects pieces of k-space data corresponding to the 24 phases (P1 to P24) set in advance. As a result, the selecting function 123e generates pieces of k-t space data of which the phases in the temporal phase direction have been transformed into 24 phases (the bottom section of FIG. 17).

At step S209, the reconstructing function 123d performs a reconstructing process. For example, the reconstructing function 123d generates reconstructed image each of which corresponds to a different one of a plurality of cardiac phases, by reconstructing the pieces of k-space data each corresponding to a different one of the plurality of cardiac phases. In the example illustrated in FIG. 17, the reconstructing function 123d reconstructs 24 MR images from the pieces of k-t space data of which the phases in the temporal phase direction have been transformed into 24 phases. In other words, the reconstructing function 123d generates the plurality of reconstructed images, by performing the reconstructing process on the plurality of pieces of k-space data resulting from the rearranging process.

As explained above, the MRI apparatus 100 according to the second embodiment is configured to generate the plurality of pieces of k-space data corresponding to the full sampling process, by performing the inverse Fourier transform on the reconstructed images in the 28 temporal phases. Further, the MRI apparatus 100 is configured to append the pseudo time stamps to the plurality of pieces of k-space data corresponding to the full sampling process and to perform the retroactive rearranging process (by implementing the retrospective gating method) in units of the lines. Further, the MRI apparatus 100 is configured to generate the plurality of pieces of k-space data corresponding to the desired cardiac phases. Further, the MRI apparatus 100 is configured to generate the plurality of reconstructed images corresponding to the desired cardiac phases by reconstructing the generated pieces of k-space data. With these arrangements, the MRI apparatus 100 is able to generate the reconstructed images in a time series having higher image quality.

A Modification Example of Second Embodiment

In the second embodiment, the example is explained in which, at the time of generating the pieces of k-space data corresponding to the full sampling process, the data is at first transformed (reconstructed) into the MR images (the reconstructed images) as an intermediate data. However, possible embodiments are not limited to this example. In other words, the MRI apparatus 100 is able to generate pieces of k-space data corresponding to a full sampling process, without necessarily having to transforming the data in to the MR images.

For example, the reconstructing function 123*d* performs a reconstructing process corresponding to the k-t SENSE method on the linked data corresponding to the plurality of temporal phases that was generated by the linking function 123*c*. In this process, the reconstructing function 123*d* generates the x-f space data from which the aliasing signals have been eliminated, as explained above. The x-f space data is the intermediate data prior to being transformed into image data (real-space data).

In this situation, the reconstructing function 123*d* according to a modification example of the second embodiment performs a process including a Fourier transform (an inverse Fourier transform) on the x-f space data. As a result, the reconstructing function 123*d* is able to generate pieces of k-space data corresponding to a full sampling process from the linked data corresponding to the plurality of temporal phases that was generated by the linking function 123*c*. In other words, the reconstructing function 123*d* is configured to generate the plurality of pieces of k-space data corresponding to the full sampling process from the plurality of pieces of k-space data undersampled by using the predetermined sampling patterns, by performing the process including the Fourier transform corresponding to the non-simple undersampling process.

In this situation, in place of the processes at steps S205 and S206, the reconstructing function 123*d* performs the process of generating the plurality of pieces of k-space data corresponding to the full sampling process as described above. Because the processes at step S207 and thereafter are the same as those explained with reference to FIG. 16, the explanations thereof will be omitted.

The k-space data generated through a process including Fourier transform is not necessarily required to be filled with all of the plurality of pieces of k-space data corresponding to the full-sampling process. For example, at least a sampling pattern that ensures k-t reconstruction is required to be reproduced. In one example, the k-space data generated through a process including Fourier transform can be a plurality of pieces of k-space data corresponding to a simple undersampling process. In other words, the reconstructing function 123*d* generate a plurality of pieces of second k-space data by inverse transforming an intermediate data which is generated by transforming the plurality of pieces of first k-space data, the pieces of second k-space data is a data that at least part of the undersampled point is filled.

Third Embodiment

In the embodiments described above, the example is explained in which the data is divided into the segments. However, possible embodiments are not limited to this example. For instance, when the process of dividing the data into the segments is not performed, it is possible to perform processes described below.

Figure 18:
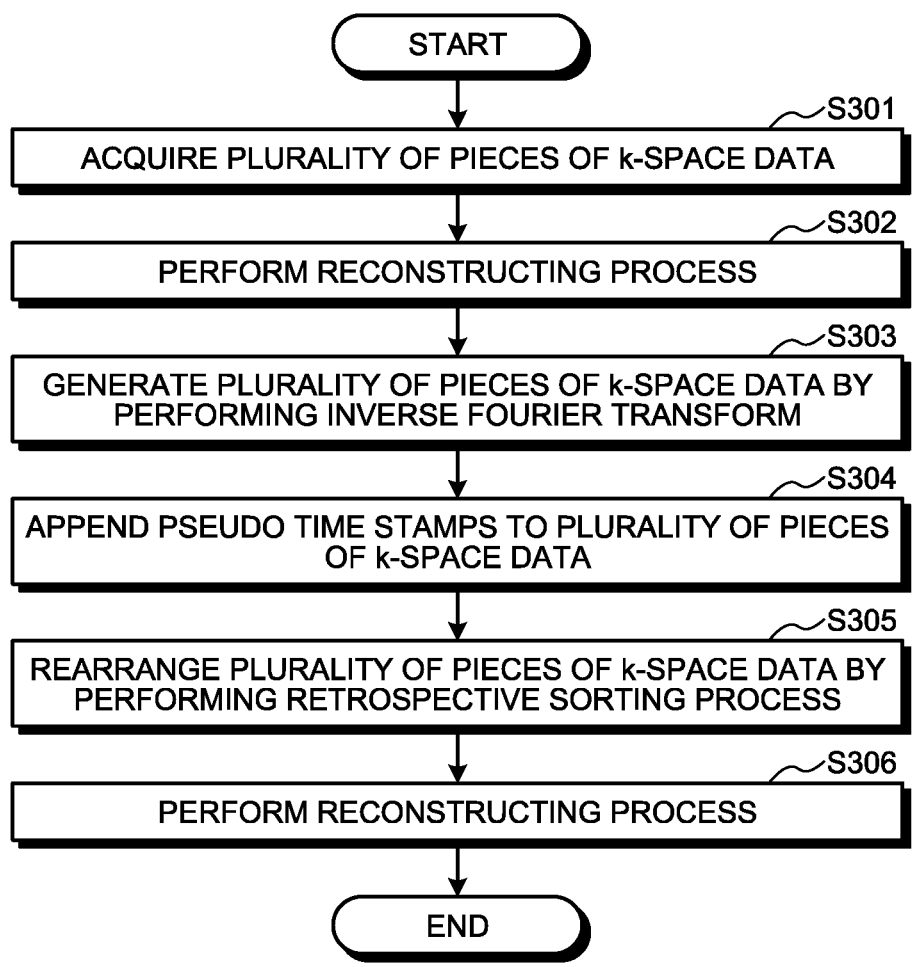
FIG. 18 is a flowchart illustrating a processing procedure performed by an MRI apparatus according to a third embodiment.

A processing procedure performed by the MRI apparatus 100 according to a third embodiment will be explained, with reference to FIG. 18. FIG. 18 is a flowchart illustrating a processing procedure performed by the MRI apparatus 100 according to the third embodiment. For example, the processing procedure illustrated in FIG. 18 is started when being triggered by an image taking process start request input by the operator.

At step S301, the obtaining function 123*a* acquires a plurality of pieces of k-space data. This process is basically the same as the process at step S101 in FIG. 3, except that the process of dividing the data into the segments is not performed. In other words, the obtaining function 123*a* according to the third embodiment acquires the plurality of pieces of k-space data corresponding to sampling patterns defined by the k-t SENSE method, without dividing the pieces of data into segments. At this point in time, pieces of k-t space data that are the same as the pieces of k-t space data (the linked data) illustrated in FIG. 11 are obtained.

At step S302, the reconstructing function 123*d* performs a reconstructing process. This process is basically the same as the process at step S105 in FIG. 3. In other words, the reconstructing function 123*d* generates MR images corresponding to a plurality of phases by performing the reconstructing process corresponding to the k-t SENSE method on the plurality of pieces of k-space data obtained by the obtaining function 123*a* at step S301.

At step S303, the reconstructing function 123*d* generates a plurality of pieces of k-space data by performing an inverse Fourier transform. This process is basically the same as the process at step S206 in FIG. 16. In other words, the selecting function 123*e* generates the plurality of pieces of k-space data corresponding to a full sampling process by performing the inverse Fourier transform on the reconstructed images corresponding to the plurality of temporal phases.

At step S304, the selecting function 123*e* appends pseudo time stamps to the plurality of pieces of k-space data. This process is basically the same as the process at step S207 in FIG. 16. In other words, to each of the plurality of pieces of k-space data corresponding to the full sampling process, the selecting function 123*e* appends a pseudo acquisition time of the piece of k-space data.

At step S305, the selecting function 123*e* rearranges the plurality of pieces of k-space data by implementing the retrospective gating method. This process is basically the same as the process at step S208 in FIG. 16. In other words, the selecting function 123*e* selects a piece of k-space data corresponding to each of the plurality of cardiac phases set in advance, on the basis of the pseudo acquisition times of the pieces of k-space data.

At step S306, the reconstructing function 123*d* performs a reconstructing process. This process is basically the same as the process at step S209 in FIG. 16. In other words, the reconstructing function 123*d* generates a reconstructed image corresponding to a different one of the plurality of cardiac phases, by performing the reconstructing process on the pieces of k-space data each of which corresponds to a different one of the plurality of cardiac phases.

The processing procedure illustrated in FIG. 18 is merely an example, and possible embodiments are not limited to this example. For instance, as for the processing procedure illustrated in FIG. 18, the processing order may be modified as appropriate as long as no conflict occurs in the processing.

To summarize, in the MRI apparatus 100 according to the third embodiment, the obtaining function 123*a* is configured to obtain the plurality of pieces of k-space data acquired from the patient by performing the non-simple undersampling process, the acquisition times of the pieces of k-space data, and the pieces of biological signal information of the patient in a time series. The reconstructing function 123*d* is configured to generate the plurality of pieces of k-space data corresponding to the full sampling process from the plurality of pieces of first k-space data, by performing the process including the Fourier transform corresponding to the non-simple undersampling process. The selecting function 123*e* is configured to generate the pseudo acquisition time of each of the plurality of pieces of k-space data corresponding to the full sampling process, on the basis of the acquisition times. The selecting function 123*e* is configured to perform the rearranging process on the plurality of pieces of k-space data corresponding to the full sampling process, on the basis of the pseudo acquisition times and the pieces of biological signal information. The reconstructing function 123*d* is configured to generate the plurality of reconstructed images, by performing the reconstructing process on the plurality of pieces of k-space data resulting from the rearranging process. With these arrangements, the MRI apparatus 100 is able to properly perform the image taking processes on the image taking target having motion. For example, the MRI apparatus 100 is able to perform the image taking processes having a high spatial resolution and a high temporal resolution on a site (the heart) having periodic motion.

Fourth Embodiment

In the first embodiment, the example is explained in which, when the data is divided into the segments, the final reconstructed images are generated by linking, in units of groups, the pieces of k-space data in the peripheral segments each having a close cardiac phase, to the pieces of k-space data in the central segment; however, possible embodiments are not limited to this example. For instance, the MRI apparatus 100 is also able to generate final reconstructed images by generating calibration data used for arranging the pieces of k-space data in a peripheral segment to correspond to a full sampling process, from the pieces of k-space data in the central segment.

Figure 19:
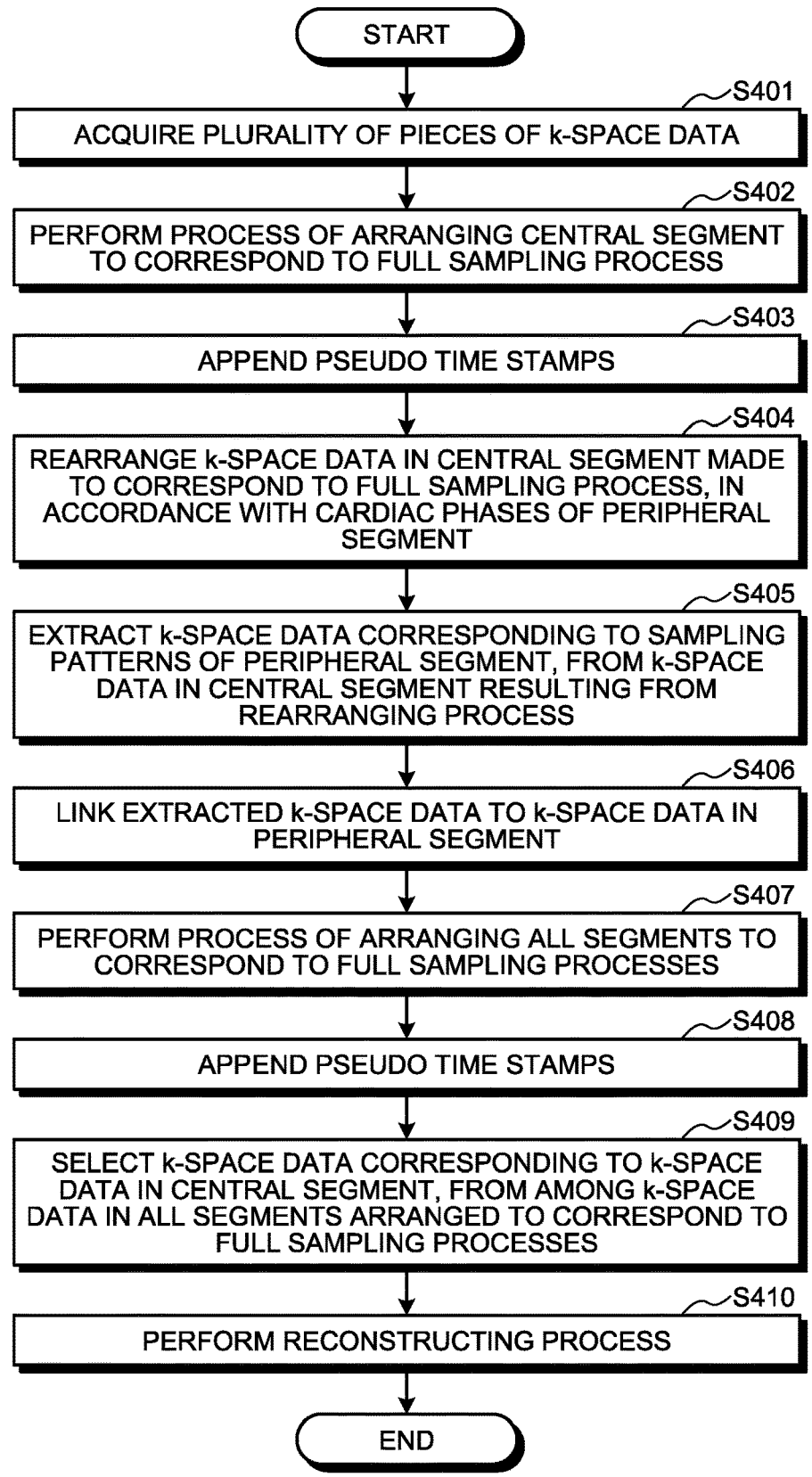
FIG. 19 is a flowchart illustrating a processing procedure performed by an MRI apparatus according to a fourth embodiment.

A processing procedure performed by the MRI apparatus 100 according to a fourth embodiment will be explained, with reference to FIG. 19. FIG. 19 is a flowchart illustrating the processing procedure performed by the MRI apparatus 100 according to the fourth embodiment. For example, the processing procedure illustrated in FIG. 19 is started when being triggered by an image taking process start request input by the operator.

FIG. 19 will be explained with reference to FIGS. 20 to 26. FIGS. 20 to 26 are drawings for explaining processes performed by the MRI apparatus 100 according to the fourth embodiment. In FIGS. 20 to 26, the trigger table corresponds to the time direction of the pieces of k-t space data. The explanation using FIGS. 19 to 26 is merely an example, and possible embodiments are not limited to this example.

At step S401, the obtaining function 123*a* acquires a plurality of pieces of k-space data. In other words, the obtaining function 123*a* obtains the plurality of pieces of k-space data acquired while being divided into a plurality of segments including the central segment corresponding to the center of the k-space and a peripheral segment different from the central segment.

Figure 20:
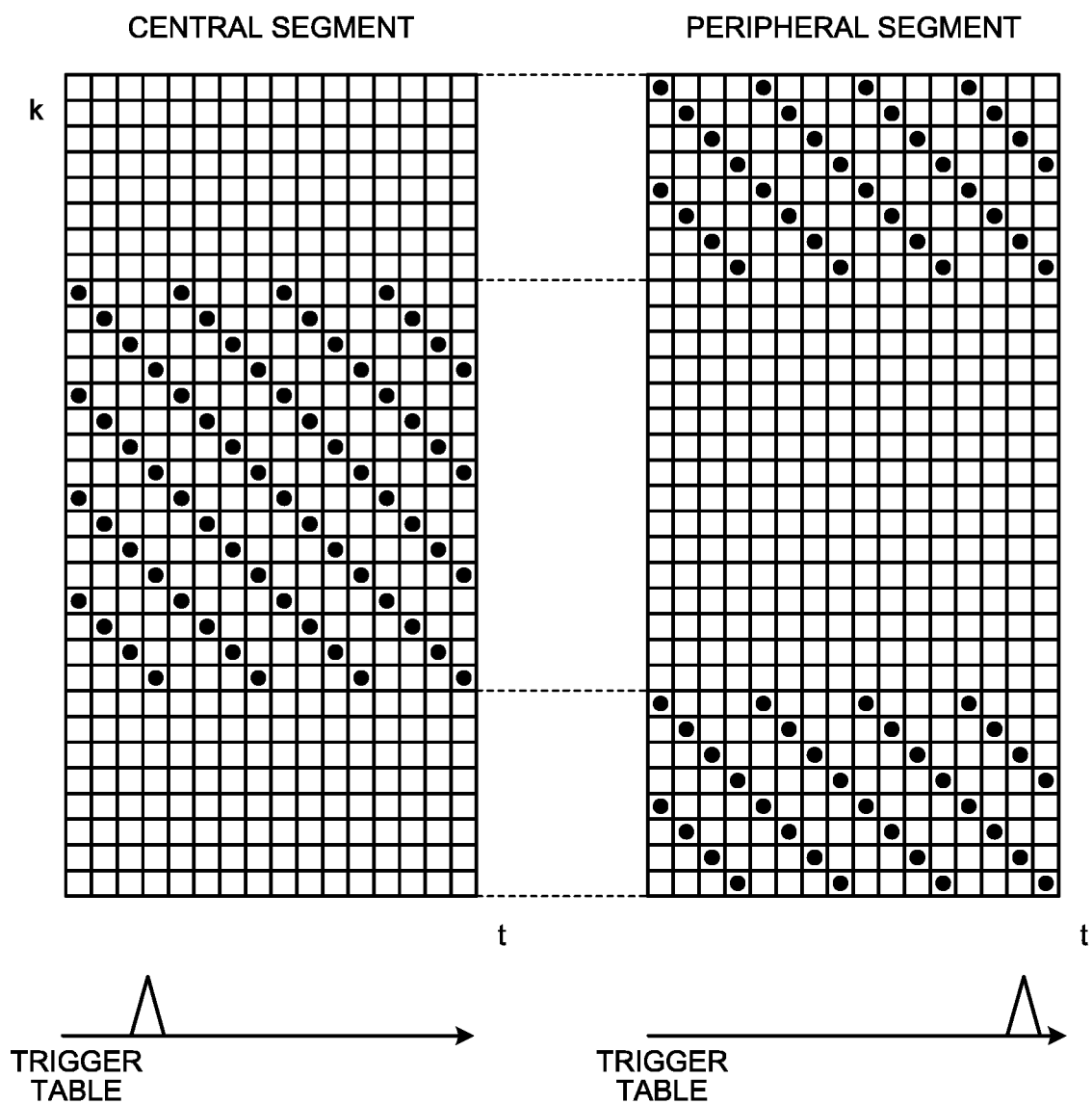
FIG. 20 is a drawing for explaining a process performed by the MRI apparatus according to the fourth embodiment.

For example, as illustrated in FIG. 20, the obtaining function 123*a* acquires the plurality of pieces of k-space data by dividing the data into two segments, namely, the central segment and the peripheral segment. In this situation, for example, when the number of images to be obtained set by the operator is "13", the pieces of k-space data corresponding to 16 temporal phases are acquired to satisfy approximately 120% of the designated number of images to be obtained. Further, because the central segment and the peripheral segment are acquired with mutually-different timing, trigger signals are detected with mutually-different timing.

FIG. 20 illustrates the example in which the pieces of k-space data are acquired as being divided into the two segments; however, it is also possible to acquire the pieces of k-space data as being divided into three or more segments.

At step S402, the reconstructing function 123*d* performs a process of arranging the central segment to correspond to a full sampling process. In other words, the reconstructing function 123*d* generates a plurality of pieces of k-space data corresponding to the full sampling process of the central segment, from the plurality of pieces of k-space data contained in the central segment, by performing a process including a Fourier transform corresponding to the non-simple undersampling process.

Figure 21:
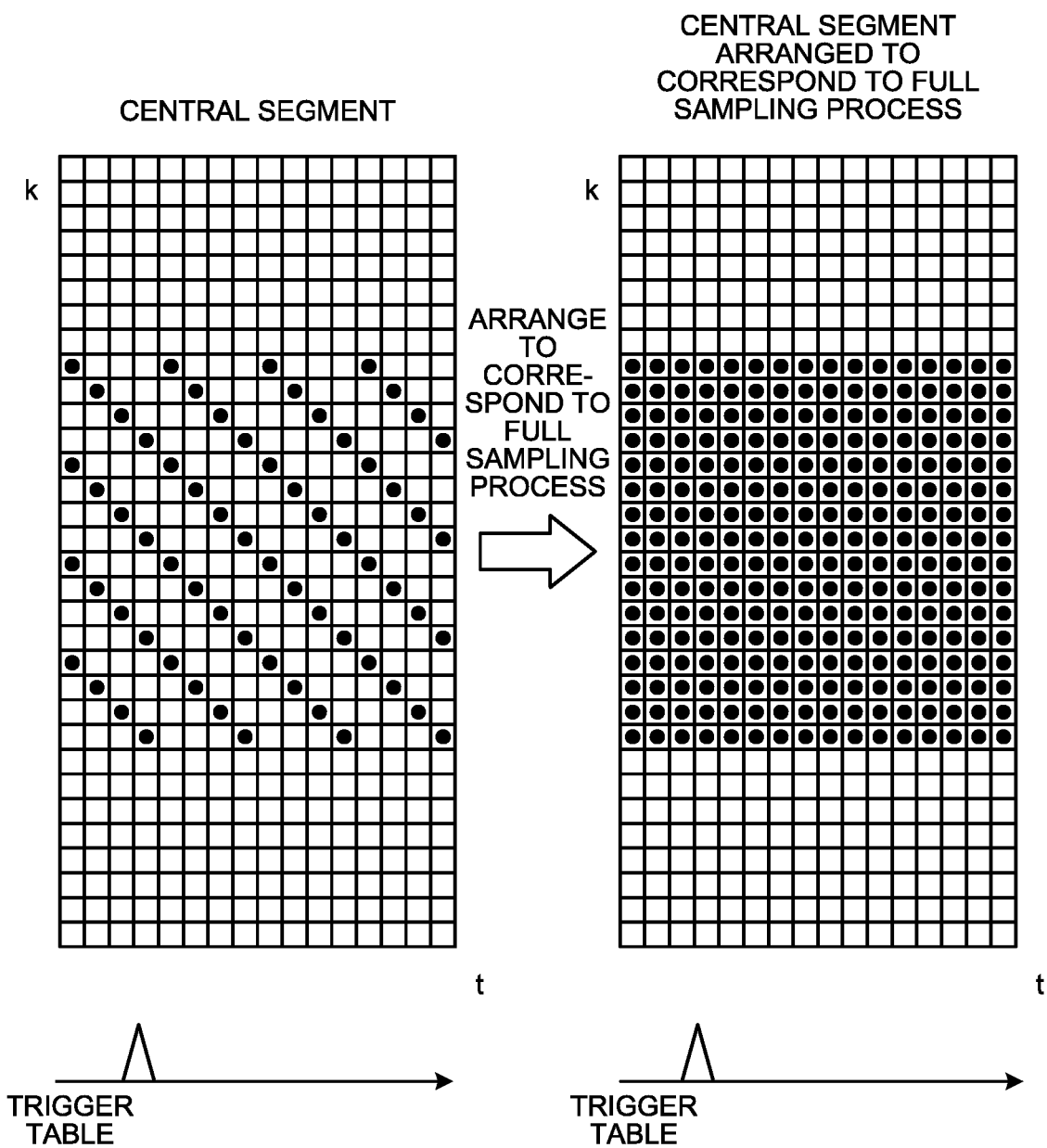
FIG. 21 is another drawing for explaining the process performed by the MRI apparatus according to the fourth embodiment.

For example, as illustrated in FIG. 21, the reconstructing function 123*d* generates the plurality of pieces of k-space data corresponding to the full sampling process, from the plurality of pieces of k-space data contained in the central segment. These processes are almost the same as the processes at steps S205 and S206 in FIG. 16, except that the processing target is the plurality of pieces of k-space data contained in the central segment.

At step S403, the selecting function 123*e* appends pseudo time stamps. This process is almost the same as the process at step S207 in FIG. 16, except that the processing target is the plurality of pieces of k-space data contained in the central segment.

At step S404, the selecting function 123*e* rearranges the pieces of k-space data in the central segment made to correspond to the full sampling process, to be aligned with the cardiac phases of the peripheral segment. In other words, the selecting function 123*e* rearranges the plurality of pieces of k-space data corresponding to the full sampling process, in accordance with the cardiac phases of the peripheral segment.

Figure 22:
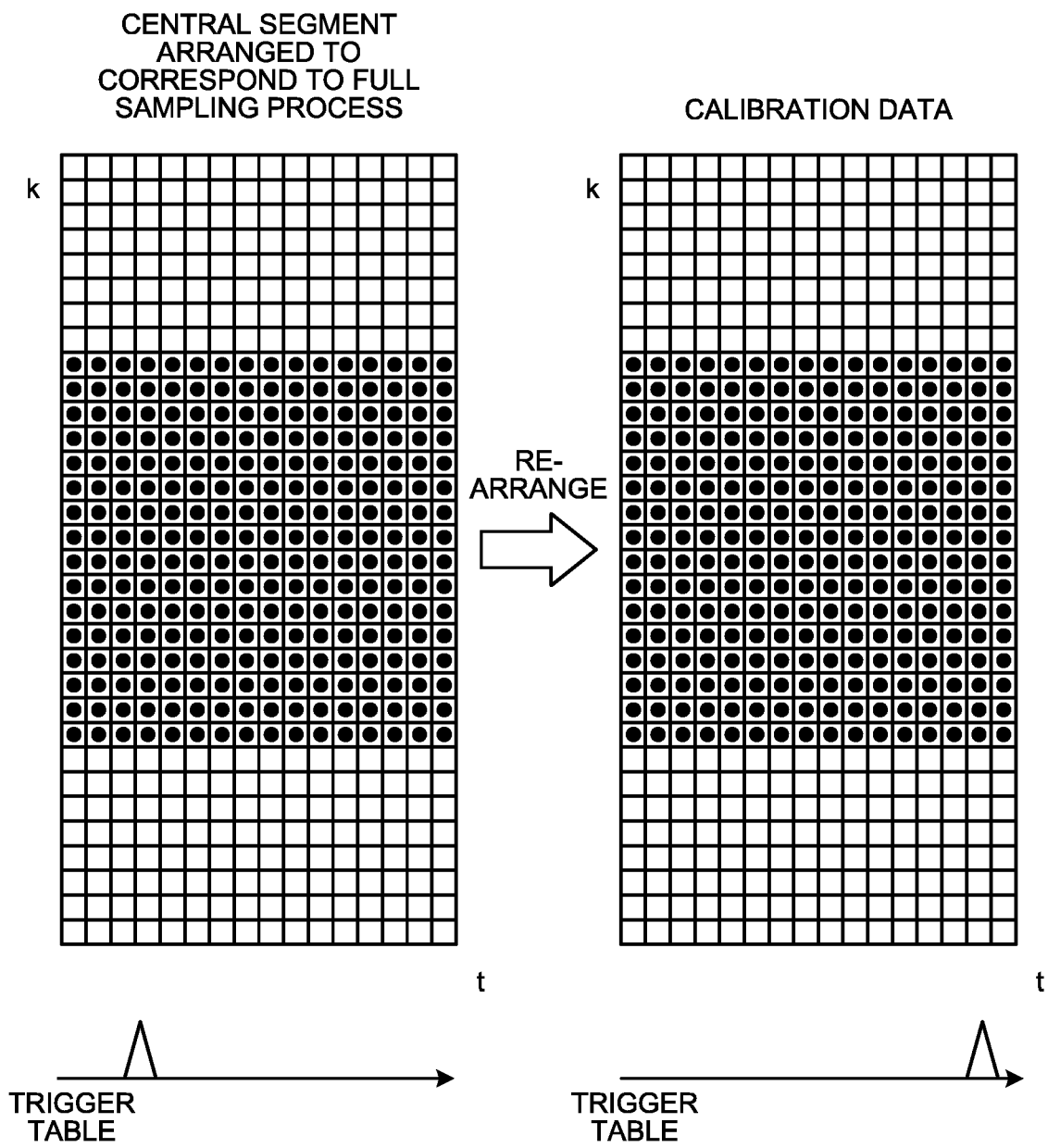
FIG. 22 is yet another drawing for explaining the process performed by the MRI apparatus according to the fourth embodiment.

For example, among the pieces of k-space data in the 4 lines included in the temporal phases of the peripheral segment illustrated in FIG. 20, the selecting function 123*e* calculates the cardiac phase information of a piece of k-space data that is temporally positioned substantially at the center. Further, from among the plurality of pieces of k-space data contained in the central segment arranged to correspond to the full sampling process, the selecting function 123*e* selects pieces of k-space data that each have an equal phase-encoding amount and have the cardiac phase information closest to the calculated cardiac phase information. As a result, the selecting function 123*e* generates calibration data by rearranging the plurality of pieces of k-space data corresponding to the full sampling process, as illustrated in FIG. 22. The trigger detection timing of the calibration data (the right section of FIG. 22) substantially matches the trigger detection timing (the right section of FIG. 20) of the k-t space data in the peripheral segment. In other words, the calibration data is k-t space data obtained by rearranging the plurality of pieces of k-space data corresponding to the full sampling process of the central segment so as to have the trigger detection timing that is substantially the same as the trigger detection timing of the peripheral segment.

At step S405, the selecting function 123*e* extracts pieces of k-space data corresponding to the sampling patterns of the peripheral segment, from the pieces of k-space in the central segment resulting from the rearranging process.

Figure 23:
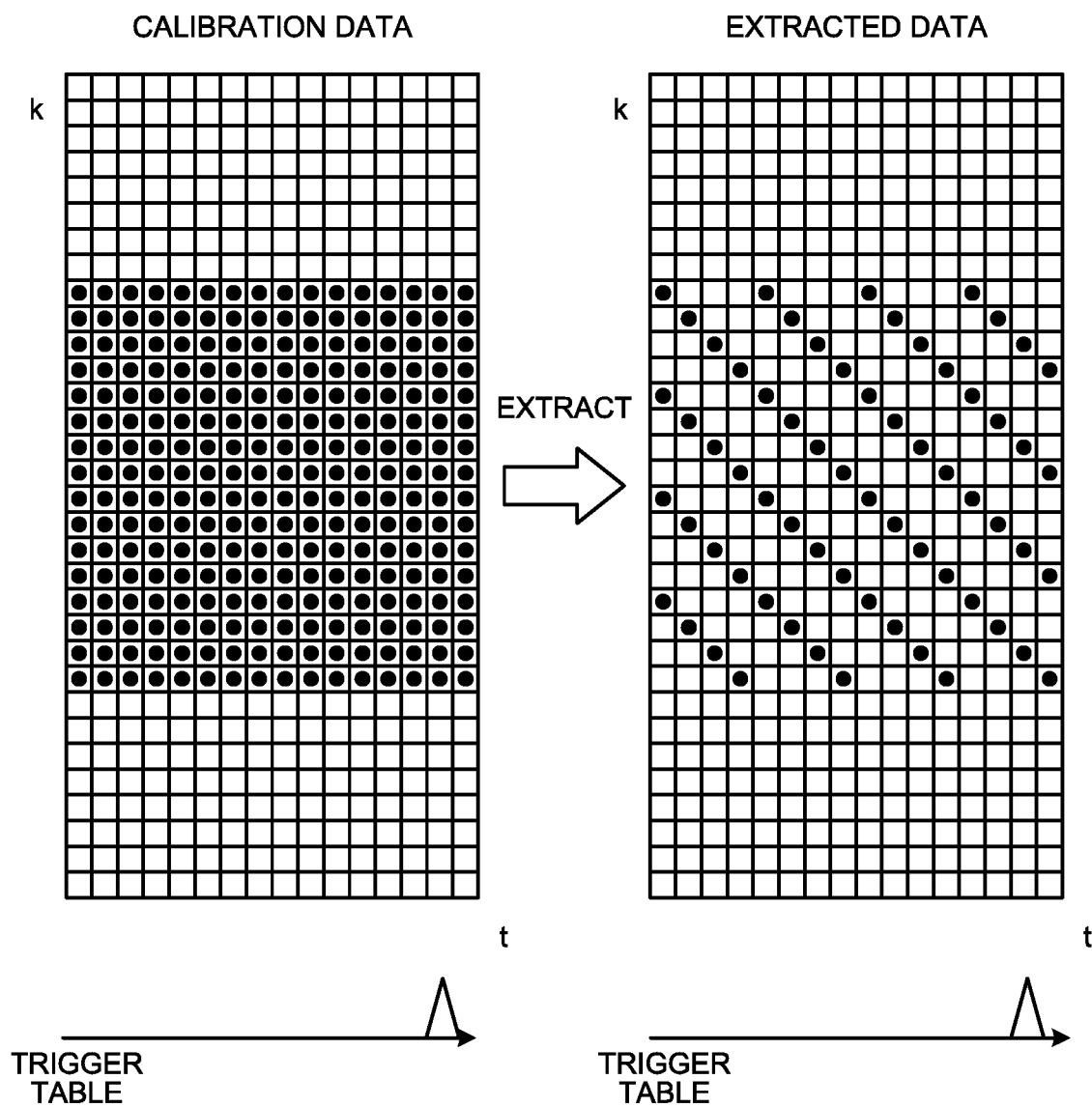
FIG. 23 is yet another drawing for explaining the process performed by the MRI apparatus according to the fourth embodiment.

For example, as illustrated in FIG. 23, the selecting function 123*e* generates extracted data by extracting the pieces of k-space data corresponding to the sampling patterns of the peripheral segment, from the calibration data. In other words, the extracted data is represented by pieces of k-t space data obtained by undersampling the pieces of k-space data in the calibration data, so as to have the same sampling patterns as the sampling patterns of the peripheral segment. In this manner, the selecting function 123*e* extracts the plurality of pieces of k-space data corresponding to the sampling patterns of the plurality of pieces of k-space data contained in the peripheral segment, from the plurality of pieces of k-space data resulting from the rearranging process.

At step S406, the linking function 123c links the extracted pieces of k-space data to the pieces of k-space data in the peripheral segment.

Figure 24:
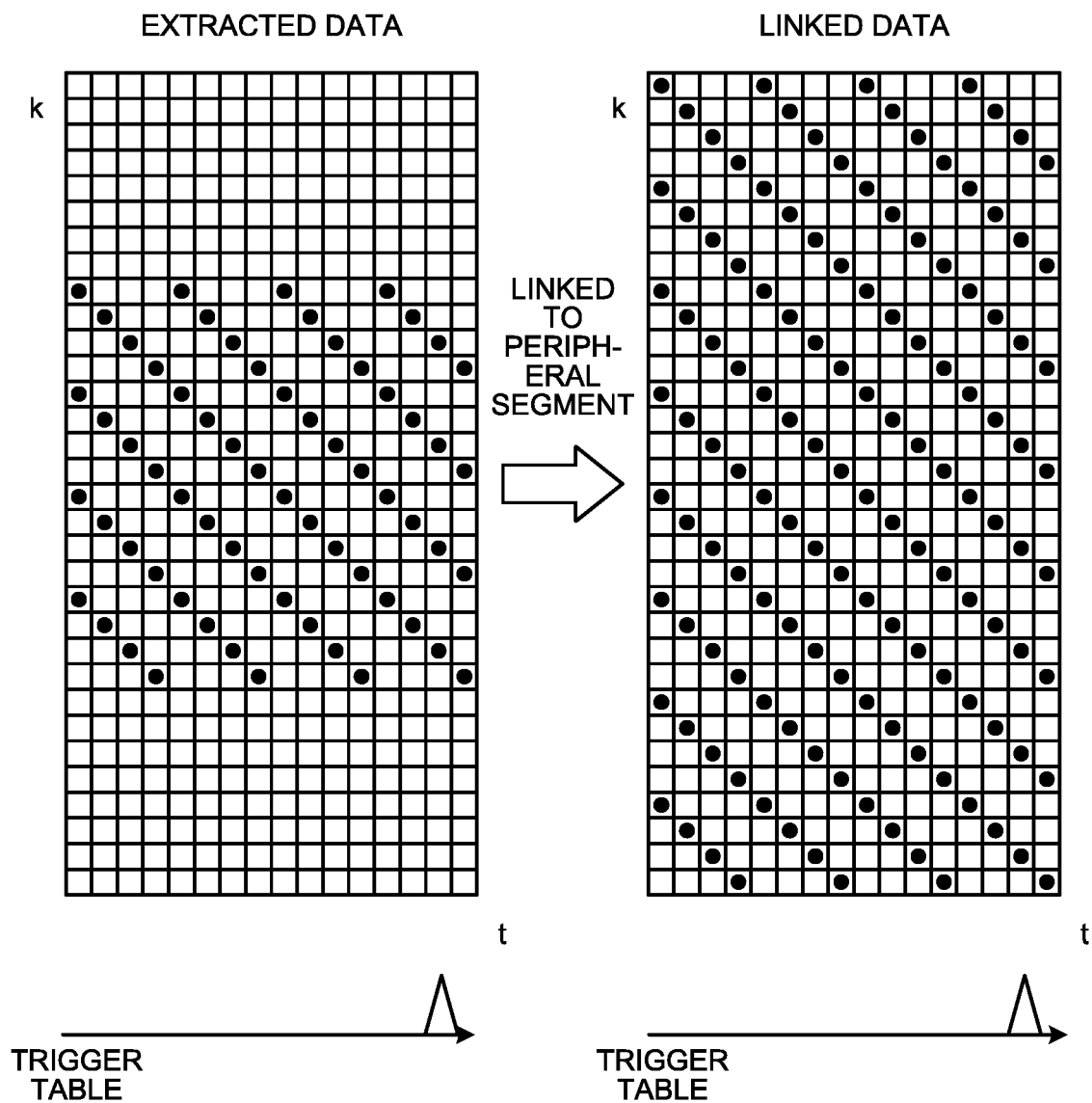
FIG. 24 is yet another drawing for explaining the process performed by the MRI apparatus according to the fourth embodiment.

For example, as illustrated in FIG. 24, the linking function 123c generates linked data by linking the extracted pieces of data to the pieces of k-t space data in the peripheral segment illustrated in the right section of FIG. 20.

In this situation, because the trigger detection timing of the extracted data is substantially the same as the trigger detection timing of the peripheral segment, it is possible to link the pieces of k-space data corresponding to the temporal phases to each other.

At step S407, the reconstructing function 123d performs a process of arranging all the segments to each correspond to a full sampling process. In other words, the reconstructing function 123d generates the plurality of pieces of k-space data corresponding to the full sampling processes, by performing the process including a Fourier transform corresponding to the non-simple undersampling process, on the extracted plurality of pieces of k-space data and the plurality of pieces of k-space data contained in the peripheral segment.

Figure 25:
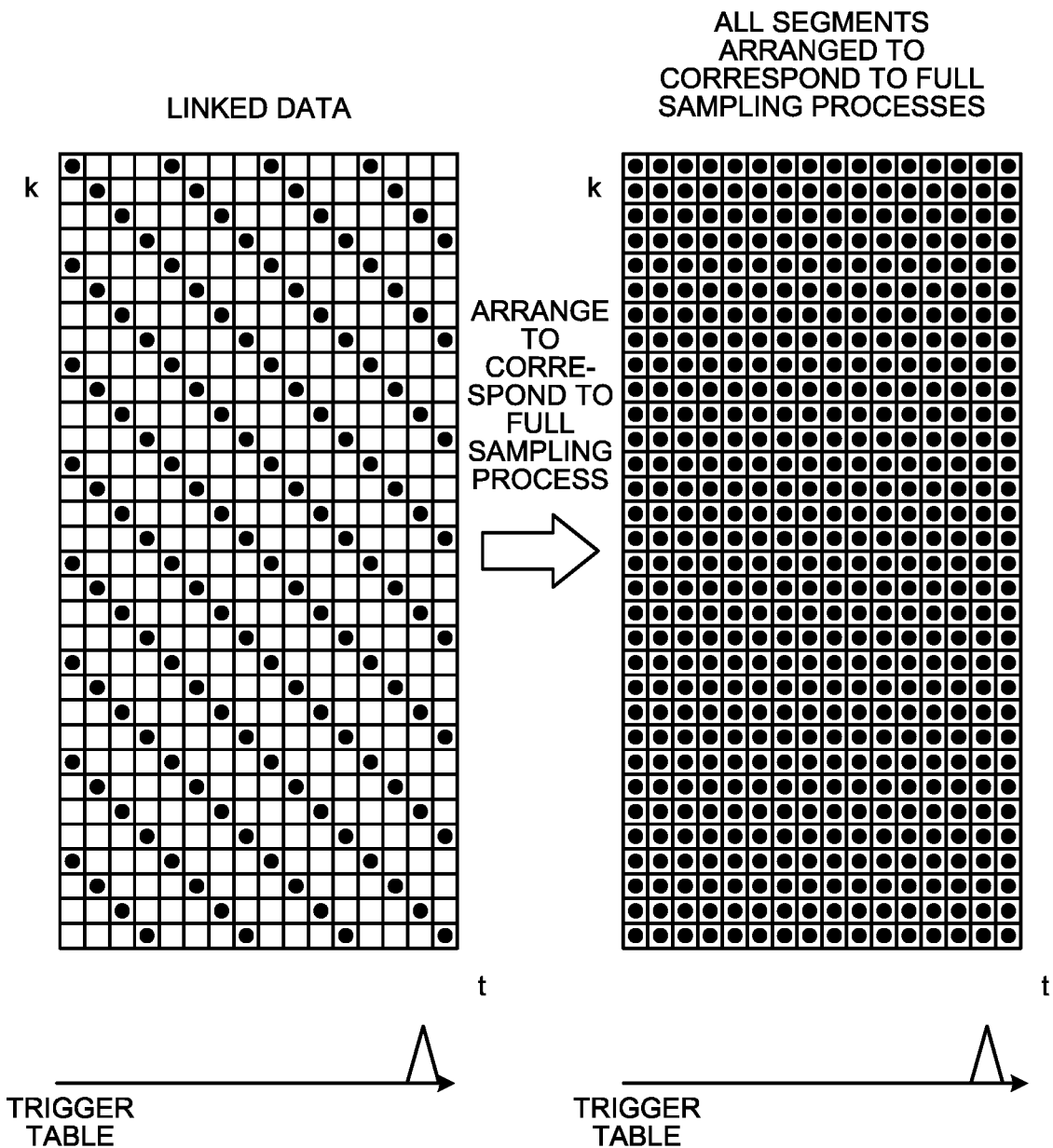
FIG. 25 is yet another drawing for explaining the process performed by the MRI apparatus according to the fourth embodiment.

For example, as illustrated in FIG. 25, the reconstructing function 123d generates the plurality of pieces of k-space data corresponding to the full sampling process, from the linked data. These processes are the same as the processes at steps S205 and S206 in FIG. 16. In this manner, by using the calibration data, the reconstructing function 123d is able to arrange the pieces of k-space data in the peripheral segment to correspond to the full sampling process.

At step S408, the selecting function 123e appends pseudo time stamps. This process is the same as the process at step S207 in FIG. 16.

At step S409, the selecting function 123e selects pieces of k-space data corresponding to the pieces of k-space data in the central segment, from among the pieces of k-space data of all the segments arranged to correspond to the full sampling processes.

Figure 26:
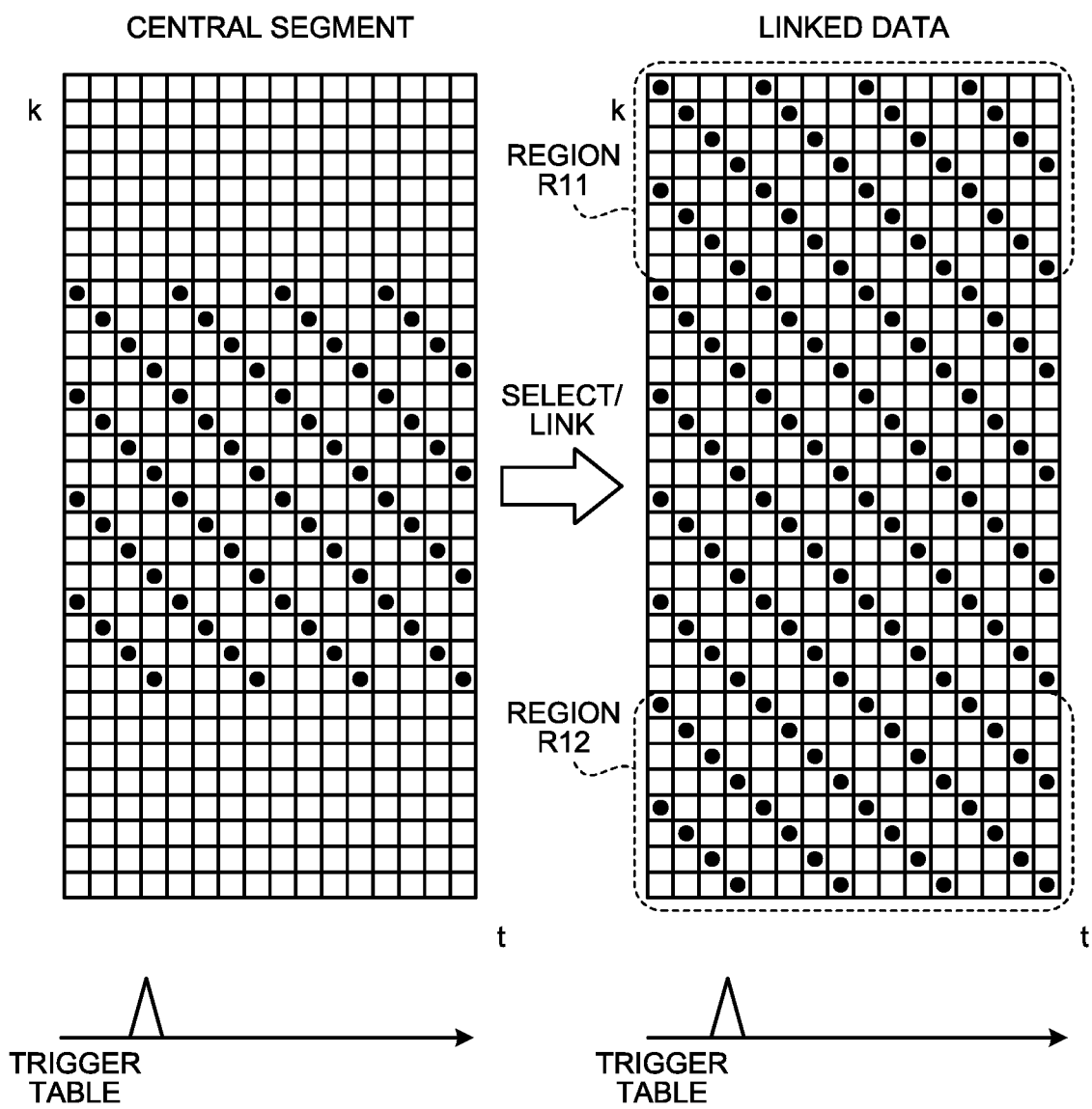
FIG. 26 is yet another drawing for explaining the process performed by the MRI apparatus according to the fourth embodiment.

For example, as illustrated in FIG. 26, the selecting function 123e selects a plurality of pieces of k-space data corresponding to a region R11 and another region R12, from among the plurality of pieces of k-space data contained in all the segments arranged to correspond to the full sampling processes illustrated in the right section of FIG. 25. More specifically, the selecting function 123e calculates the cardiac phase information of a piece of k-space data that is temporally positioned substantially at the center, among the pieces of k-space data in the 4 lines included in the temporal phases of the central segment illustrated in FIG. 20. After that, from among the plurality of pieces of k-space data contained in the peripheral segment arranged to correspond to the full sampling process, the selecting function 123e selects pieces of k-space data that each have an equal phase-encoding amount and have the cardiac phase information closest to the calculated cardiac phase information. As a result, as illustrated in the right section of FIG. 26, the selecting function 123e selects the plurality of pieces of k-space data corresponding to the region R11 and the region R12. After that, the selecting function 123e generates linked data (second linked data) illustrated in the right section of FIG. 26, by linking the selected plurality of pieces of k-space data corresponding to the region R11 and the region R12, to the plurality of pieces of k-space data contained in the central segment illustrated in the left section of FIG. 20. The second linked data is arranged so as to have substantially same trigger detection timing as the trigger detection timing of the central segment.

At step S410, the reconstructing function 123d performs a reconstructing process. For example, the reconstructing function 123d generates MR images corresponding to 16 temporal phases, by performing the reconstructing process corresponding to the non-simple undersampling process, on the second linked data illustrated in the right section of FIG. 26. After that, from among the MR images in the 16 temporal phases generated by the reconstructing function 123d, the selecting function 123e selects MR images corresponding to the number of images to be obtained, i.e., "13", that is set in advance. For example, the reconstructing function 123d calculates cardiac phases that equally divide the time period of one heartbeat into 13 sections and selects the MR images each having cardiac phase information close to a different one of the calculated cardiac phases. These processes are the same as the processes at steps S105 and S106 in FIG. 3.

As described above, the MRI apparatus 100 according to the fourth embodiment is able to generate the final reconstructed images by generating the calibration data used for arranging the pieces of k-space data in the peripheral segment to correspond to the full sampling process, from the pieces of k-space data in the central segment.

The processing procedure illustrated in FIG. 19 is merely an example, and possible embodiments are not limited to this example. For instance, as for the processing procedure illustrated in FIG. 19, the processing order may be modified as appropriate as long as no conflict occurs in the processing. Further, to the process of arranging the k-space data to correspond to the full sampling process described at steps S402 and S407, it is possible to apply the process of arranging the k-space to correspond to the full sampling process without transforming the data into MR images (the process in the modification example of the second embodiment).

Further, the processes at steps S409 and S410 are merely examples, and possible embodiments are not limited to these examples. For instance, at the point in time when the process at step S408 is completed, the plurality of pieces of k-space data corresponding to the full sampling process are obtained with respect to the central segment and to the peripheral segment. Accordingly, without being limited to the processes at steps S409 and S410 described above, the reconstructing function 123d is able to perform a reconstructing process by selecting, as appropriate, arbitrary pieces of k-space data.

Fifth Embodiment

In the embodiment described above, the process is explained in which the pieces of k-space data in the plurality of segments are acquired without implementing electrocardiographic synchronization; however possible embodiments are not limited to this example. For instance, the MRI apparatus 100 is able to acquire pieces of k-space data in a plurality of segments, by implementing electrocardiographic synchronization.

Figure 27:
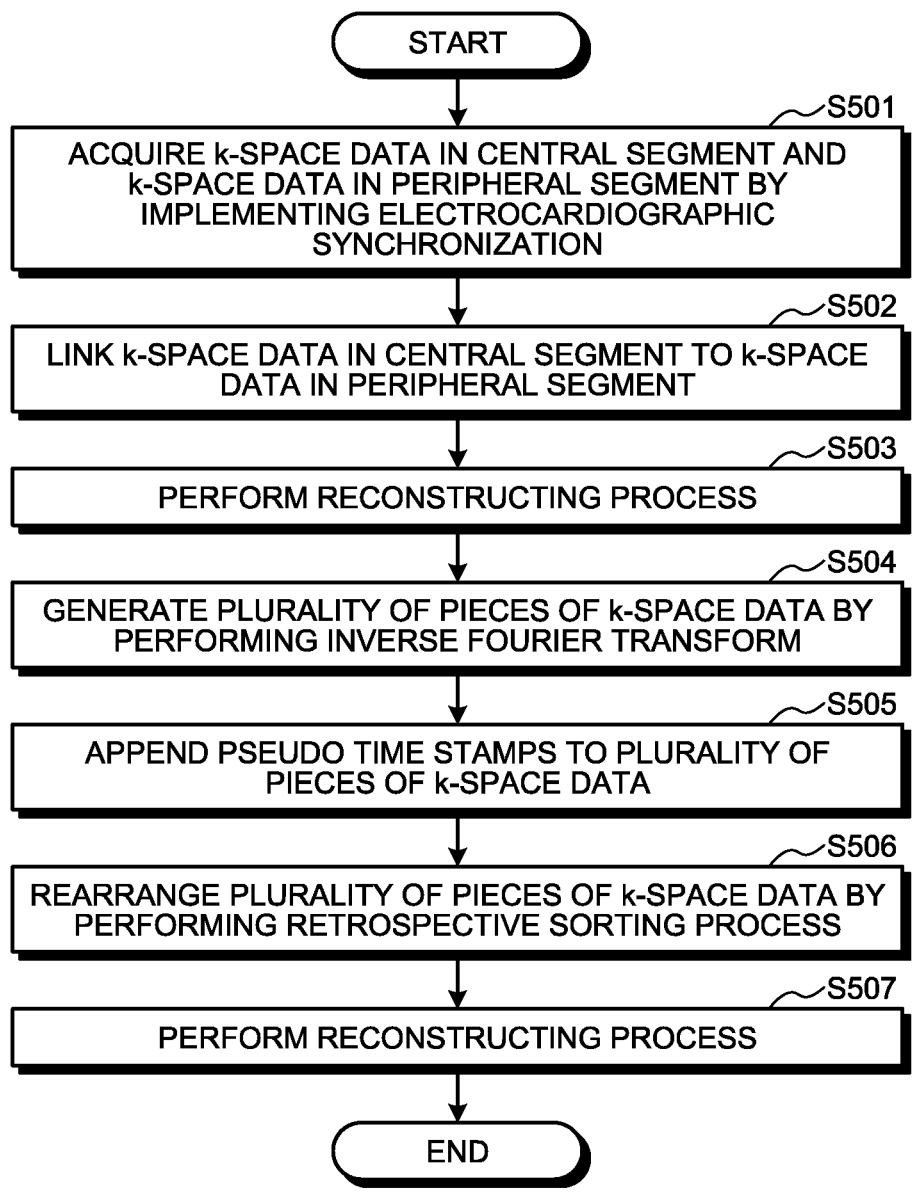
FIG. 27 is a flowchart illustrating a processing procedure performed by an MRI apparatus according to a fifth embodiment.

A processing procedure performed by the MRI apparatus 100 according to a fifth embodiment will be explained with reference to FIG. 27. FIG. 27 is a flowchart illustrating a processing procedure performed by the MRI apparatus 100 according to the fifth embodiment. For example, the processing procedure illustrated in FIG. 27 is started when being triggered by an image taking process start request input by the operator.

Figure 28:
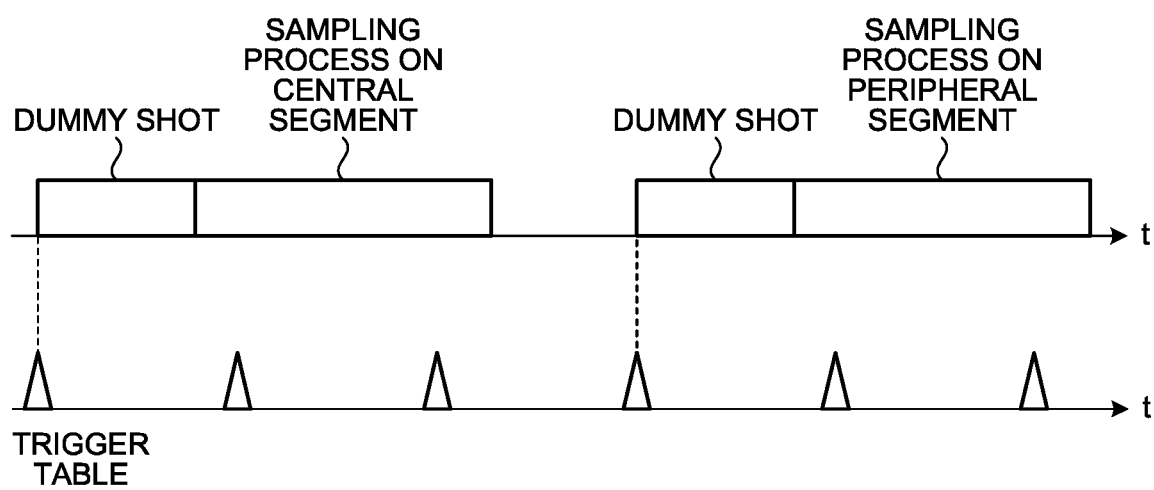
FIG. 28 is a drawing for explaining a process performed by the MRI apparatus according to the fifth embodiment.

FIG. 27 will be explained with reference to FIG. 28. FIG. 28 is a drawing for explaining processes performed by the MRI apparatus 100 according to the fifth embodiment. The explanation using FIGS. 27 and 28 is merely an example, and possible embodiments are not limited to this example.

At step S501, the obtaining function 123a acquires pieces of k space data in the central segment and pieces of k-space data in the peripheral segment by implementing electrocardiographic synchronization.

For example, as illustrated in FIG. 28, the obtaining function 123a performs a sampling process on the central segment and a sampling process on the peripheral segment, at the timing of the detection of the trigger signals (the R-waves). In this situation, because the time period required by a dummy shot inserted prior to each of the sampling processes is constant, the trigger detection timing of the central segment is substantially the same as the trigger detection timing of the peripheral segment.

In this manner, the obtaining function 123a obtains the plurality of pieces of k-space data resulting from the synchronized acquisitions performed on the basis of the pieces of biological signal information, on each of the plurality of segments including the central segment corresponding to the center of the k-space and the peripheral segment different from the central segment.

At step S502, the linking function 123c links the pieces of k-space data in the central segment to the pieces of k-space data in the peripheral segment. For example, the linking function 123c links the plurality of pieces of k-space data contained in the central segment with the plurality of pieces of k-space data contained in the peripheral segment. In this situation, because the trigger detection timing of the central segment is substantially the same as the trigger detection timing of the peripheral segment, it is possible to link the pieces of k-space data corresponding to the temporal phases to each other.

Because the processes at steps S503 through S507 are the same as the processes at steps S205 through S209 illustrated in FIG. 16, the explanations thereof will be omitted.

As explained above, the MRI apparatus 100 according to the fifth embodiment is configured to acquire the pieces of k-space data in the plurality of segments by implementing the electrocardiographic synchronization. Further, the MRI apparatus 100 is configured to generate the plurality of pieces of k-space data corresponding to the full sampling process, by linking together the acquired pieces of k-space data in the plurality of segments. After that, the MRI apparatus 100 is able to reconstruct the MR images in the temporal phases of which the quantity corresponds to the number of images to be obtained, by performing the rearranging process on the plurality of pieces of k-space data corresponding to the full sampling process.

Sixth Embodiment

In the embodiments described above, the example is explained in which the acquisition time period of the central segment is the same as the acquisition time period of peripheral segment. However, possible embodiments are not limited to this example. For instance, the MRI apparatus 100 is able to reduce misalignments of the cardiac phases that may be caused among the plurality of pieces of k-space data structuring the reconstructed images, by arranging the acquisition time period of the peripheral segment to be longer than the acquisition time period of the central segment.

Figure 29:
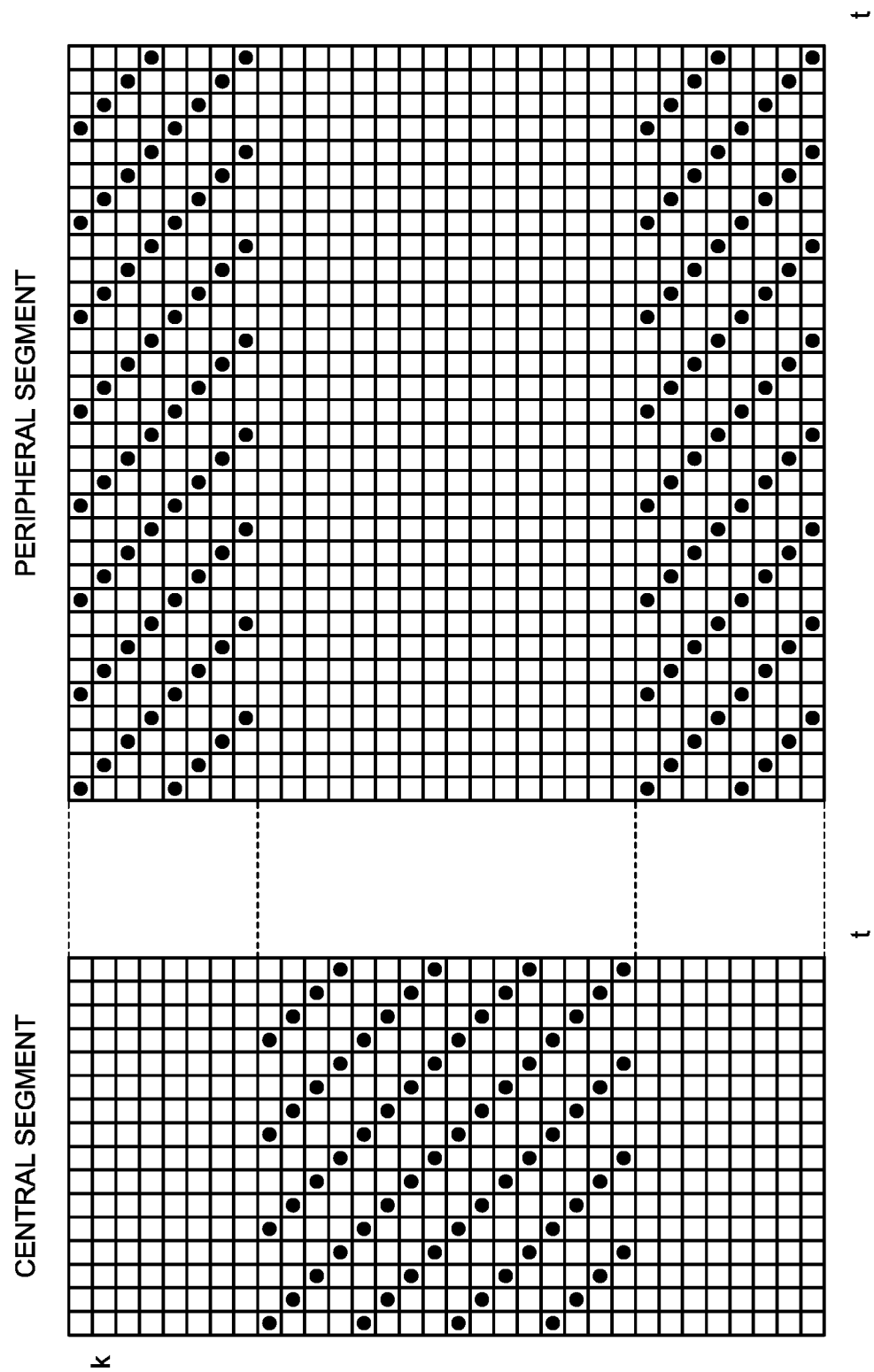
FIG. 29 is a drawing for explaining a process performed by an MRI apparatus according to a sixth embodiment.

FIG. 29 is a drawing for explaining processes performed by the MRI apparatus 100 according to a sixth embodiment. The explanation using FIG. 29 is merely an example, and possible embodiments are not limited to this example.

For example, as illustrated in FIG. 29, the obtaining function 123a acquires the plurality of pieces of k-space data contained in the peripheral segment over an acquisition time period that is longer than the acquisition time period of the central segment. In this situation, for example, when the number of images to be obtained set by the operator is "13", pieces of k-space data corresponding to 16 temporal phases are acquired with respect to the central segment so as to satisfy approximately 120% of the designated number of images to be obtained. In contrast, with respect to the peripheral segment, pieces of k-space data corresponding to 32 temporal phases are acquired so as to satisfy approximately 240% of the designated number of images to be obtained.

In this manner, when the acquisition time period of the peripheral segment is longer than the acquisition time period of the central segment, there are more options to be selected from parts of the peripheral segment to be linked to the central segment. Accordingly, the linking function 123c is able to link parts of the peripheral segment each having cardiac phase information that is even closer to the cardiac phase information of the central segment. As a result, the MRI apparatus 100 is able to reduce the misalignments of the cardiac phases that may be caused among the plurality of pieces of k-space data structuring the reconstructed images.

Other Embodiments

The present disclosure may be carried out in various different modes other than those described in the embodiments above.

The Sampling Order of the Pieces of k-Space Data

For example, in the embodiments above, the example is explained in which the plurality of pieces of k-space data included in the temporal phases are sampled in one direction in terms of the phase-encoding direction; however, possible embodiments are not limited to this example. For instance, the MRI apparatus 100 is also able to sample the plurality of pieces of k-space data included in the temporal phases, in alternating two directions in terms of the phase-encoding direction.

Figure 30:
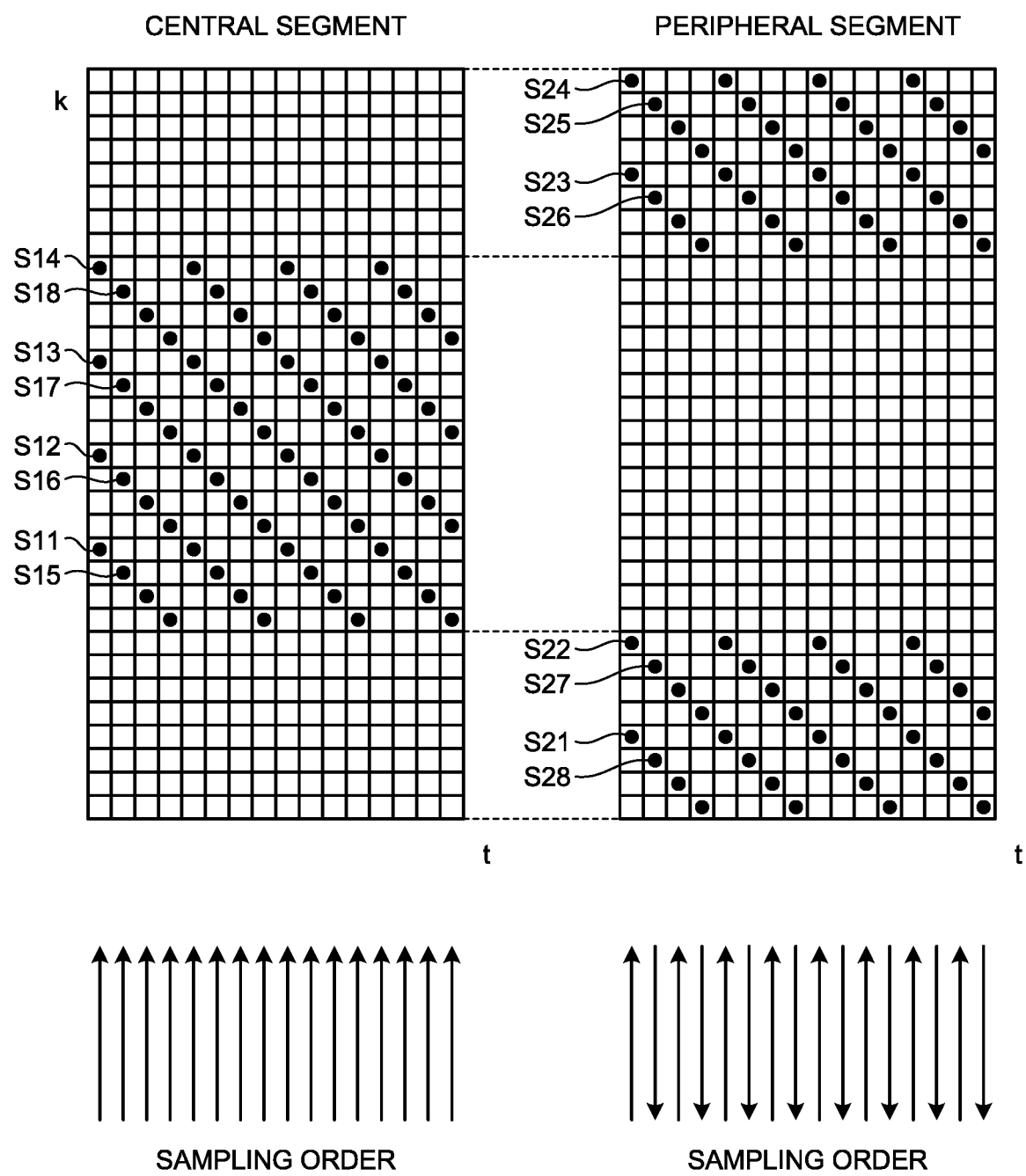
FIG. 30 is a drawing for explaining a sampling order used by an MRI apparatus according to another embodiment.

FIG. 30 is a drawing for explaining a sampling order used by the MRI apparatus 100 according to another embodiment. The top section of FIG. 30 illustrates pieces of k-t space data in the central segment and the peripheral segment. The bottom section of FIG. 30 illustrates a plurality of arrows indicating the sampling order of the plurality of pieces of k-space data included in the temporal phases.

For example, as illustrated in FIG. 30, with respect to the central segment, the obtaining function 123a performs sampling processes in one direction in terms of the phase-encoding direction. More specifically, the obtaining function 123a acquires the pieces of k-space data in the sampling order of S11, S12, S13, S14, S15, S16, S17, and S18.

In contrast, with respect to the peripheral segment, the obtaining function 123a performs sampling processes in two alternating directions in terms of the phase-encoding direction. More specifically, with respect to the first temporal phase, the obtaining function 123a acquires piece of k-space data in the sampling order of S21, S22, S23, and S24. Subsequently, with respect to the second temporal phase, the obtaining function 123a acquires piece of k-space data in the sampling order of S25, S26, S27, and S28.

The pieces of k-space data are acquired in the peripheral segment while alternating the sampling direction for each temporal phase in the manner described above, for the purpose of reducing impacts of eddy currents. For example, by acquiring the piece of k-space data indicated as S25 subsequent to the piece of k-space data indicated as S24, the obtaining function 123a reduces the difference in phase-encoding amounts between the two sequential pieces of k-space data. As a result, the obtaining function 123a is able to inhibit the occurrence of eddy currents and to reduce the impacts of eddy currents.

Although FIG. 30 illustrates the example in which the sampling processes are performed in one direction with respect to the central segment, it is also acceptable to acquire the pieces of k-space data while alternating the sampling direction for each temporal phase. In that situation, however, for the purpose of capturing changes in the motion of the heart in different cardiac phases, it is desirable to configure the obtaining function 123a to perform the sampling processes in one direction, with respect to the pieces of k-space data in the central segment.

Linking Process Performed in Units of Blocks

Further, for example, in the embodiments described above, the example is explained in which the plurality of pieces of k-space data included in the temporal phases are linked to each other in units of the segments (in units of the groups); however, possible embodiments are not limited to this example. For instance, the MRI apparatus 100 is also able to link the pieces of data together in units of blocks used in the k-t SENSE method.

In this situation, the "blocks" are each a group obtained by organizing together pieces of k-space data corresponding to the number of temporal phases defined for the reconstructing process used in the k-t SENSE method. For example, when the undersampling ratio in the k-t SENSE method is "4", each of the blocks contains pieces of k-space data corresponding to 4 temporal phases.

Figure 31:
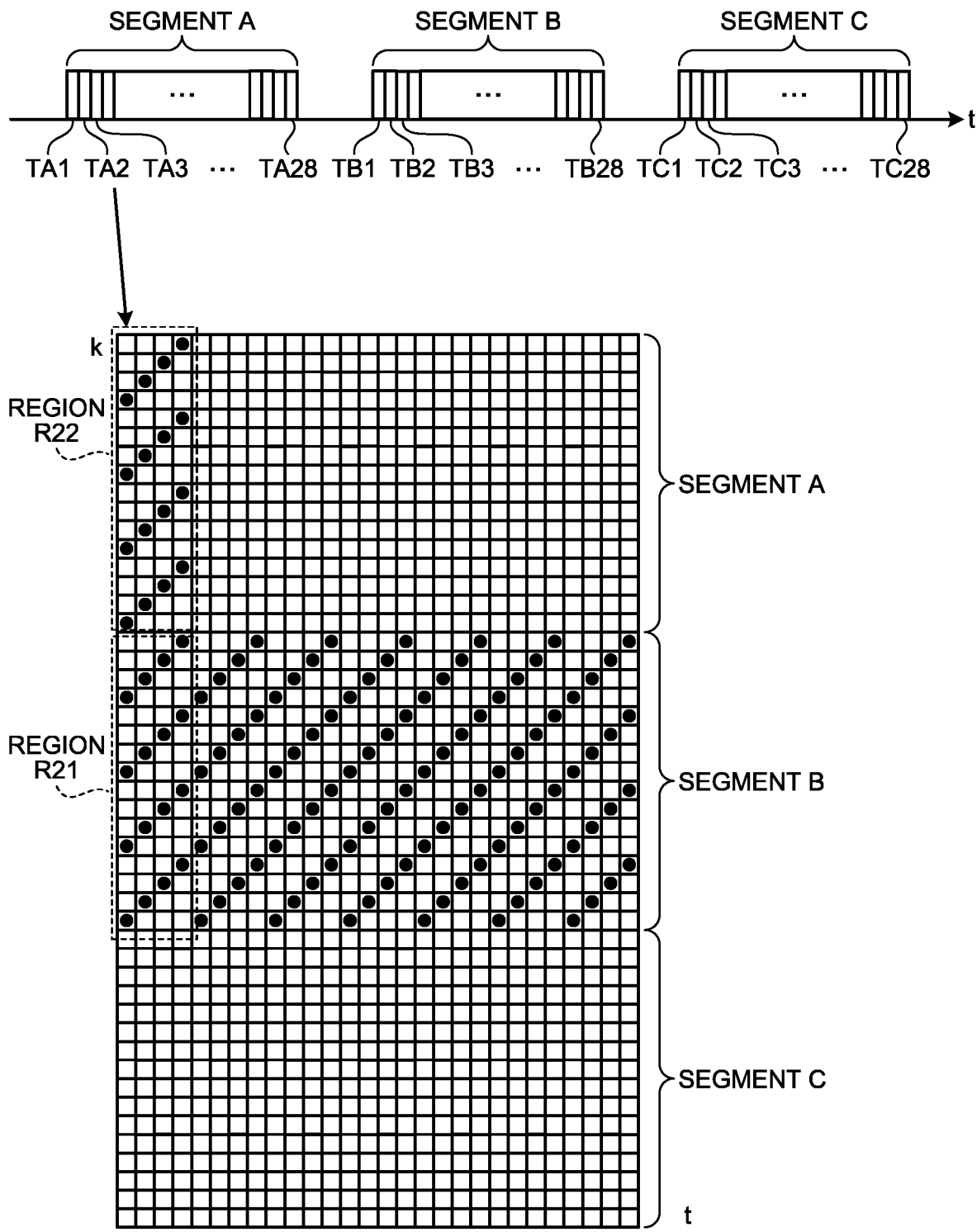
FIG. 31 is a drawing for explaining a process performed by a linking function according to yet another embodiment.

FIG. 31 is a drawing for explaining a process performed by the linking function 123c according to yet another embodiment. The top section of FIG. 31 illustrates a sequence executed by the sequence controlling circuit 110. Further, the bottom section of FIG. 31 illustrates a process in which the pieces of k-space data acquired by using the sequence in the top section are arranged into a k-t space according to sampling patterns set in advance. In this situation, FIG. 31 illustrates the example in which the undersampling ratio in the k-t SENSE method is "4". In other words, in FIG. 31, the plurality of pieces of k-space data contained in a region R21 correspond to one block in the segment B. Further, the plurality of pieces of k-space data contained in a region R22 correspond to one block in the segment A.

First, the calculating function 123b calculates cardiac phase information with respect to each of the blocks contained in the segment B. For example, among the pieces of k-space data in the 16 lines contained in each of the blocks, the calculating function 123b calculates the cardiac phase information of a piece of k-space data that is temporally positioned substantially at the center, as the cardiac phase information of the block. Similarly, with respect to each of the blocks contained in the segment A, the calculating function 123b calculates cardiac phase information.

Further, as illustrated in FIG. 31, to each of the blocks contained in the segment B, the linking function 123c links such a block in the segment A that has cardiac phase information close to the cardiac phase information of the block in the segment B. More specifically, the linking function 123c selects such a block that has the cardiac phase information closest to the cardiac phase information of the block in the region R21, from among the blocks contained in the segment A. After that, the linking function 123c arranges the selected block from the segment A into the region R22. In this manner, the linking function 123c is able to link the pieces of k-space data in the segments in units of the blocks.

Search in the Peripheral Segment in the Compressed Sensing Scheme

Further, when the compressed sensing scheme is used, the sampling patterns of the central segment and the sampling patterns of the peripheral segment do not necessarily have to be the same as each other. In this regard, the MRI apparatus 100 is also capable of searching for k-space data to be linked from within the peripheral segment and linking the k-space data found in the search to the k-space data in the central segment.

For example, the linking function 123c performs the linking process by searching for a plurality of pieces of k-space data to be linked, from among the plurality of pieces of k-space data contained in the peripheral segment, in such a manner that the image quality of the reconstructed images satisfies a certain standard.

Figure 32:
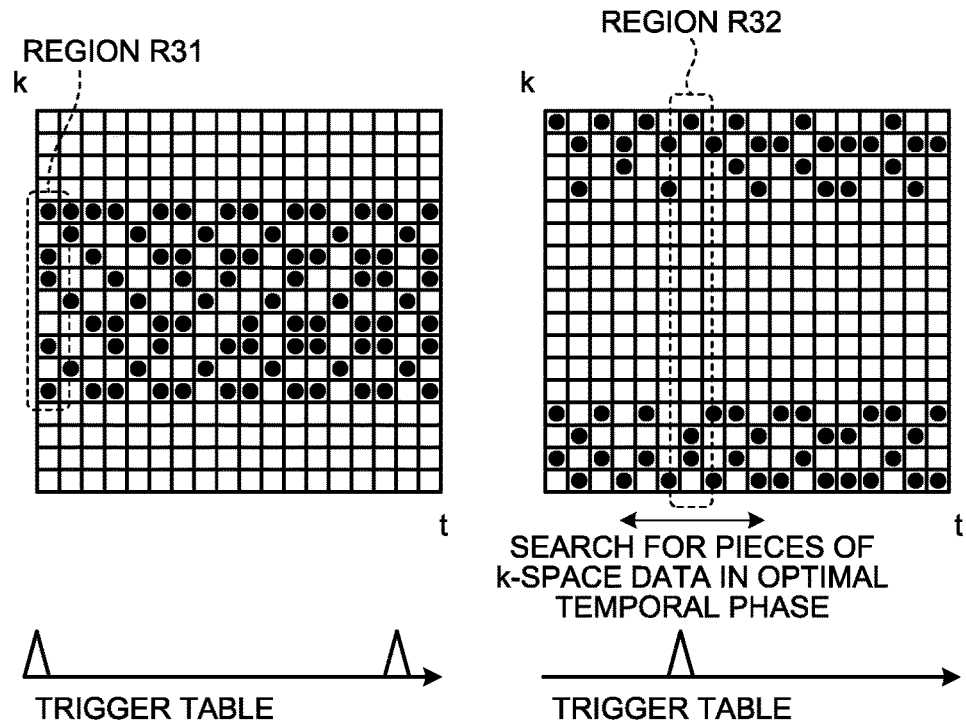
FIG. 32 is a drawing for explaining a process performed by an MRI apparatus according to yet another embodiment.

FIG. 32 is a drawing for explaining a process performed by the MRI apparatus 100 according to yet another embodiment. In FIG. 32, the trigger table corresponds to the time direction of the pieces of k-t space data. In the example in FIG. 32, pieces of k-space data in the central segment (the left section of FIG. 32) and in the peripheral segment (the right section of FIG. 32) are randomly acquired in the time direction.

For example, as illustrated in FIG. 32, to the plurality of pieces of k-space data contained in a region R31 of the central segment, such a plurality of pieces of k-space data contained in the region R32 of the peripheral segment that have cardiac phase information close to the cardiac phase information of the region R31 are linked. Further, when pieces of k-space data in the peripheral segment are linked to all the pieces of k-space data in the central segment, images are reconstructed.

In this situation, the linking function 123c judges whether or not the image quality of the reconstructed images is disturbed, on the basis of whether or not the image quality of the reconstructed images satisfies a certain standard. In one example, the linking function 123c calculates a difference between two reconstructed images that are in sequential temporal phases among the plurality of reconstructed images. Further, when the calculated difference exceeds a certain value (a threshold value) in a heart region, the linking function 123c determines that the image quality is disturbed. The process of judging whether or not the image quality is disturbed is not limited to the example described herein. It is possible to widely use any of publicly-known image analyzing techniques.

Further, when the image quality of the reconstructed images is disturbed, the linking function 123c performs the linking process by searching for a plurality of pieces of k-space data to be linked, from among the plurality of pieces of k-space data contained in the peripheral segment. For example, the linking function 123c searches for the pieces of k-space data in an optimal temporal phase, by moving the region R32 forward and backward.

More specifically, the linking function 123c searches for a next region within the peripheral segment that, after the region R32, has cardiac phase information close to the cardiac phase information of the region R31. Subsequently, the linking function 123c links the plurality of pieces of k-space data contained in the region found in the search, to the plurality of pieces of k-space data contained in the region R31. After that, the reconstructing function 123d generates the reconstructed images by using the pieces of k-space data resulting from the linking process.

Further, the linking function 123c judges again whether or not the image quality of the reconstructed images is disturbed. In this manner, the linking function 123c repeated performs the searching process explained above, until the image quality of the reconstructed images satisfies the certain standard.

After that, when the image quality of the reconstructed images has satisfied the certain standard, the MRI apparatus 100 performs the same processes as those described in any of the above embodiments. For example, the MRI apparatus 100 performs the processes at step S206 and thereafter in FIG. 16, by using the generated reconstructed images.

In this manner, the linking function 123c performs the linking process by searching for the plurality of pieces of k-space data to be linked, from among the plurality of pieces of k-space data contained in the peripheral segment, until the image quality of the reconstructed images satisfies the certain standard. With these arrangements, the MRI apparatus 100 is able to improve the image quality of the reconstructed images.

Application to Purposes Other than the Heart Cine-Imaging Process

Further, in the embodiments above, the example is explained in which the heart cine-imaging process is performed; however, possible embodiments are not limited to this example. For instance, it is also possible to apply the processing functions of the MRI apparatus 100 described above, to situations where a contrast-enhanced image taking process is performed.

For example, when performing a contrast-enhanced image taking process, the MRI apparatus 100 obtains a contrast agent injection start time. After that, the MRI apparatus 100 generates a plurality of reconstructed images by performing a rearranging process on a plurality of pieces of k-space data on the basis of the contrast agent injection start time.

In other words, the MRI apparatus 100 is configured to obtain the plurality of pieces of k-space data acquired from the patient by performing the non-simple undersampling process, the acquisition times of the pieces of k-space data, and time information (the injection start time of the contrast agent) used as a reference for the motion of the image taking target. Further, the MRI apparatus 100 is configured to generate a plurality of pieces of k-space data corresponding to the full sampling process from the plurality of pieces of k-space data, by performing the process including the Fourier transform corresponding to the non-simple undersampling process. After that, the MRI apparatus 100 is configured to generate a pseudo acquisition time of each of the plurality of pieces of k-space data corresponding to the full sampling process, on the basis of the acquisition times. Further, the MRI apparatus 100 is configured to perform the rearranging process on the plurality of pieces of k-space data corresponding to the full sampling process, on the basis of the pseudo acquisition times and the time information. After that, the MRI apparatus 100 is configured to generate the plurality of reconstructed images, by performing the reconstructing process on the plurality of pieces of k-space data resulting from the rearranging process. With these arrangements, the MRI apparatus 100 is able to properly perform the image taking processes on the image taking target having motion.

Figure 33:
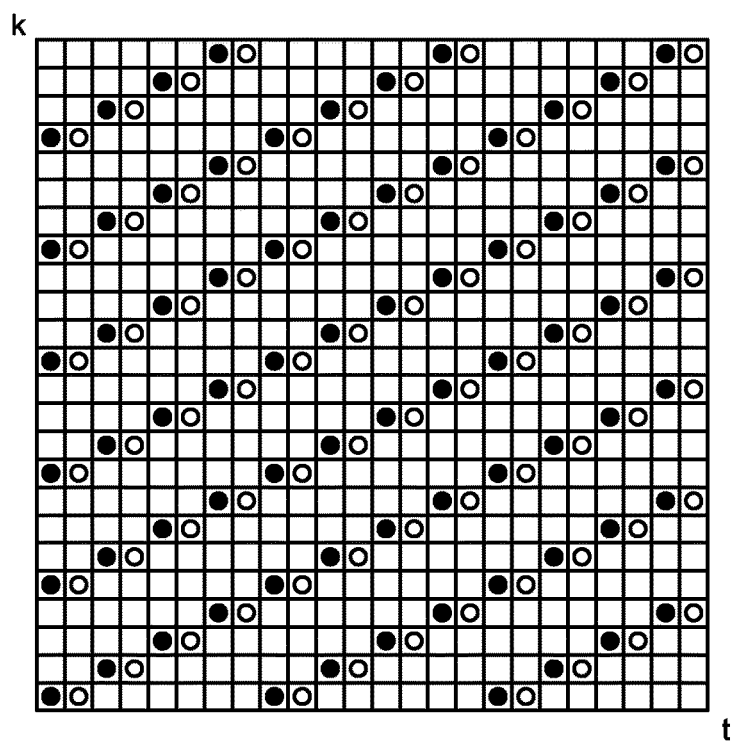
FIG. 33 is a drawing for explaining a process performed by an MRI apparatus according to yet another embodiment.

Further, for example, the MRI apparatus 100 is also applicable to flow acquisition processes performed by implementing a Phase Contrast (PC) method. For example, as illustrated in FIG. 33, the MRI apparatus 100 is configured to render a blood flow in images, by performing the flow acquisition processes by using implementing the PC method. FIG. 33 is a drawing for explaining the process performed by the MRI apparatus 100 according to yet another embodiment.

In the example in FIG. 35, the black dots and the white dots indicate pieces of k-space data. The MRI apparatus 100 is configured to generate groups of reconstructed images in two systems, by separately reconstructing the pieces of k-space data indicated with the black dots and the pieces of k-space data indicated with the white dots. After that, by performing the processes at step S206 and thereafter in FIG. 16, for example, on each of the groups of reconstructed images in the two systems, the MRI apparatus 100 generates groups of reconstructed images in the two systems each having high image quality. Further, by calculating the difference between the groups of reconstructed images in the two systems each having the high image quality, the MRI apparatus 100 is able to generate blood flow images having high image quality. The example illustrated in FIG. 35 is merely an example. The present disclosure is arbitrarily applicable to any publicly-known flow acquisition process.

The above example is widely applicable not only to contrast-enhanced image taking processes and flow acquisition processes, but also to two-dimensional scans, three-dimensional scans, and the like.

Reconstructing Apparatus

Further, for example, the processes described in the above embodiments may be provided as a reconstructing apparatus serving in a network. The reconstructing apparatus is able to provide an information processing service (a cloud service) via the network, for example.

Figure 34:
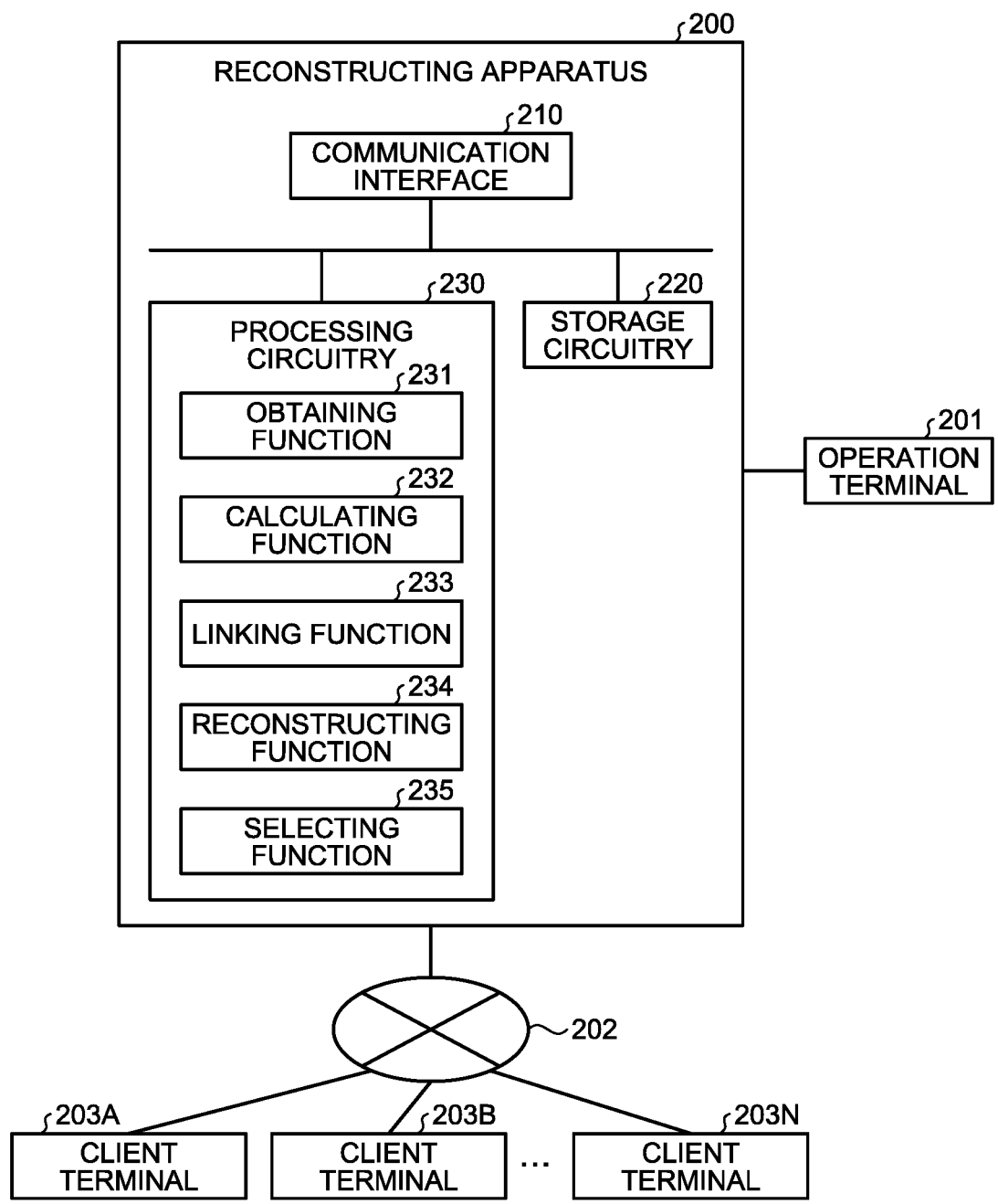
FIG. 34 is a block diagram illustrating an exemplary configuration of a reconstructing apparatus according to yet another embodiment.

FIG. 34 is a block diagram illustrating an exemplary configuration of a reconstructing apparatus according to yet another embodiment. As illustrated in FIG. 34, for example, a reconstructing apparatus 200 is installed in a service center that provides an information processing service. The reconstructing apparatus 200 is connected to an operation terminal 201. Further, the reconstructing apparatus 200 is connected to a plurality of client terminals 203A, 203B, . . . , and 203N, via a network 202. In this situation, the reconstructing apparatus 200 and the operation terminal 201 may be connected to each other via the network 202. Further, when the plurality of client terminals 203A, 203B, . . . , and 203N are collectively referred to without being distinguished from one another, the client terminals will be referred to as "client terminals 203".

The operation terminal 201 is an information processing terminal used by a person (an operator) who operates the reconstructing apparatus 200. For example, the operation terminal 201 includes an input device such as a mouse, a keyboard, a touch panel, and/or the like used for receiving various types of instructions and setting requests from the operator. Further, the operation terminal 201 includes a display device configured to display images and to display a GUI used by the operator to input the various types of setting requests through the input device. By operating the operation terminal 201, the operator is able to transmit the various types of instructions and setting requests to the reconstructing apparatus 200 and to browse information on the inside of the reconstructing apparatus 200. Further, the network 202 is an arbitrary communication network, such as the Internet, a Wide Area Network (WAN), a Local Area Network (LAN), or the like.

The client terminal 203 is an information processing terminal operated by a user who uses the information processing service. In this situation, the user may be, for example, a medical provider such as a medical doctor or a technologist who works at a medical institution. For example, the client terminals 203 each correspond to an information processing apparatus such as a personal computer or a work station, or an operation terminal for a medical image diagnosis apparatus such as a console device included in an MRI apparatus. The client terminals 203 each have a client function capable of using the information processing service provided by the reconstructing apparatus 200. The client function is recorded in advance in each of the client terminals 203 in the form of a computer-executable program.

The reconstructing apparatus 200 includes a communication interface 210, a storage circuitry 220, and a processing circuitry 230. The communication interface 210, the storage circuitry 220, and the processing circuitry 230 are connected together so as to be able to communicate with one another.

The communication interface 210 may be, for example, a network card or a network adaptor. By connecting to the network 202, the communication interface 210 is configured to realize information communication between the reconstructing apparatus 200 and an external apparatus.

The storage circuitry 220 may be, for example, a Not AND (NAND) flash memory or a hard disk drive (HDD) and is configured to store therein various types of programs used for displaying medical image data and GUIs, as well as information used by the programs.

The processing circuitry 230 is an electronic device (a processor) configured to control overall processes performed by the reconstructing apparatus 200. The processing circuitry 230 executes an obtaining function 231, a calculating function 232, a linking function 233, a reconstructing function 234, and a selecting function 235. The processing functions executed by the processing circuitry 230 are recorded in the storage circuitry 220 in the form of computer-executable programs, for example. The processing circuitry 230 is configured to realize the functions corresponding to the programs by reading the programs and executing the read programs. The obtaining function 231, the calculating function 232, the linking function 233, the reconstructing function 234, and the selecting function 235 are able to execute processes that are basically the same as those executed by the obtaining function 123*a*, the calculating function 123*b*, the linking function 123*c*, the reconstructing function 123*d*, and the selecting function 123*e* illustrated in FIG. 1.

For example, by operating any of the client terminals 203, the user inputs an instruction indicating that a plurality of pieces of k-space data be transmitted to (uploaded into) the reconstructing apparatus 200 provided in the service center. When having received the input of the instruction indicating that the plurality of pieces of k-space data be transmitted, the client terminal 203 transmits the plurality of pieces of k-space data to the reconstructing apparatus 200. In this situation, the plurality of pieces of k-space data are a plurality of pieces of k-space data that were acquired by the sequence controlling circuit 110 and divided into units of segments.

Further, the reconstructing apparatus 200 is configured to receive the plurality of pieces of k-space data transmitted thereto from the client terminal 203. After that, in the reconstructing apparatus 200, the obtaining function 231 is configured to obtain the plurality of pieces of k-space data acquired by using predetermined sampling patterns over a plurality of temporal phases. The calculating function 232 is configured to calculate pieces of cardiac phase information of a first group of data including a plurality of pieces of k-space data acquired in a phase-encoding amount used as a reference, among the plurality of pieces of k-space data; and pieces of cardiac phase information of a second group of data including a plurality of pieces of k-space data acquired in a phase-encoding amount different from that of the first group of data. Among the pieces of cardiac phase information of the second group of data, the linking function 233 is configured to bring such pieces of cardiac phase information that are each close to a different one of the pieces of cardiac phase information of the first group of data, into correspondence with the pieces of cardiac phase information of the first group of data and further generates linked data corresponding to a plurality of temporal phases by linking the first group of data and the second group of data to each other on the basis of the pieces of cardiac phase information brought into correspondence with each other. By reconstructing the linked data corresponding to the plurality of temporal phases, the reconstructing function 234 is configured to generate reconstructed images corresponding to a plurality of temporal phases, on the basis of the predetermined sampling patterns. From among the reconstructed images corresponding to the plurality of temporal phases, the selecting function 235 is configured to select reconstructed images each having a piece of cardiac phase information close to a different one of a plurality of pieces of cardiac phase information set in advance. After that, the reconstructing apparatus 200 is configured to transmit the selected reconstructed images to the client terminal 203 (or arranges the selected reconstructed images to be downloaded into the client terminal 203). With these arrangements, the reconstructing apparatus 200 makes it possible to perform the image taking processes having a high spatial resolution and a high temporal resolution on a site having periodic motion.

Further, the constituent elements of the apparatuses and the devices illustrated in the drawings are based on functional concepts. Thus, it is not necessary to physically configure the constituent elements as indicated in the drawings. In other words, the specific modes of distribution and integration of the apparatuses and the devices are not limited to those illustrated in the drawings. It is acceptable to functionally or physically distribute or integrate all or a part of the apparatuses and the devices in any arbitrary units, depending on various loads and the status of use. Further, all or an arbitrary part of the processing functions performed by the apparatuses and the devices may be realized by a Central Processing Unit (CPU) and a program that is analyzed and executed by the CPU or may be realized as hardware using wired logic.

Further, with regard to the processes explained in the embodiments described above, it is acceptable to manually perform all or a part of the processes described as being performed automatically. Conversely, by using a method that is publicly known, it is also acceptable to automatically perform all or a part of the processes described as being performed manually. Further, unless noted otherwise, it is acceptable to arbitrarily modify any of the processing procedures, the controlling procedures, specific names, and various information including various types of data and parameters that are presented in the above text and the drawings.

Further, the image reconstructing method explained in the above embodiments may be realized by causing a computer such as a personal computer or a workstation to execute an image reconstructing program prepared in advance. The image reconstructing program may be distributed via a network such as the Internet. Further, the image reconstructing method may be recorded on a computer-readable recording medium such as a hard disk, a flexible disk (FD), Compact Disk Read-Only Memory (CD-ROM), a Magneto-Optical (MO) disk, or a Digital Versatile Disk (DVD), so as to be executed as being read from the recording medium by a computer.

According to at least one aspect of the embodiments described above, it is possible to perform the image taking processes at a higher speed on a site having periodic motion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image reconstructing method comprising:
    obtaining a plurality of pieces of first k-space data acquired from a patient, first acquisition times corresponding to the pieces of first k-space data, and pieces of biological signal information of the patient in a time series, the pieces of first k-space data being sampled with time-varying undersampling pattern;
    generating a plurality of pieces of second k-space data by inverse transforming an intermediate data which is generated by transforming the plurality of pieces of first k-space data, the pieces of second k-space data is a data that at least part of an undersampled point is filled;
    generating a pseudo second acquisition time of each of the plurality of pieces of second k-space data, on a basis of the first acquisition times;
    performing a rearranging process on the plurality of pieces of second k-space data, on a basis of the second acquisition times and the pieces of biological signal information; and
    generating a plurality of reconstructed images by performing a reconstructing process on the plurality of pieces of second k-space data resulting from the rearranging process.

2. The image reconstructing method according to claim 1, wherein
    the obtaining process obtains the plurality of pieces of first k-space data acquired as being divided into a plurality of segments including a first segment corresponding to a center of a k-space and a second segment different from the first segment, and
    the second k-space data generating process generates the plurality of pieces of second k-space data by:
        generating a plurality of pieces of third k-space data by inverse transforming an intermediate data which is generated by transforming a k-space data included in the first segment, the pieces of third k-space data is a data that at least part of the undersampled point in the first segment is filled;
        rearranging the plurality of pieces of third k-space data in accordance with a cardiac phase of the second segment;
        extracting a plurality of pieces of third k-space data corresponding to a sampling pattern of the plurality of pieces of first k-space data contained in the second segment, from the plurality of pieces of third k-space data resulting from the rearranging process; and
        generating the plurality of pieces of second k-space data by using the extracted plurality of pieces of third k-space data and the plurality of pieces of first k-space data included in the second segment.

3. The image reconstructing method according to claim 1, wherein
    the obtaining process obtains the plurality of pieces of first k-space data acquired as being divided into a plurality of segments including a first segment corresponding to a center of a k-space and a second segment different from the first segment, and
    the second k-space data generating process generates the plurality of pieces of second k-space data by:
        linking, from among the plurality of pieces of first k-space data contained in the second segment, such pieces of first k-space data that each have a cardiac phase close to a cardiac phase of the first segment, to the plurality of pieces of first k-space data contained in the first segment; and
        generating the plurality of pieces of second k-space data by inverse transforming an intermediate data which is generated by transforming the plurality of pieces of first k-space data resulting from the linking process.

4. The image reconstructing method according to claim 3, wherein an acquisition time period of the second segment is longer than an acquisition time period of the first segment.

5. The image reconstructing method according to claim 3, wherein
    the first segment contains a plurality of pieces of k-space data corresponding to a central part of the k-space, and
    the second segment contains a plurality of pieces of k-space data corresponding to a peripheral part of the k-space.

6. The image reconstructing method according to claim 3, wherein the cardiac phases are each information indicating a position in a temporal phase direction within one cardiac cycle.

7. The image reconstructing method according to claim 3, wherein a non-simple undersampled sampling process is to perform acquiring processes by using sampling patterns that are different between frames sequential in a temporal phase direction.

8. The image reconstructing method according to claim 7, wherein the first k-space data is sampled by using a sampling pattern in which data is undersampled with regularity in a phase-encoding direction of the k-space and in which phase-encoding lines to be sampled are mutually different between frames that are sequential in the temporal phase direction.

9. The image reconstructing method according to claim 8, wherein the second k-space data generating process performs the linking process in such a manner that the sampling patterns are arranged with regularity along the temporal phase direction.

10. The image reconstructing method according to claim 7, wherein the first k-space data is sampled by using a sampling pattern in which phase-encoding lines to be sampled are irregular between at least frames that are sequential in the temporal phase direction.

11. The image reconstructing method according to claim 10, wherein the second k-space data generating process performs the linking process in such a manner that the sampling patterns are arranged with irregularity along the temporal phase direction.

12. The image reconstructing method according to claim 1, wherein
the obtaining process obtains the plurality of pieces of first k-space data resulting from synchronized acquisitions performed on a basis of the pieces of biological signal information, on each of a plurality of segments including a first segment corresponding to a center of a k-space and a second segment different from the first segment, and
the second k-space data generating process generates the plurality of pieces of second k-space data by:
linking the plurality of pieces of first k-space data contained in the first segment to the plurality of pieces of first k-space data contained in the second segment; and
generating by inverse transforming an intermediate data which is generated by transforming the plurality of pieces of first k-space data resulting from the linking process.

13. The image reconstructing method according to claim 12, wherein the linking process performs the linking by searching for a plurality of pieces of first k-space data to be linked, from among the plurality of pieces of first k-space data contained in the second segment, in such a manner that image quality of the reconstructed images satisfies a certain standard.

14. A reconstructing apparatus comprising a processing circuitry configured:
to obtain a plurality of pieces of first k-space data acquired from a patient, first acquisition times corresponding to the pieces of first k-space data, and pieces of biological signal information of the patient in a time series, the pieces of first k-space data being sampled with time-varying undersampling pattern;
to generate a plurality of pieces of second k-space data by inverse transforming an intermediate data which is generated by transforming the plurality of pieces of first k-space data, the pieces of second k-space data is a data that at least part of an undersampled point is filled;
to generate a pseudo second acquisition time of each of the plurality of pieces of second k-space data, on a basis of the first acquisition times;
to perform a rearranging process on the plurality of pieces of second k-space data, on a basis of the second acquisition times and the pieces of biological signal information; and
to generate a plurality of reconstructed images by performing a reconstructing process on the plurality of pieces of second k-space data resulting from the rearranging process.

15. The reconstructing apparatus according to claim 14, wherein the reconstructing apparatus is a magnetic resonance imaging apparatus.

16. An image reconstructing method comprising:
obtaining a plurality of pieces of first k-space data acquired from a patient, first acquisition times corresponding to the pieces of first k-space data, and time information used as reference for motion of an image taking target, the pieces of first k-space data being sampled with time-varying undersampling pattern;
generating a plurality of pieces of second k-space data by inverse transforming an intermediate data which is generated by transforming the plurality of pieces of first k-space data, the pieces of second k-space data is a data that at least part of an undersampled point is filled;
generating a pseudo second acquisition time of each of the plurality of pieces of second k-space data, on a basis of the first acquisition times;
performing a rearranging process on the plurality of pieces of second k-space data, on a basis of the second acquisition times and the time information; and
generating a plurality of reconstructed images by performing a reconstructing process on the plurality of pieces of second k-space data resulting from the rearranging process.

17. A reconstructing apparatus comprising a processing circuitry configured:
to obtain a plurality of pieces of first k-space data acquired from a patient, first acquisition times corresponding to the pieces of first k-space data, and time information used as reference for motion of an image taking target, the pieces of first k-space data being sampled with time-varying undersampling pattern;
to generate a plurality of pieces of second k-space data by inverse transforming an intermediate data which is generated by transforming the plurality of pieces of first k-space data, the pieces of second k-space data is a data that at least part of an undersampled point is filled;
to generate a pseudo second acquisition time of each of the plurality of pieces of second k-space data, on a basis of the first acquisition times;
to perform a rearranging process on the plurality of pieces of second k-space data, on a basis of the second acquisition times and the time information; and
to generate a plurality of reconstructed images by performing a reconstructing process on the plurality of pieces of second k-space data resulting from the rearranging process.

* * * * *